US006031173A

United States Patent [19]

Ikeda et al.

[11] Patent Number: 6,031,173

[45] Date of Patent: Feb. 29, 2000

[54] APPARATUS FOR GENERATING MUSICAL TONES USING IMPULSE RESPONSE SIGNALS

[75] Inventors: Sayoko Ikeda; Eiichi Tamura; Takashi Suzuki; Katsushi Ishii, all of Hamamatsu, Japan

[73] Assignee: Kawai Musical Inst. Mfg. Co., Ltd., Hamamatsu, Japan

[21] Appl. No.: 09/182,643

[22] Filed: Oct. 30, 1998

Related U.S. Application Data

[63] Continuation-in-part of application No. 09/163,197, Sep. 30, 1998.

[30] Foreign Application Priority Data

| | | | |
|---|---|---|---|
| Sep. 30, 1997 | [JP] | Japan | 9-284547 |
| Oct. 31, 1997 | [JP] | Japan | 9-316050 |
| Oct. 31, 1997 | [JP] | Japan | 9-316051 |
| Oct. 31, 1997 | [JP] | Japan | 9-316052 |
| Oct. 31, 1997 | [JP] | Japan | 9-316053 |
| Nov. 21, 1997 | [JP] | Japan | 9-321551 |
| Nov. 21, 1997 | [JP] | Japan | 9-321552 |

[51] Int. Cl.[7] ............ G10H 7/00; G11C 7/00

[52] U.S. Cl. ............ 84/605; 84/659

[58] Field of Search ............ 84/601–605, 608, 84/622, 659

[56] References Cited

U.S. PATENT DOCUMENTS

| | | |
|---|---|---|
| 5,286,913 | 2/1994 | Higashi . |
| 5,567,901 | 10/1996 | Gibson et al. . |
| 5,578,780 | 11/1996 | Wachi . |

FOREIGN PATENT DOCUMENTS

| | | |
|---|---|---|
| 3-164796 | 7/1990 | Japan . |
| 2-203394 | 8/1990 | Japan . |
| 2-220098 | 9/1990 | Japan . |
| 3-171197 | 7/1991 | Japan . |
| 3-174590 | 7/1991 | Japan . |
| 4-30196 | 2/1992 | Japan . |
| 4-93999 | 3/1992 | Japan . |
| 4-233595 | 8/1992 | Japan . |
| 8-106291 | 4/1996 | Japan . |
| 8-137469 | 5/1996 | Japan . |
| 8-137470 | 5/1996 | Japan . |
| 8-137471 | 5/1996 | Japan . |
| 8-145965 | 6/1996 | Japan . |

*Primary Examiner*—Jeffrey Donels

[57] ABSTRACT

Some of the repetitively generated impulse response signals are inverted for their polarities, and particular harmonics only are erased/attenuated. The rate of generating the impulse response signals remains constant or changes relative to the pitch, and the tones of the fixed formant type or the tones of the moving formant type are selected. Both ends of the impulse response signals are cut off, whereby the impulse response signals are superposed one upon the other in a decreased amount, and the amount of operation decreases. A plurality of impulse response signals are synthesized to generate impulse response signals different from the impulse response signals of before being synthesized. The rate of generating the impulse response signals changes not in proportion to the pitch, and tones of the moving formant type or generated changing more mildly than a change in the pitch.

26 Claims, 32 Drawing Sheets

50
66
51
IMPULSE SIGNAL STORAGE UNIT
2 CH
PERIOD COE. f OF 1st CHANNEL
PERIOD COE. nf OF 2nd CHANNEL
LEVEL n-1/n
63, SELECTOR
64
DEC. RAM
DEC. FLAG
CH No.
59, SELECTOR
CH No. LOW-ORDER 1 BIT
n-1/n
65
62
1/n
1/n-1
82
REGISTER
CONTROLLER
61
54
IMPULSE ACCUMULATING UNIT
Σ
55
57
TONE ACCUMULATING UNIT
Σ

$$\Delta Lad = Lad \times \frac{\Delta Lt}{Lt} = (Ea - Sa) \times \frac{\Delta Lt}{Lt}$$

$$Lt = \frac{Lad}{r} \qquad \Delta Lt = \frac{Lt\ T}{2}$$

SCHEMATIC DIAGRAM (WHEN VIEWED BASED ON IMPULSE RESPONSE, WHEN VIEWED BASED ON SPECTRUM ENVELOPE)

APPARATUS FOR GENERATING MUSICAL TONES USING IMPULSE RESPONSE SIGNALS

This application is a continuation-in-part of application Ser. No. 09/163,197 filed on Sep. 30, 1998, the entire contents of which are hereby incorporated by reference.

BACKGROUND OF THE INVENTION

1. Field of the Invention

The present invention relates to an apparatus for generating musical tones and, particularly, to an apparatus for generating tone signals using impulse response signals.

2. Description of the Background

In the conventional apparatus for forming musical tones, the impulse response waveform signals have not been controlled. The impulse response waveform signals are simply sampled and stored, and are repetitively read out, the period of repetition varying depending upon a specified pitch. In this case, the period of repetition becomes shorter with an increase in the specified pitch, and the period of repetition becomes longer with a decrease in the specified pitch. The rate of reading out the impulse response waveform signals remains constant and does not change irrespective of whether the pitch is high or low.

According to the conventional apparatus, however, the impulse response waveform signals could be simply read out and applied to musical tones, but the timbre of the musical tone could not be varied. The frequency components (characteristics) of musical tone vary depending upon the filters, and the timbre of musical tone can be changed.

However, the frequency characteristics (spectral envelope) of musical tone vary depending upon a change in the rate of reading the impulse response waveform signals (depending upon the rate of generation of the impulse response waveform signals). As the rate of generating the impulse response wave signals changes, the frequency characteristics expand or contract on a frequency axis, whereby the frequency characteristics vary and the timbre changes. In this case, when the rate of reading the impulse response waveform signals is interlocked to the recurring period of reading, the timbre is not determined independently of the pitch; i.e., the timbre varies depending upon the pitch.

SUMMARY OF THE INVENTION

A first object of the present invention is to determine the timbre independently of the pitch, and a second object of the invention is to form new tone signals by using impulse response waveform signals.

According to the present invention, there are repetitively generated impulse response signals of a predetermined length corresponding to the frequency characteristics of a tone signal that is to be generated. The recurring period of the impulse response signals that are repetitively generated varies depending upon a pitch-determining factor. The rate of generating the impulse response signals is varied depending upon a timbre-determining factor different from the above-mentioned pitch-determining factor, independently of the recurring period.

Therefore, the timbre of a tone signal generated from the impulse response signals varies independently of the pitch; i.e., the timbre freely changes independently of the pitch. Moreover, a desired tone signal is generated by the repetitive generation of the impulse response signals, and a novel tone is formed.

According to the present invention, furthermore, the waveform of the repetitively generated impulse response signals is changed over depending upon the musical factor that is generated. Accordingly, the waveform of the impulse response signal varies depending upon a change in the pitch and/or a change in the timbre.

The rate of generating impulse response signals varies depending upon a change in the pitch, but the formant does not change depending on a change in the pitch. The repeating period of the impulse response signals changes depending upon a pitch-determining factor, and the rate of generating impulse response signals changes differently from a change in the repeating period. Accordingly, the movement of the formant changes depending upon a change in the pitch but differently from a change in the pitch of the generated musical atone, making it possible to change the timbre differently from a change in the pitch.

The repeating period of the impulse response signals changes depending upon a change in the pitch, the correction data changes based on the change in the pitch, and the rate of generating the impulse response signals is corrected by the correction data. Therefore, the change in the movement of the formant of the generated musical tone is not quite independent of the change in the pitch but follows the change in the pitch to some extent. The change in the movement of the formant is different from the change in the pitch of the generated musical tone and, hence, the timbre changes differently from the change in the pitch.

The waveform of the repetitively generated impulse response signals is changed over depending upon the generated musical factors. Therefore, the change in the waveform of the impulse response signals is interlocked to a change in the pitch and is interlocked to a change in the timbre.

A change in the repeating period impulse response signals or in the reading rate of impulse response signals is accompanied by a change in the power, energy or volume of tone signals output based on the impulse response signals. A magnitude of the generated impulse response signals changes depending upon the repeating period or the reading rate of impulse response signals. Therefore, the power, energy or volume of tone signals that are output is maintained constant irrespective of the repeating period or the reading rate of impulse response signals.

Impulse response signals of a predetermined length corresponding to the frequency characteristics of tone signals to be generated, are repetitively generated, and some of the impulse response signals that are repetitively generated are inverted with respect to polarities. Therefore, the frequency characteristics of the tone signals change, specific degree harmonics only are extinguished/attenuated among the frequency characteristics of the musical tones, and there are generated musical tones of remaining harmonic components only or musical tones having relatively large remaining harmonic components.

The impulse response signals are generated at a predetermined rate for a change in the pitch, and musical tones of the fixed formant type and of the moving formant type are selected. The repeating period of impulse response signals changes depending upon a pitch-determining factor, and whether the rate of generating the impulse response signals be changed or not is selected. Accordingly, a tone of the fixed formant type of which the formant of frequency characteristics does not move on a frequency axis and a tone of a moving formant type of which the formant shifts on the frequency axis, are generated from one impulse response signal.

The amount for not generating the ends of the impulse response signals changes based upon the musical factors. The amount by which the ends of the repetitively generated impulse response signals are superposed on upon the other, is detected, and the amount for not generating the ends of the impulse response signals is determined based upon the thus detected amount. Therefore, the signals are not superposed at the ends of the impulse response signals or decreased number of signals are superposed, and the amount of operating and treating the impulse response signals can be decreased.

There are synthesized a plurality of impulse response signals of which the repeating period and the rate of generation are determined, and impulse response signals are generated which are different from the impulse response signals of before being synthesized. Thus, an increased number of impulse response signals are generated from a decreased number of impulse response signals.

PREFERRED EMBODIMENTS OF THE INVENTION

1. Outline of the Embodiment

Figure 7:
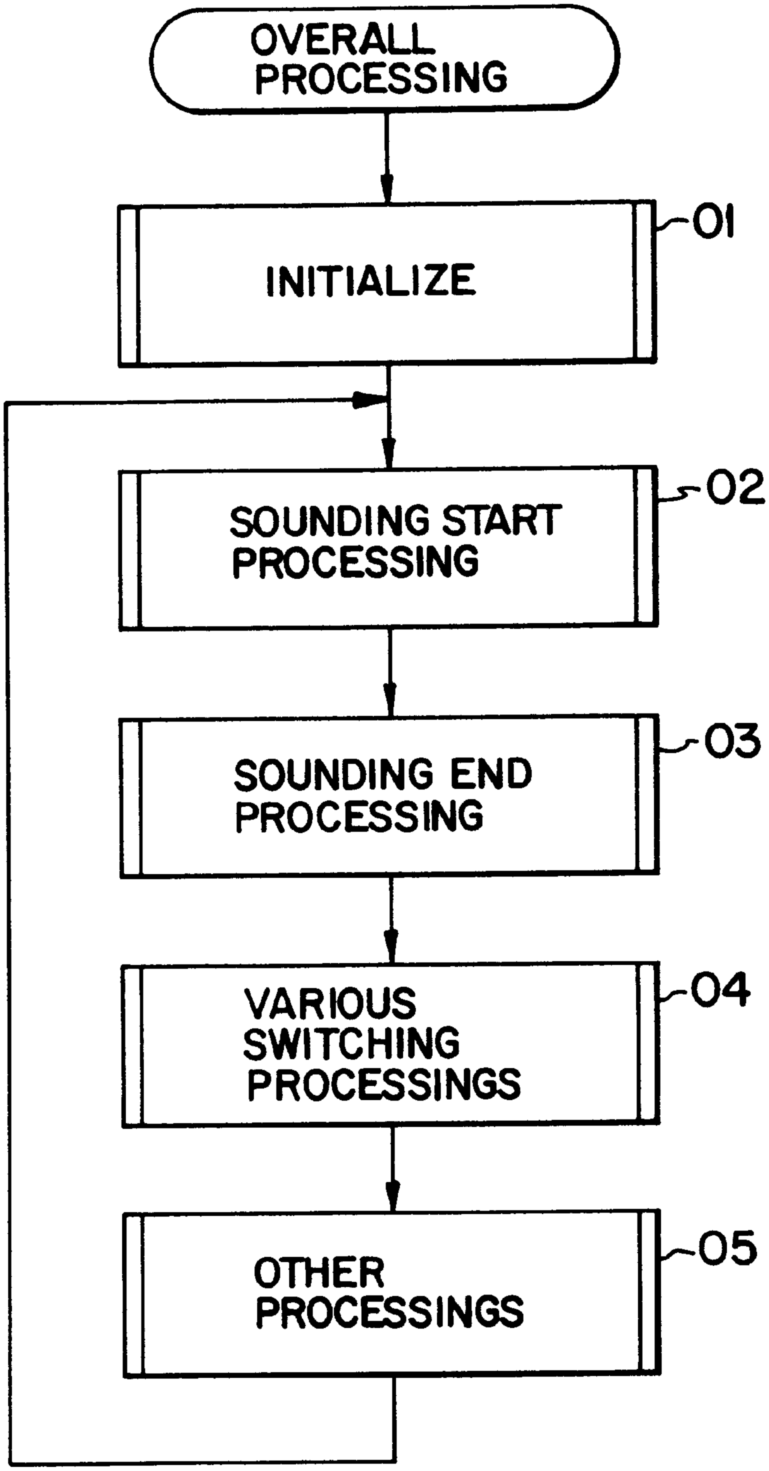
FIG. 7 is a flow chart of the whole processing.

The impulse response signals are stored for each of the musical factors (timbre, pitch, tone pitch range, touch, sounding time and field of play), and are selected by an impulse signal selection unit 52 depending upon the musical factors. The recurring period T of the selected impulse response signals changes depending upon the pitch-determining factor (period coefficient f) (step 16), and the rate of generating the impulse response signals changes depending upon the timbre-determining factor (spectrum coefficient r) independently of the recurring period (steps 24 to 29). The timbre (FIG. 8) of the tone signal formed from the impulse response signals changes independently of the pitch (FIG. 7).

Figure 14:
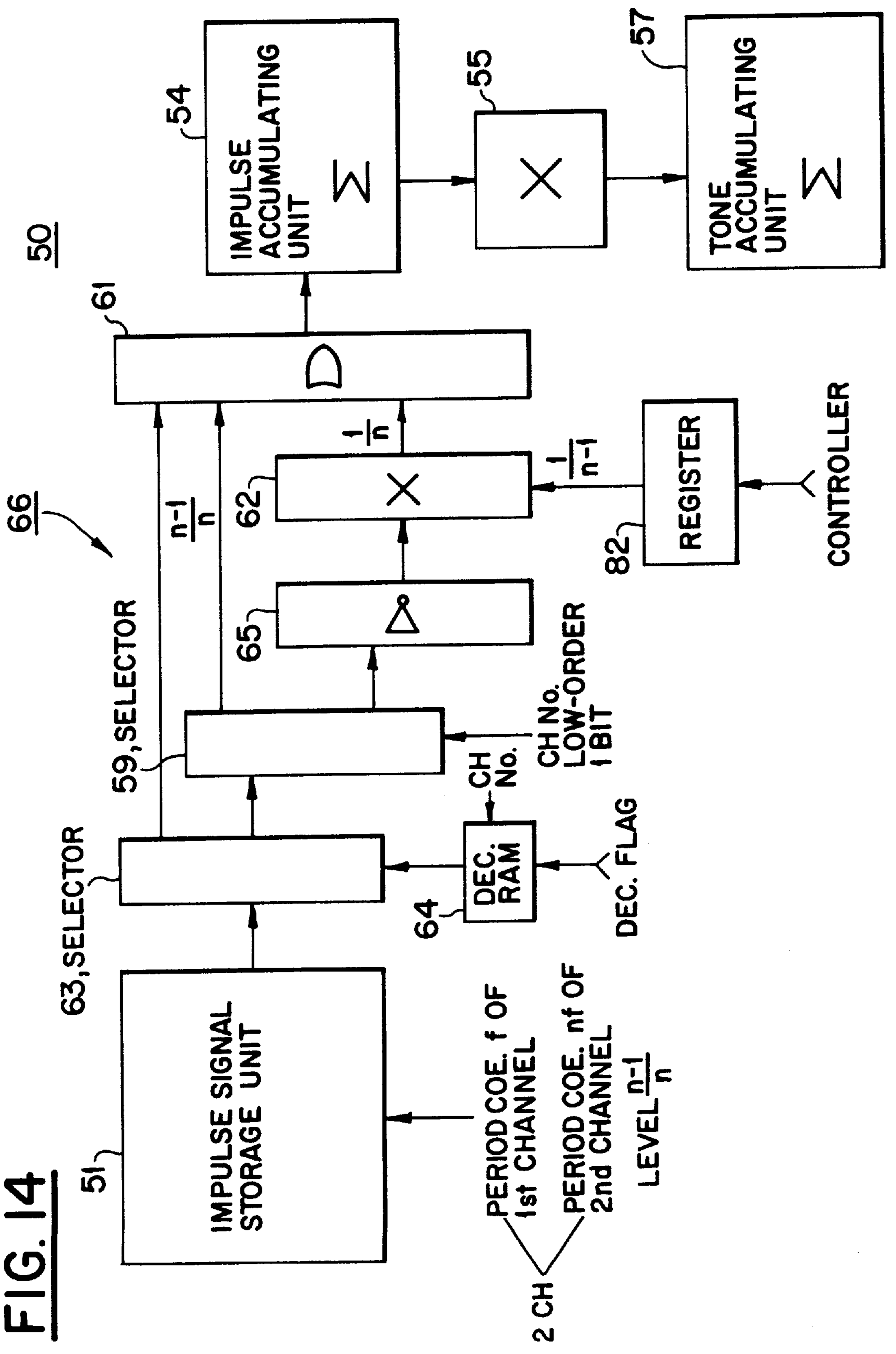
FIG. 14 illustrates an alternatingly inverting circuit 66 (50)
Figure 15:
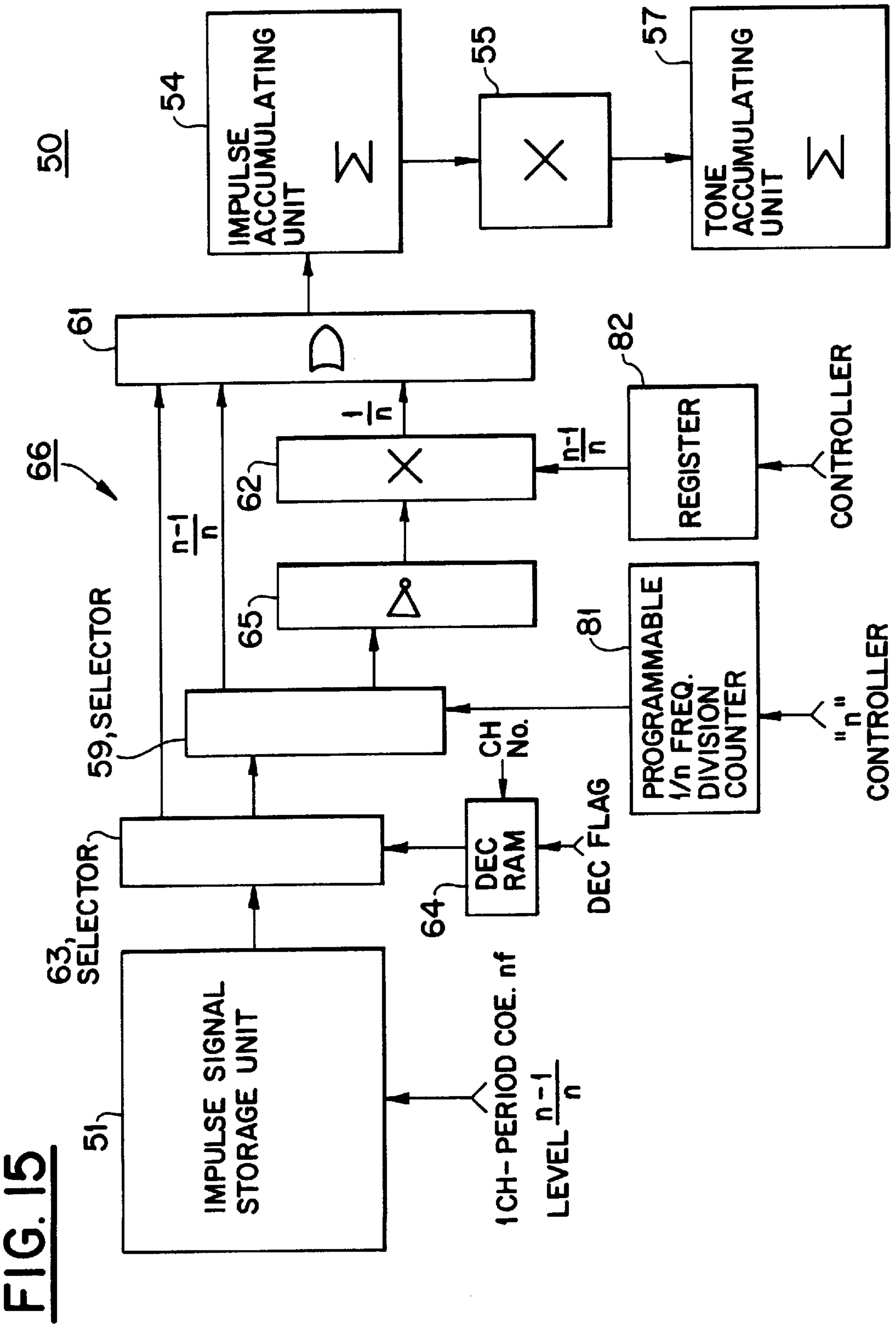
FIG. 15 illustrates another alternatingly inverting circuit 66 (50)

The second impulse response signals ISj(t) of a frequency n times (two times) as great as that of the first impulse response signals ISj(t) exhibit frequency characteristics of integral degree harmonics or even degree harmonics only. When their differences are synthesized together, the signals of a number (n−1) are generated having waveforms of which the polarities are inverted among the signals of a number n. The synthesized waveforms have frequency characteristics of odd degree harmonics only without integral degree harmonics. FIG. 14 illustrates a circuit for synthesizing the differences of the above two impulse response signals ISj(t) and FIG. 15 illustrates a circuit for inverting the polarity of some of the above signals.

Figure 19:
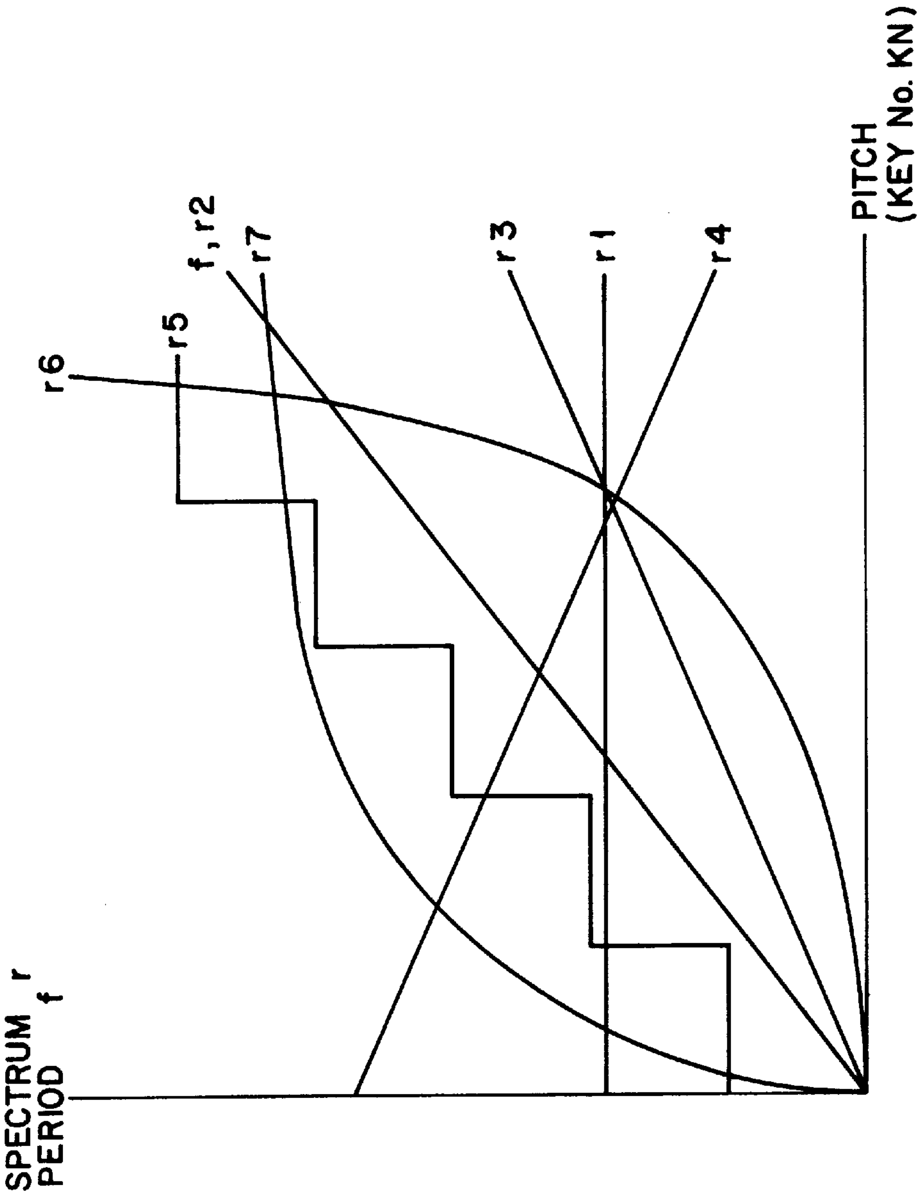
FIG. 19 illustrates a group of spectrum period tables 43 in a program/data storage unit 40.
Figure 21:
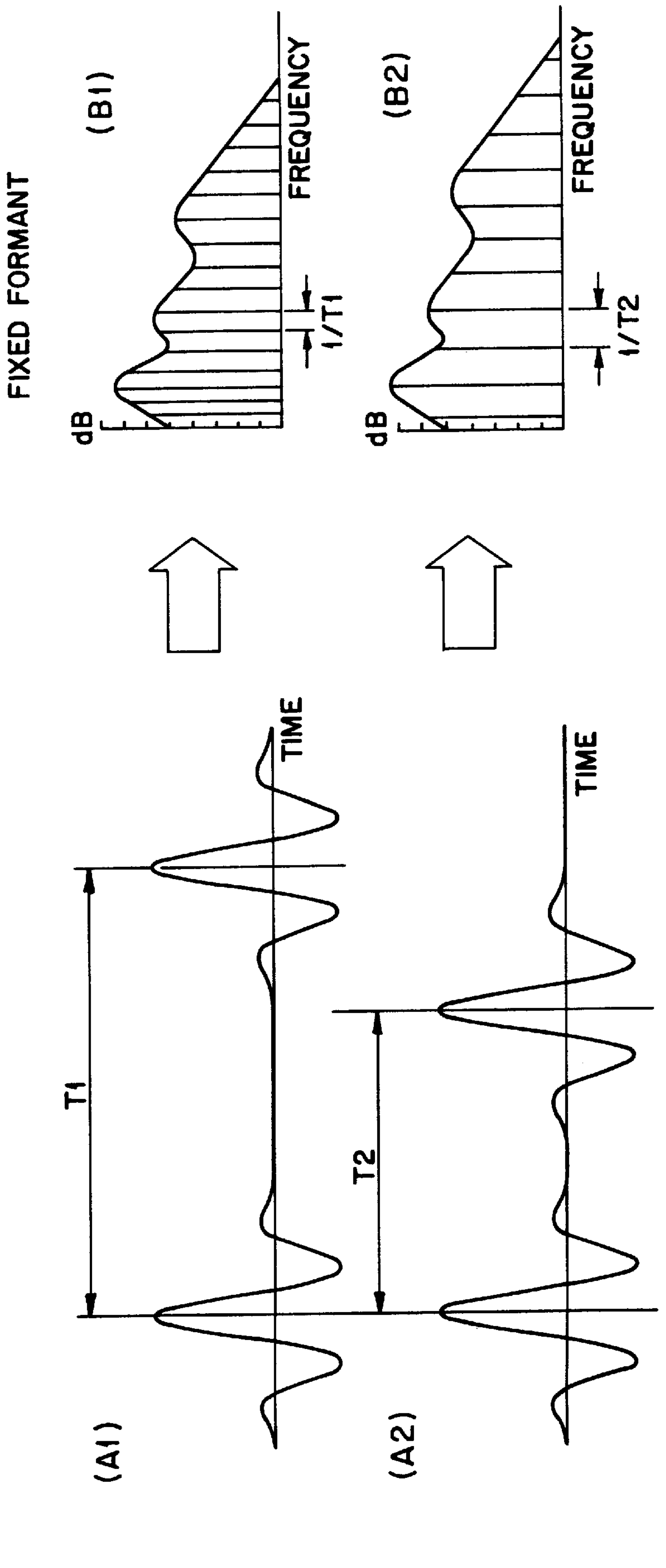
FIG. 21 illustrates a change in the impulse response signal ISj(t) of a fixed formant and a change in the frequency characteristics.
Figure 22:
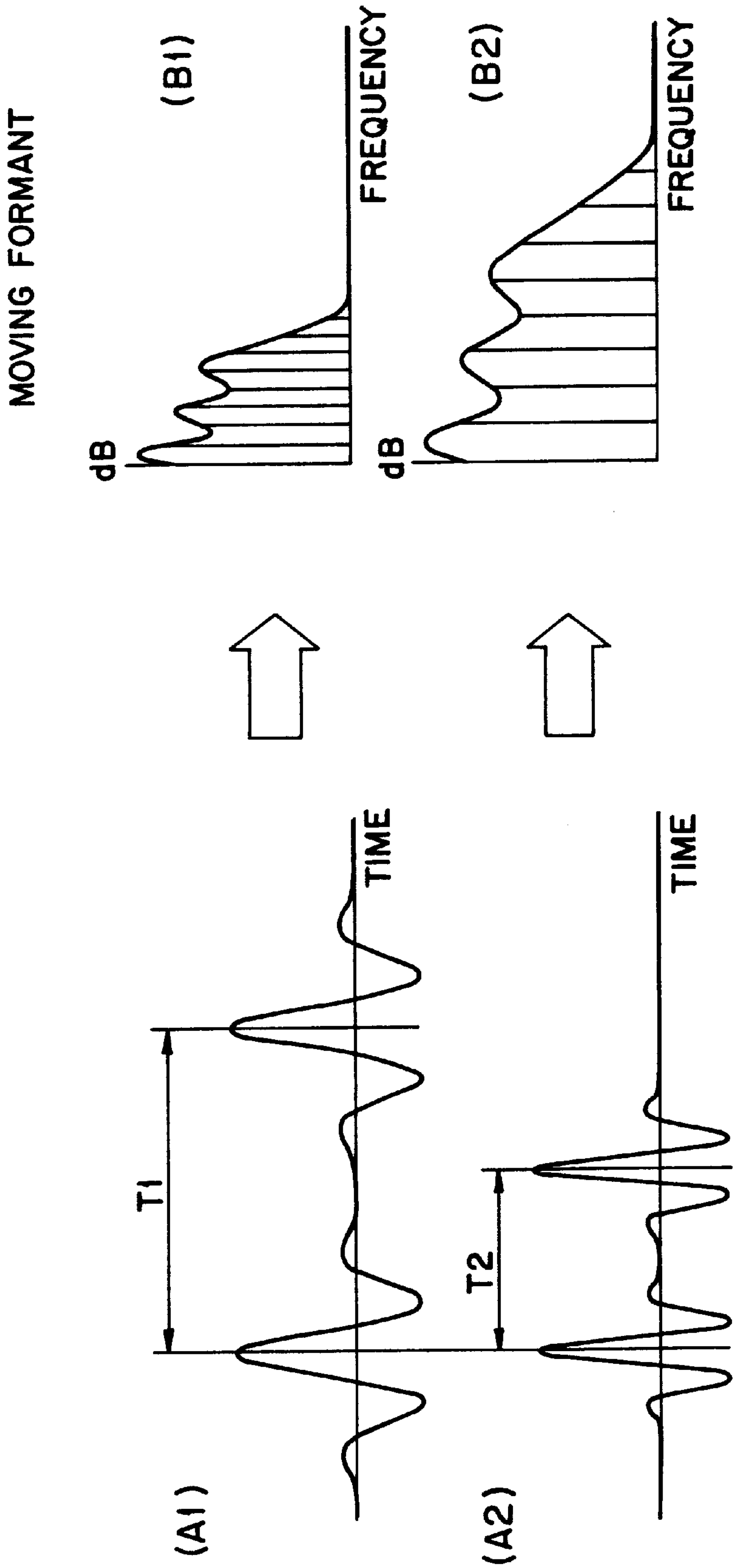
FIG. 22 illustrates a change in the impulse response signal ISj(t) of a moving formant and a change in the frequency characteristics.

A period coefficient f (repeating period T) of FIG. 19 is selected depending upon the pitch, a spectrum coefficient r (generating rate S) of characteristics different from the period coefficient f or of predetermined characteristics is selected (FIG. 19), and an impulse response signal is generated. When the spectrum coefficient r (generating rate S) changes in addition to the period coefficient f (repeating period T) of the impulse response signals ISj(t) depending upon the specified pitch, the formant changes (FIG. 22). However, the formant does not change (FIG. 21) when the spectrum coefficient r does not change.

Figure 25:
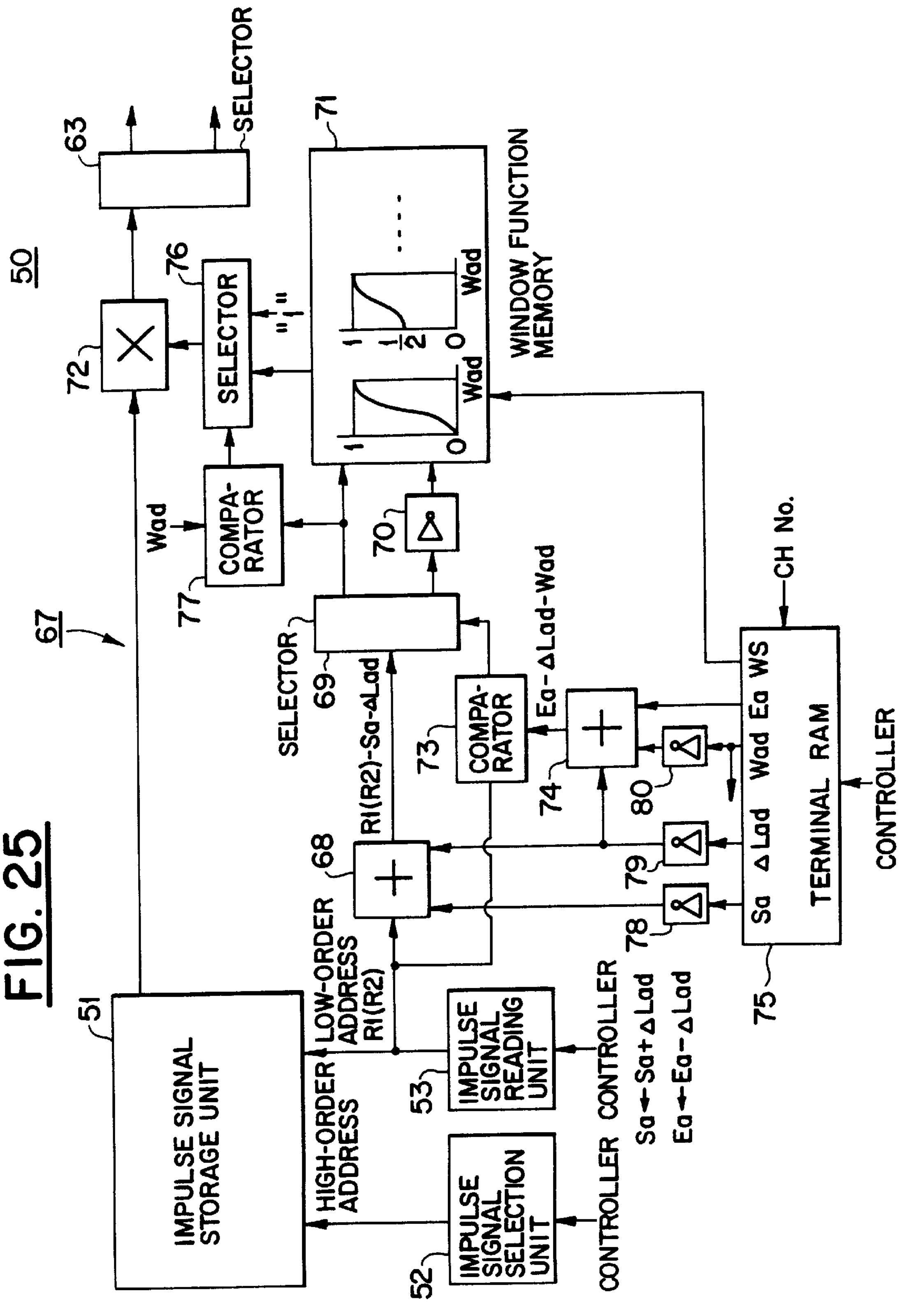
FIG. 25 illustrates an end cut-off circuit 67 (50)

The repeating period T of the impulse response signals ISj(t) changes depending upon the pitch, and the length Lt of the impulse response signals ISj(t) changes depending upon the timbre. The superposing amount of the ends of the neighboring impulse response signals ISj(t) is determined depending upon the values T and Lt. The superposing amount serves as end cut-off data ΔLad, and the address component ΔLad is not read out but is cut off at both ends of the impulse response signals ISj(t) in a reading unit 53 (FIG. 25). Therefore, the ends of the impulse response signals ISj(t) are not superposed one upon the other. Furthermore, the cut-off ends are weighed and synthesized with a window function value WF from a window function memory 71. Thus, the ends that are cut off become smooth.

The impulse response signals ISj(t) of the channel are multiplied by a weighing data WT through a multiplier 89 for each of the channels, and are accumulated and synthesized by a number of s through an adder 84 and a cumulative memory 85, and are output, as a musical tone, from an output memory 86. There are thus synthesized impulse response signals ISj(t) by averaging the frequency characteristics of the impulse response signals ISj(t) of before being synthesized.

A period coefficient f (repeating period T) of FIG. 19 is selected depending upon the pitch, a spectrum coefficient r (generation rate S) of characteristics different from the period coefficient f is selected (FIG. 19), and an impulse response signal is generated. The thus selected spectrum coefficient r is operated and synthesized with a first spectrum correction data Δra (FIG. 30) which varies depending upon the pitch or with a second spectrum correction data Δrb which varies depending upon the musical factors. When the period coefficient f (repeating period T) of the impulse response signals ISj(t) as well as the spectrum coefficient r (generating rate S) change depending upon the specified pitch, the formant changes (FIG. 22). However, the formant does not change when the spectrum coefficient r does not change (FIG. 21).

2. Principle of the Invention

Figure 12:
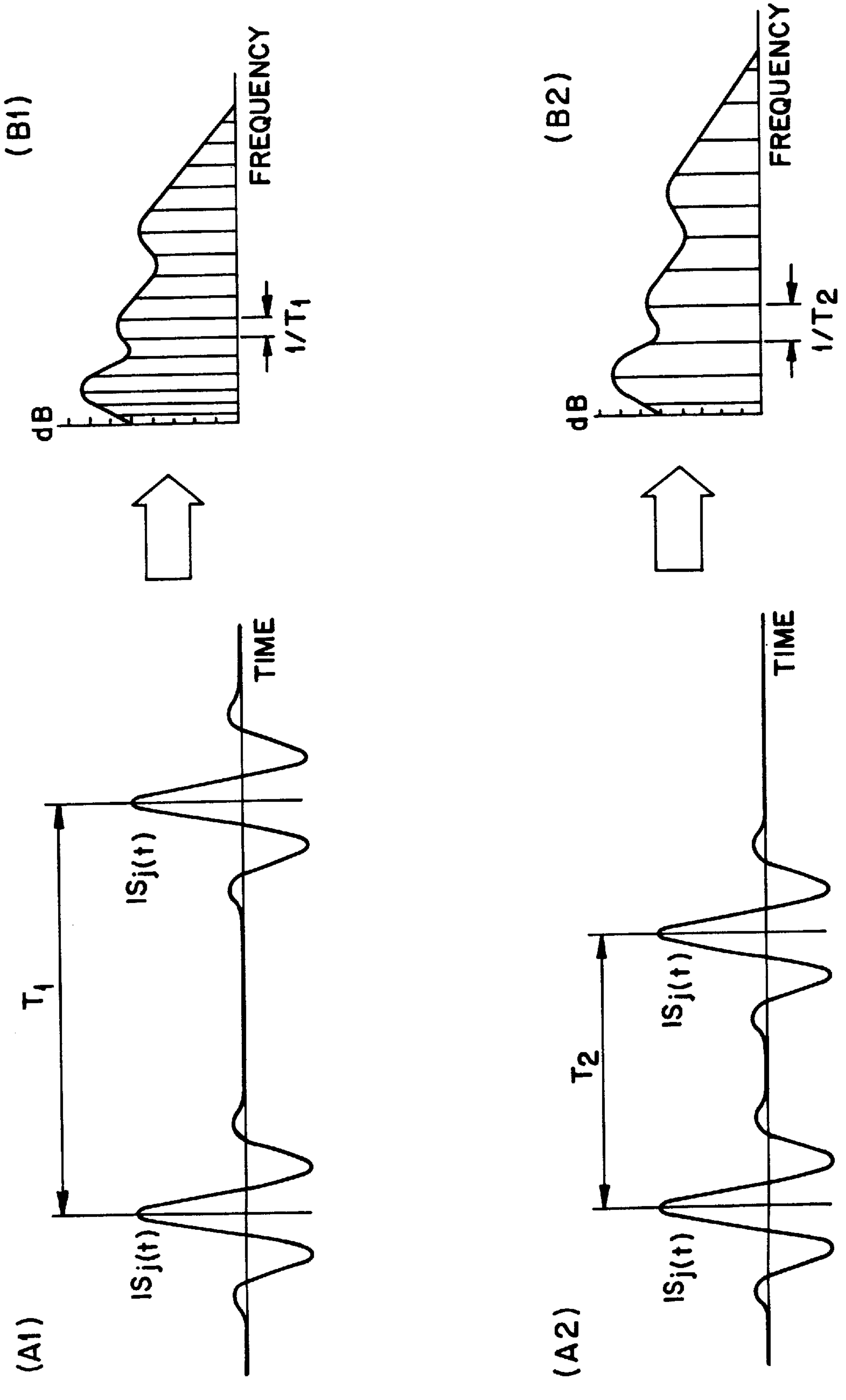
FIG. 12 illustrates the principle of the present invention.
Figure 13:
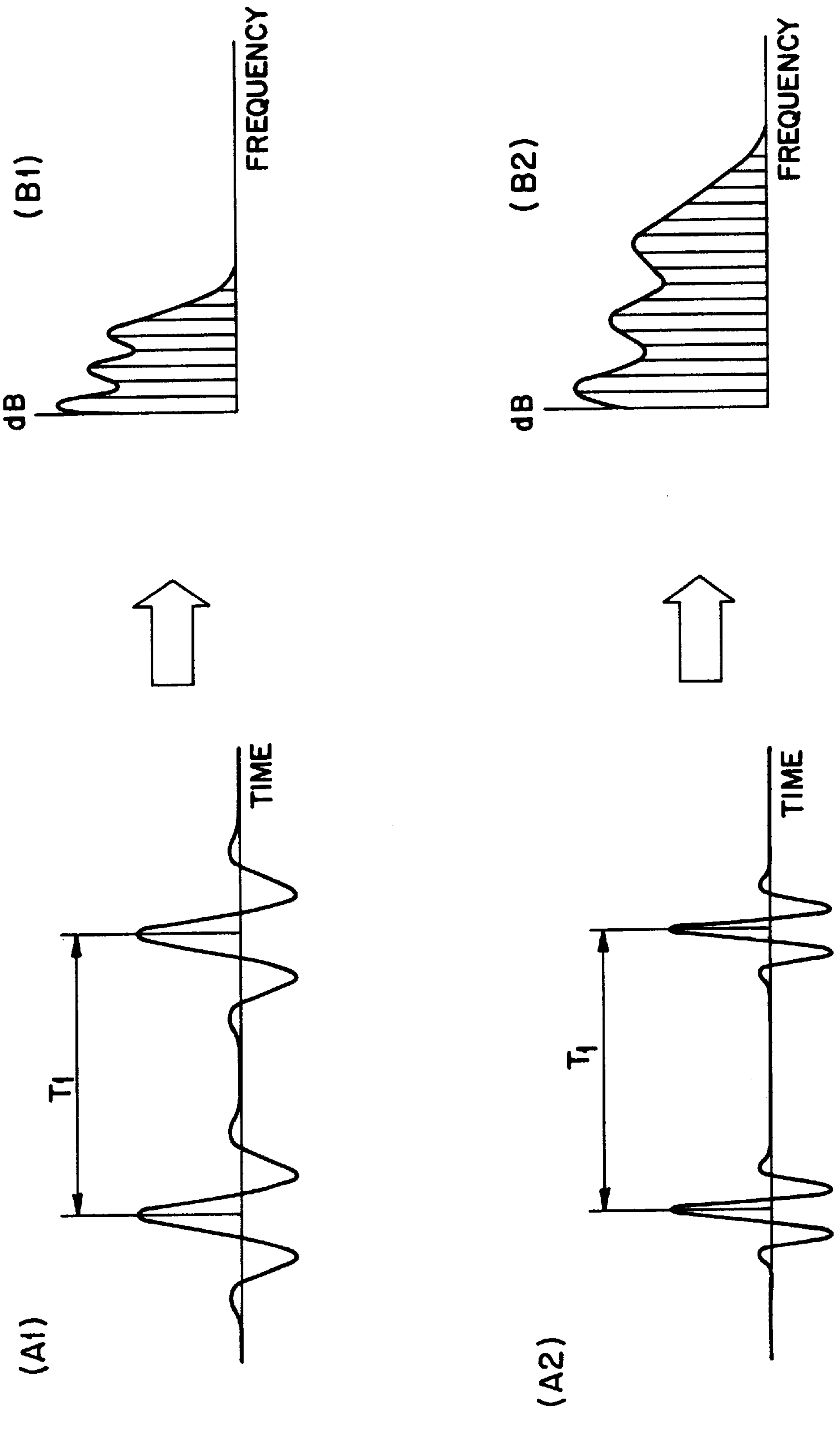
FIG. 13 illustrates the principle of the present invention.

FIGS. 12 and 13 illustrate the principle of the present invention. FIG. 12 illustrates frequency characteristics (spectrum envelope, frequency spectral component characteristics, formant characteristics) (the same holds hereinafter) a tone synthesized and formed by the output of the impulse response signals ISj(t) of when the recurring period of the impulse response signals ISj(t) is T1 or T2. The recurring period T determines the pitch of the tone that is formed. Therefore, the recurring period T is determined by the pitch data and is fetched as a period coefficient f. In the impulse response signal ISj(t), the period coefficient f is a pitch data.

As the recurring period T of the impulse response signals ISj(t) becomes short and the pitch becomes high, the frequency characteristics do not change so much or do not change at all as shown in FIGS. 12(B1) and 12(B2), whereby the density of the frequency components decreases but the width of formant does not change. As the recurring period T changes, therefore, the pitch changes but the timbre (frequency components, formant characteristics) does not change.

Figure 1:
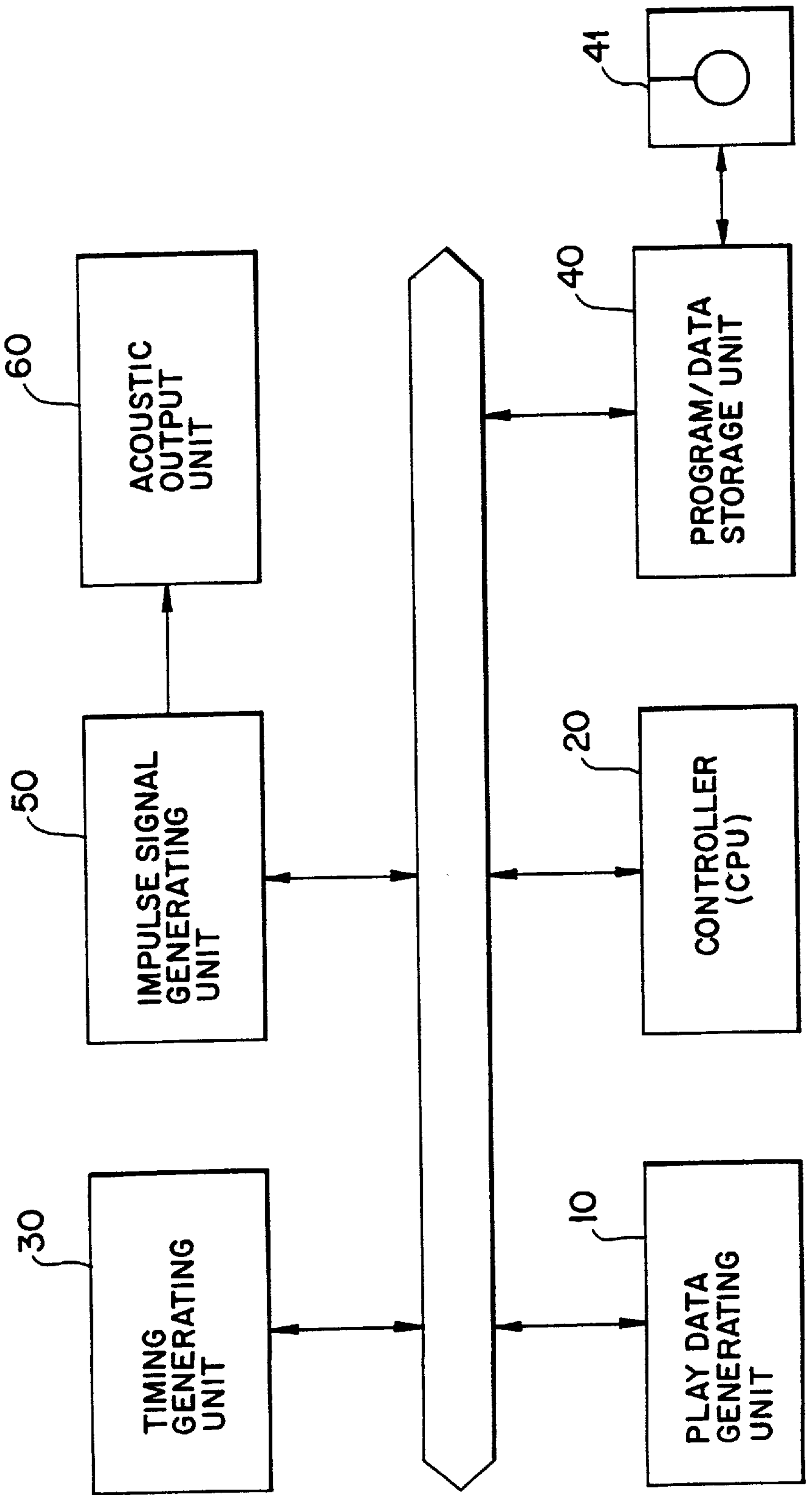
FIG. 1 illustrates the whole circuit of an apparatus for generating musical tones.

The impulse response signals ISj(t) are stored for each of the musical factors in an impulse signal storage unit 51 (FIG. 2) of an impulse signal-generating unit 50 (FIG. 1). The impulse response signal ISj(t) that is stored is one of the two impulse response signals ISj(t) of FIGS. 13(A1) or 13(A2), which is illustrating a state where the impulse response signals ISj(t) are being repetitively read out.

FIG. 13 illustrates the frequency characteristics (spectrum envelope, frequency spectral component characteristics and formant characteristics) of a tone synthesized and formed by the output of the impulse response signals ISj(t) when the recurring period of the impulse response signals ISj(t) is the same but the rate of reading the impulse response signals ISj(t) is different. The rate of reading the impulse response signals ISj(t) determines the timbre (frequency components, formant characteristics) of the tone that is formed. Therefore, the rate of reading is determined by the musical factor data which has no relation to the pitch, e.g., determined by the timbre data, and is fetched as a spectrum coefficient r. In the impulse response signal ISj(t), the spectrum coefficient r is a timbre data.

As the rate of reading the impulse response signals ISj(t) increases and the length of the impulse response signals ISj(t) is shortened, the density of the frequency components does not so much change or does not change at all as shown in FIGS. 13(B1) and 13(B2), but the frequency characteristics (frequency spectrum component characteristics, formant characteristics) change and the width of the frequency spectrum (formant) increases. Therefore, when the rate of reading the signals changes, the timbre (frequency components, formant characteristics) changes but the pitch does not change.

Operations such as linear prediction and spectrum are effected for a predetermined length of the tone signal that is to be formed, and the impulse response signals ISj(t) are formed and are stored. According to the spectrum, for example, the tone signal of a predetermined length is Fourier-transformed at a high speed through a Fourier transform unit, and is converted into a frequency power spectrum.

The power spectrum that is converted is subjected to the logarithmic conversion through a logarithmic converter and is further subjected to the fast inverse Fourier transform through an inverse Fourier transform unit so as to be converted into a spectrum of a frequency. A causal window from a multiplier and from a window function generator is applied to the spectrum which is then converted into a complex spectrum. The complex cep strum is subjected again to the fast Fourier transform through the Fourier transform unit and is returned back to a frequency band from which a spectral envelope is found.

Examples of the spectral envelope are shown in FIGS. 12(B1), 12(B2) and 13(B1), 13(B2). The spectral envelope is subjected to the exponential conversion through an exponential converter, and is subjected to the fast inverse Fourier transform through the inverse Fourier converter so as to be returned back to the frequency. Accordingly, there are formed sampling data of impulse response signals of a minimum phase, which are then stored as the impulse response signals ISj(t) in the impulse signal storage unit 51.

A change in the repeating period of the impulse response signals ISj(t) is accompanied by a change in the power, energy or volume of a tone signal that is output based upon the impulse response signals ISj(t). The magnitude of the generated impulse response signals ISj(t) varies depending upon the repeating period of the impulse response signals ISj(t). Therefore, the power, energy or volume of the tone signal that is output is maintained constant irrespective of the repeating period of the impulse response signals ISj(t).

3. Overall Circuitry

FIG. 1 illustrates an overall circuitry of a tone-generating apparatus. A play data-generating unit 10 generates play data (tone-generating data). The play data are for generating a tone. The play data-generating unit 10 may be a sound instruction device played by manual operation, an automatic play device, a variety of switches, or an interface.

The play data (tone-generating data) are musical factor data inclusive of pitch (tone pitch range) data (tone-determining factor), sounding time data, field-of-play data, number-of-sounds data or degree-of-resonance data. The sounding time data represent the passage of time from the start of sounding a tone. The field-of-play data represent part of play, part of tone, part of musical instrument, etc., and are corresponded to, for example, melody, accompaniment, code, base and rhythm, or are corresponded to an upper keyboard, a lower keyboard or a foot keyboard.

The pitch data are fetched as key number data. The key number data include octave data (tone pitch range data) and tone name data. The field-of-play data are fetched as part number. The areas of play are distinguished depending upon the part number which is set depending upon the area of play of a tone that is sounded.

The sounding time data are fetched as tone time data, and are based upon time count data from a key-on event or substituted by envelope phase. The sounding time data have been closely disclosed in the specification and drawings of Japanese Patent Application No. 219324/1994 as data related to the passage of time from the start of sounding.

The number-of-sounds data represent the number of tones that are simultaneously sounded. For example, on/off data of an assignment memory are based on the number of tone "1", which is found from flow charts of FIGS. 9 and 15 of Japanese Patent Application No. 242878/1994, FIGS. 8 and 18 of Japanese Patent Application No. 276855/1994, FIGS. 9 and 20 of Japanese Patent Application No. 276857/1994, and FIGS. 9 and 21 of Japanese Patent Application No. 276858/1994.

The degree-of-resonance data represent the degree of resonance of a tone that is being sounded with other tones. When a frequency of pitch of one tone and a frequency of pitch of another tone establish small ratios of integers such as 1:2, 2:3, 3:4, 4:5, and 5:6, then, the value of the degree-of-resonance data becomes great. When the ratios of integers are as large as 9:8, 15:8, 15:16, 45:32 and 64:45, then, the value of the degree-of-resonance data becomes small. The degree-of-resonance data can be read out from a resonance correlation table 53 or a resonance ratio table 54 shown in FIG. 7 of Japanese Patent Application No. 314818/1989.

The sound instruction device will be a keyboard instrument, a stringed instrument, a wind instrument, a percussion instrument and/or a keyboard of a computer. An automatic playing device automatically reproduces play data that are stored. The interface is a MIDI (musical instruments digital interface) or the like, and receives play data from, or sends play data to, the device that is connected.

The play data-generating unit 10 is equipped with various switches inclusive of timbre tablet, effect switch, rhythm switch, pedal, wheel, lever, dial, handle and touch switch, which are for musical instruments. Tone control data are generated by these switches. The tone control data are musical factor data and include timbre data (timbre-determining factor), touch data (speed/strength of sounding instruction operation), effect data, rhythm data, sound image (stereo) data, quantize data, modulation data, tempo data, sound volume data and/or envelope data.

These musical factor data, too, are combined with the play data (tone data) and are input through a variety of switches, and are further combined with the automatic play data or are combined with the play data transmitted and received through the interface. The touch switch is provided for each of the sound instruction devices, and generates initial touch data that represent the quickness and strength of touch as well as after touch data.

The timbre data are corresponded to the kinds of musical instruments (sounding media/sounding means) such as a keyed instrument (piano, etc.), a wind instrument (flute, etc.), a stringed instrument (violin, etc.) and a percussion (drum, etc.), and are fetched as tone number data. The envelope data include an envelope level, an envelope speed, an envelope time and an envelope phase.

Such musical factor data are sent to a controller 20 where a variety of signals that will be described later, data and parameters are changed over to determine the content of the tone. The play data (tone-generating data) and tone control data are processed by the controller 20, a variety of data are sent to an impulse signal-generating unit 50, and an impulse response signal ISj(t) is generated. The controller 20 includes CPU, ROM and RAM.

A program/data storage unit 40 (internal storage medium/means) comprises a storage unit such as ROM, a writable RAM, a flash memory or an EEPROM, and in which can be written and stored (installed/transferred) a program of a computer stored in a data storage unit 41 (external storage medium/means) such as an optical disk or a magnetic disk. In the program/data storage unit 40 are further stored (installed/transferred) programs transmitted from an external electronic musical instrument or a computer through a MIDI device or the transmitter/receiver. The program storage medium includes a communication medium.

The installation (transfer/copy) is automatically executed when the data storage unit 41 is set into the tone-forming apparatus or when the power source of the tone-forming apparatus is turned on, or is executed by the operation by an operator. The above-mentioned program corresponds to a flow chart that will be described later, with which the controller 20 executes a variety of processings.

The apparatus may store, in advance, another operating system, system program (OS) and other programs, and the above-mentioned program may be executed together with these OS and other programs. When installed in the apparatus (computer body) and is executed, the above-mentioned program executes the processings and functions described in the claims by itself or together with other programs.

Moreover, part or whole of the program may be stored in, and executed by, one or more apparatuses other than the above-mentioned apparatus, and the data to be processed and the data/program that have been processed already may be exchanged among the above-mentioned apparatus and other apparatuses through communication means in order to execute the present invention by the above-mentioned apparatus and by the other apparatuses.

In the program/data storage unit 40 are stored the above-mentioned musical factor data, the above-mentioned variety of data and various other data. These variety of data include data necessary for the time-division processing as well as data to be assigned to the time-division channels.

The impulse signal-generating unit 50 repetitively generates the impulse response signals ISj(t) of a predetermined length, and a sound is output from an acoustic output unit 60. The recurring period of the impulse response signals ISj(t) that are repetitively generated changes depending upon the pitch data. Furthermore, the rate of reading the generated impulse response signals ISj(t) (rate of generation) changes depending upon the timbre data different from the pitch data and upon the musical factor data irrelevant to the pitch, and the recurring period and the rate of reading can be changed independently of each other.

The impulse response signal ISj(t) has a predetermined finite length corresponding to the spectrum envelope of a tone signal that is to be generated. The impulse signal-generating unit 50 forms a plurality of tone signals simultaneously by the time-division processing and produces a polyphonic sound.

The timing-generating unit 30 outputs timing control signals to every circuit so that the whole circuitry of the tone-generating apparatus is maintained in synchronism. The timing control signals include clock signals of all periods, as well as a signal of a logical product or a logical sum of these clock signals, a signal of a period of a channel-dividing time of the time-division processing, and channel number data j.

4. Assignment memory 42

Figure 2:
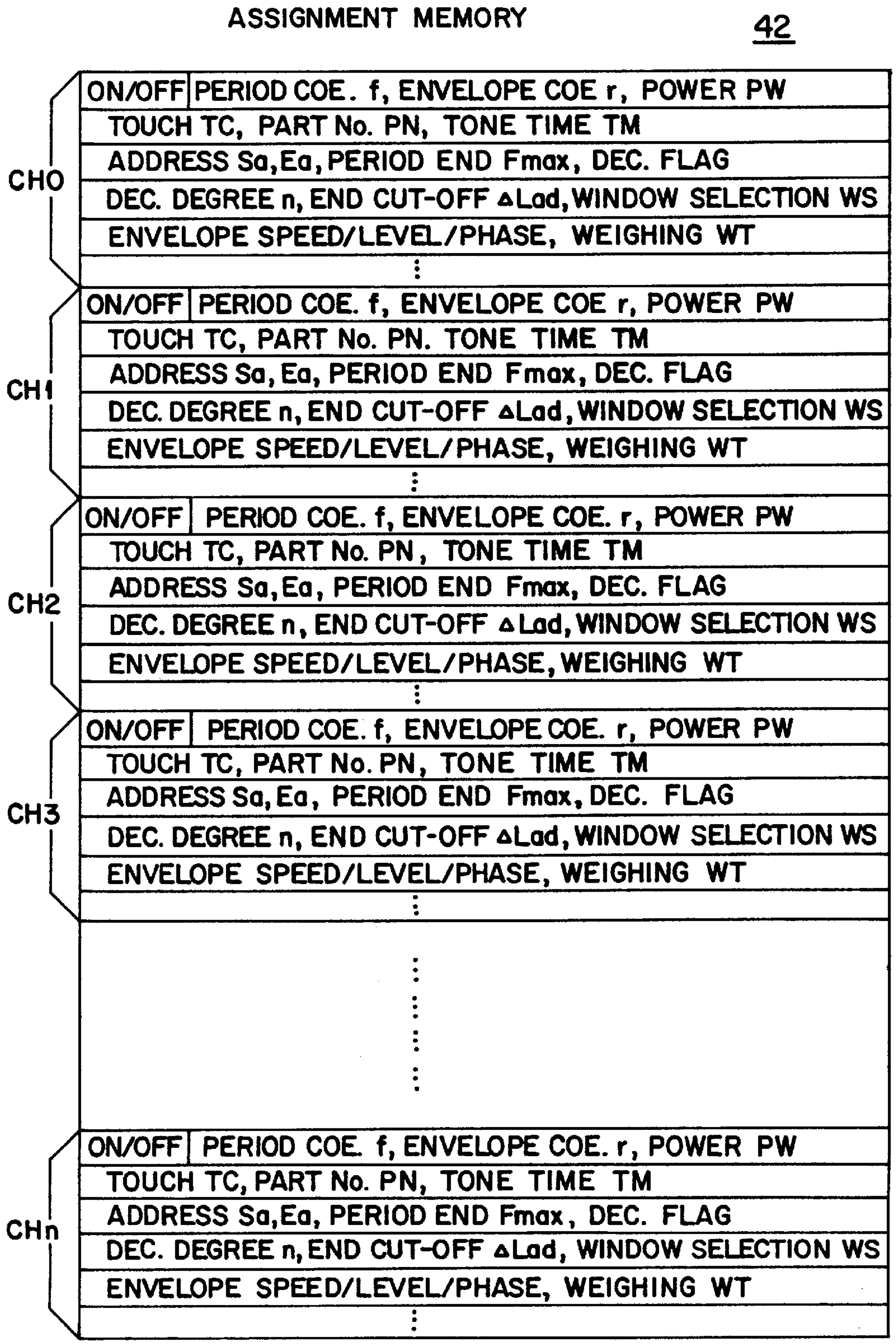
FIG. 2 illustrates an assignment memory 42.

FIG. 2 illustrates an assignment memory 42 in a program/data storage unit 40. In the assignment memory 42 have been formed a plurality of channel memory areas (of a number of 16, 32 or 64, etc.) to store data related to musical tones assigned to a plurality of tone-generating channels formed in the impulse signal-generating unit 50.

In the channel memory areas are stored a period coefficient f (or key number data KN) of a tone to which a channel is assigned, a spectrum coefficient r (tone number data TN), waveform head address Sa, waveform end address Ea and period end value Fmax, as well as on/off data, touch data TC, tone time data TM, part number data PN, power data PW, end cut-off data ΔLad, window width data Wad, window selection data WS, envelope phase data EF, envelope rate data ES, and envelope level data EL.

The on/off data indicates that the tone being sounded is the one while the key is on or during the sounding start ("1"), or is the one while the key is off or during the sound off ("0"). The period coefficient f (key number data KN) represents the pitch of the tone that is sounded, and is determined depending upon the pitch data. The most significant data of the period frequency f represents the tone pitch range or octave. The frequency number data FN is sent by the controller 20 to the impulse signal-generating unit 50 at a corresponding channel timing.

The spectrum coefficient r (tone number data TN) represents the timbre of a tone that is assigned and sounded, and is determined depending upon the timbre data. The spectrum coefficient r is sent by the controller 20 to the impulse signal-generating unit 50 at a corresponding channel timing. The touch data TC represents the speed or strength of the sounding operation, and is determined depending upon the touch data.

The power data PW represents the power of waveform energy of an impulse response signal ISj(t), and is determined depending upon the repeating period T of the impulse response signals ISj(t) stored in the impulse signal storage unit 51 (FIG. 3), the reading (sounding) rate of the impulse response signals ISj(t) or the waveforms thereof.

For example, when the power data PW of an impulse response signal ISj(t) of a given pitch is set to a reference value "1", and impulse response signal ISj(t) of a pitch which is high by one octave becomes "½", an impulse response signal Isj(t) of a pitch which is high by two octaves becomes "¼", - - - , an impulse response signal ISj(t) of a pitch which is low by one octave becomes "2", an impulse response signal ISj(t) of a pitch which is low by two octaves becomes "4", - - - .

Furthermore, when the power data PW of an impulse response signal ISj(t) of a given reading rate is set to a reference value "1", an impulse response signal ISj(t) of a reading rate twice as fast becomes "2", an impulse response signal ISj(t) of a reading rate three times as fast becomes "3", - - - , an impulse response signal ISj(t) of a reading rate one-half times as fast becomes "½", an impulse response signal ISj(t) of a reading rate one-third times as fast becomes "⅓", - - - .

The power data PW is set even among different impulse response signals ISj(t). When the waveform of the impulse response signal ISj(t) vigorously changes and has a large power, then, the power data PW is set to be small. When the waveform of the impulse response signal ISj(t) mildly changes and has a small power, the power data PW is set to be large.

When the magnitude (amplitude or power) of the impulse response signals ISj(t) stored in the impulse signal storage unit 51 is the same, no power data PW needs be set among the different impulse response signals ISj(t).

Among the different impulse response signals ISj(t), the power data PW is determined based upon the integral value of waveforms of impulse response signals ISj(t) or upon the sum of absolute values of maximal values and minimal values of the waveforms.

Among the same impulse response signals ISj(t) as described above, furthermore, the power data PW varies in reverse proportion to the repeating period T, i.e., in reverse proportion to the pitch frequency, and further varies in reverse proportion to the present timbre, i.e., in reverse proportion to the reading rate. The power data PW, however, becomes as given below depending upon the impulse characteristics of the tone-generating (sounding) circuit, i.e., depending upon the conversion characteristics from the electric energy to the volume energy of a speaker. In the following, symbols A, B, C and D are constants, and T is the above-mentioned repeating period. The pitch frequency assumes an inverse number and is substituted for "T". S denotes a reading rate.

$$PW = A \times (T/S)n \ (n=1, 2, 3, \text{- - -})$$

$$PW = B \times \log c(T/S)$$

$$PW = D \times n\sqrt{}(T/S) \ (n=1, 2, 3, \text{- - -})$$

"n√" means to find an "n-th root" of the subsequent numerical values. In this case, the "n-th root" of (T/S) is calculated.

The power data PW is converted from the pitch data (key number data KN) and the timbre data (tone number data TN) by a table in the program/data storage unit 40. Similarly, the period coefficient f si converted from the pitch data (key number data KN) by a table in the program/data storage unit 40. The spectrum coefficient r is converted from the timbre data (tone number data TN) by a table in the program/data storage unit 40.

Figure 26:
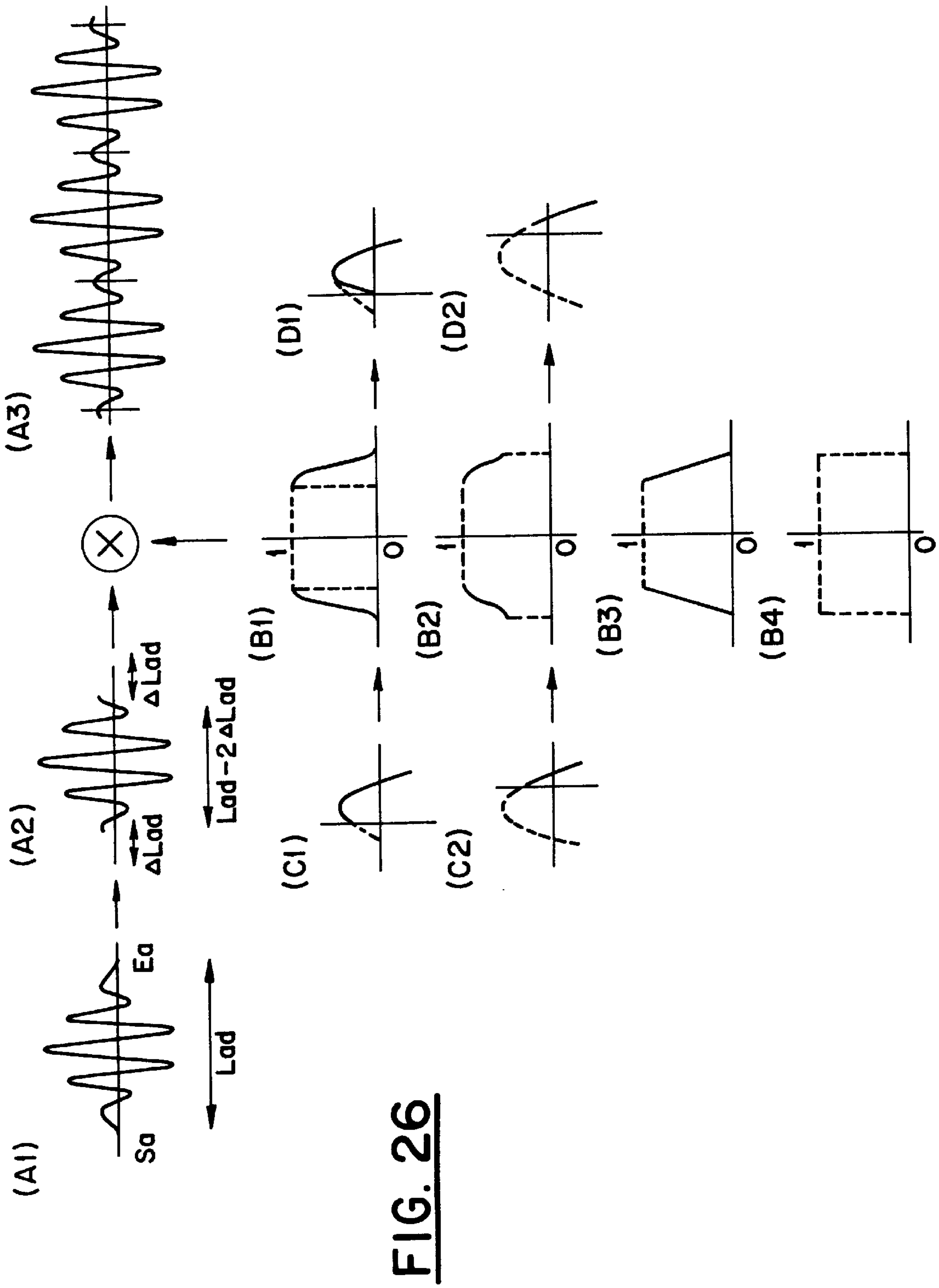
FIG. 26 illustrates a state where the ends of the impulse response signal ISj(t) are cut off.

As shown in FIG. 26(A2), the end cut-off data ΔLad represents an address amount that is cut off from both ends of the impulse response signal ISj(t) and is not read out (not generated). When the impulse response signals ISj(t) are superposed one upon the other, therefore, the signals are not superposed at the ends of the impulse response signals ISj(t) or the number of superposing signals decreases, and the data of impulse response signals ISj(t) need be operated and treated in small amounts.

Figure 10:
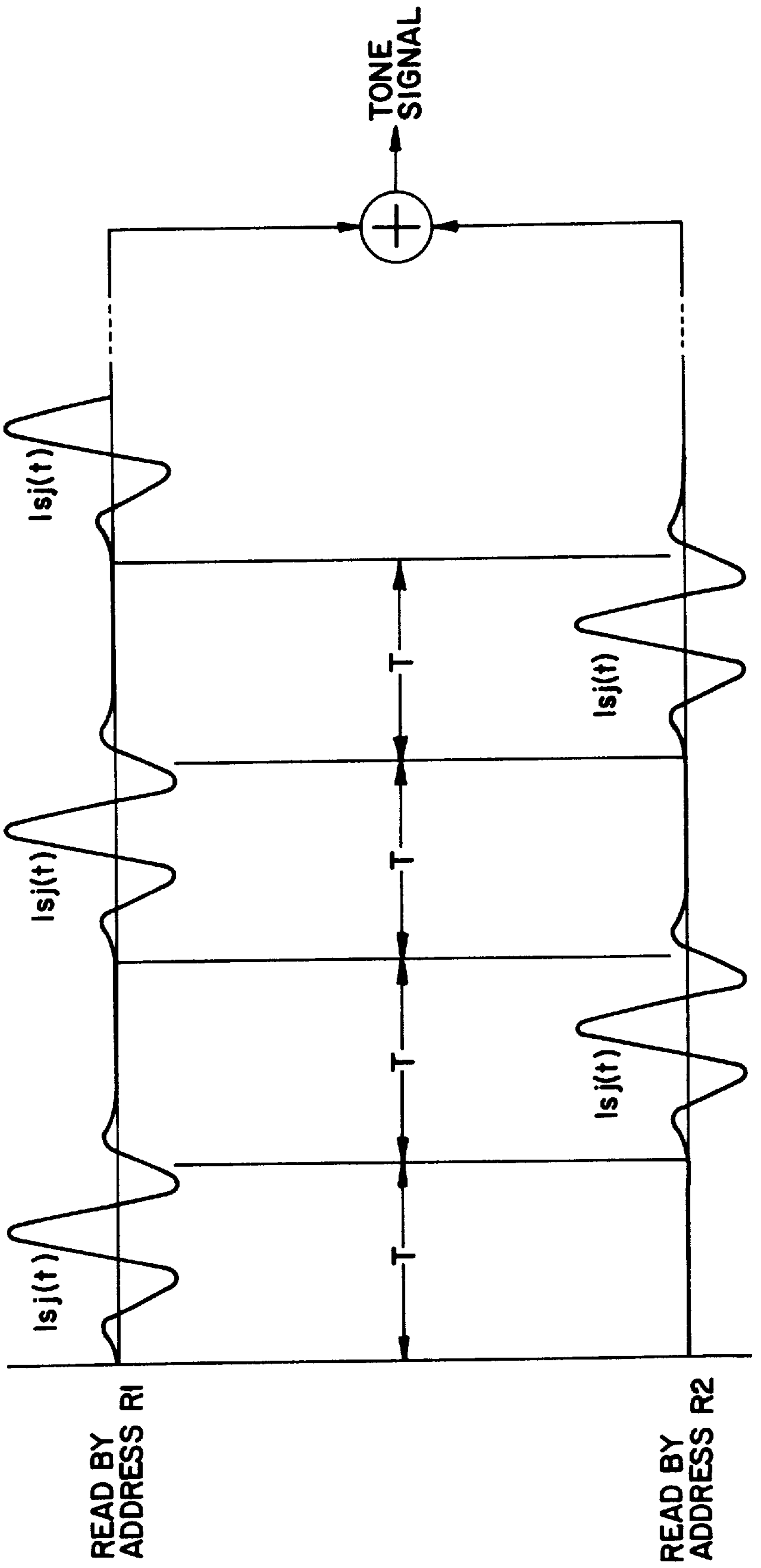
FIG. 10 illustrates a state where the impulse response signals ISj(t) are read out from the impulse signal storage unit 51.

The end cut-off data ΔLad is detected and found as described below. Here, symbol T denotes a repeating period of impulse response signals ISj(t), f denotes a period coefficient for determining the pitch, Fmax denotes a period end value, Sa denotes a head address of a waveform or a head address of the impulse response signal ISj(t) that is read out, Ea denotes an end address of the waveform or an end address of the impulse response signal ISj(t) that is read out, r denotes a spectrum coefficient for determining the timbre, Lad denotes an address length L of the impulse response signal ISj(t) that is read out, Lt denotes a time length L of the impulse response signal ISj(t) that is read out, ΔLt denotes a time length that is cut off from both ends of the impulse response signal ISj(t), and m denotes the number of means which alternatingly generate the impulse response signals ISj(t), corresponds to the number of low-order address data R1 and R2 that are read out, and is "2" in this embodiment as shown in FIG. 10.

$$T=Fmax/f$$

$$Lad=(Ea-Sa)$$

$$Lt=Lad/r=(Ea-Sa)/r$$

$$\Delta Lt=(m\times Lt-T)/2m$$

$$\Delta Lad=Lad\times\Delta Lt/Lt=(Ea-Sa)\times\Delta Lt/Lt$$

Here, the amount by which the ends of the impulse response signals ISj(t) are superposed one upon the other, is in agreement with the end cut-off amount of the impulse response signals ISj(t), whereby the impulse response signals ISj(t) are connected at the cut-off ends.

When ΔLad or ΔLt becomes greater than a value that is found, a gap develops among the impulse response signals ISj(t), and the end cut-off amount of the impulse response signals ISj(t) becomes greater than the amount by which the ends of the impulse response signals ISj(t) are superposed one upon the other. Besides, when ΔLad or ΔLt becomes smaller than the value that is found, the impulse response signals ISj(t) are superposed one upon the other, and the end cut-off amount of the impulse response signals ISj(t) becomes smaller than the amount by which the ends of the impulse response signals ISj(t) are superposed one upon the other.

Symbol m denotes the number of means for generating the impulse response signals ISj(t). When m=1, the superposition on the end of the next impulse response signal ISj(t) becomes the end cut-off data ΔLad. When m=2, the superposition on the end of every other impulse response signal ISj(t) becomes the end cut-off data ΔLad. When m=3, the superposition on the end of every two other impulse response signals ISj(t) becomes the end cut-off data ΔLad. When m=4, the superposition on the end of every three other impulse response signals ISj(t) becomes the end cut-off data ΔLad.

As described above, the end cut-off data ΔLad is detected and found from the period coefficient f, spectrum coefficient r, address length Lad=(Ea−Sa) of the impulse response signals ISj(t), etc. The frequency coefficient f is determined from the pitch data and other musical factor data and, hence, the end cut-off data ΔLad changes depending upon the pitch and the like. The spectrum coefficient r is determined from the timbre data and other musical factor data and, hence, the end cut-off data ΔLad changes depending upon the timbre and the like.

The window width data Wad represents the address amount of a window function value WF synthesized on the impulse response signal ISj(t) from which the two ends have been cut off. The window function value WF is stored in a window function memory 71 (FIG. 25), and is operated and synthesized on the remaining two ends or on the whole of the impulse response signal ISj(t) from which the two ends have been cut off.

The window selection data WS selects plural kinds of window function values WF stored in the window function memory 71. The kinds of the window functions are shown in FIGS. 26(B1), 26(B2), 26(B3) and 26(B4). The window function value WF varies from 0 time through up to 1 time, or varies for ½ times through up to 1 time, and serves as a weighing data that varies from a decreased number of times through up to an equal number of time.

The envelope phase data EF represents attack, decay, sustain or release of envelope, the envelope rate data ES represents a step value of one time of digital operation of the envelope, and the envelope level data EL represents a target value reached by an envelope operation value at the end of each phase.

The impulse response signals ISj(t) generated by musical data of each of the channels of the assignment memory 42 are synthesized and output in a number of s as a musical tone, or are output as a musical tone for each of the channels. The impulse response signals ISj(t) of the number of s synthesized as a musical tone are to consecutive channels of the number of s at the same timing. Therefore, the timings of generation become the same and the phases become the same, too.

The combination of the thus synthesized impulse response signals ISj(t) of the number of s is selectively determined depending upon the musical factor data such as timbre data, touch data, pitch data, sounding time data, sounding number data or resonance degree data. A decoder or a table therefor is provided in the program/data storage unit 40.

The weighing data WT determines the mixing ratio of the impulse response signals ISj(t) synthesized in the number of s as a musical tone, and is stored for each of the channels. The weighing data WT assumes a value of from "0" to "1", and the resultant value of weighing data WT of the number s assumes "1" or a value other than "1". The weighing data WT is selectively determined depending upon the above-mentioned musical factor data, such as pitch data, timbre data, touch data, sounding time data, sounding number data or resonance degree data. A decoder or a table therefor is provided in the program/data storage unit 40.

The channel number every after the number of s becomes 0 to 1, or 2 to 3, or 4 to 5, or 6 to 7, - - - , when the synthesizing number s is 2, becomes 0 to 2, or 3 to 5, or 6 to 8, or 9 to 11, - - - , when the synthesizing number s is 3, becomes 0 to 3, or 4 to 7, or 8 to 11, or 12 to 15, - - - , when the synthesizing number s is 4, becomes 0 to 4, or 5 to 9, or 10 to 14, or 15 to 19, - - - , when the synthesizing number s is 5, - - - . The synthesizing number s is input by the operator or is automatically set when the apparatus is initially set, or is determined depending upon the above-mentioned musical factors (timbre data), and is stored in a register in the program/data storage unit 40.

The impulse response signals ISj(t) every after the number of s have head addresses Sa of waveform, most significant read address data or spectrum coefficients r which are different, have waveforms or timbres which are different, and have different frequency characteristics (spectrum envelope, frequency spectrum component or formant shape). They, however, may be the same as a matter of course.

The frequency coefficients f of impulse response signals ISj(t) every after the number of s are the same or are different by an integral ratio. The impulse response signals ISj(t) of the number of s are in phase and have the pitches which are the same or are different by an integral ratio. They may be different by a non-integral ratio, as a matter of course.

The impulse response signals ISj(t) every after the number of s have the tone time data TM, touch data TC, power data PW, part number data PN, waveform end addresses Ea, period end values Fmax, decimation flags, decimation degrees n, end cut-off data ΔLad, window selection data WS, envelope rates ES, envelope levels EL, and envelope phases EF, which are the same and which, therefore, may be stored representatively every after the channels of the number of s. The data of the number of s may be different as a matter of course.

When the envelope rates ES, envelope levels EL or envelope phases EF of the impulse response signals ISj(t) of the number of s are used in common, then, the number of the time-divisional channels formed by the envelope generator 56 can be decreased correspondingly, and the accumulated integrated impulse response signals AISj(t) are multiplied and synthesized by an envelope data EN.

The synthesized impulse response signals ISj(t) of the number of s have envelope rates ES, envelope levels EL and envelope phases EF which are different. When these data ES, EL and EF are separately stored for each of the impulse response signals ISj(t), the synthesizing ratio or mixing ratio, i.e., weighing ratio of the synthesized impulse response signals ISj(t) varies depending upon the lapse of the sounding time. In this case, each envelope level data EL plays the role of synthesized weighing data WT.

The data of these channel memory areas are written at a sounding-start timing, rewritten or read out for each of the channel timings, and are sent to the impulse signal generating unit 50. The assignment memory 42 may be provided in the impulse signal generating unit 50 or in the controller 20 instead of in the program/data storage unit 40.

Truncate methods or methods of assigning the musical tones to the channels formed by the time-divisional processing, i.e., to a plurality of tone-generating systems that generate a plurality of tones in parallel, have been taught in, for example, Japanese Patent Applications Nos. 42298/1989, 305818/1989, 312175/1989, 208917/1990, 409577/1990 and 409578/1990.

5. Impulse Signal-Generating Unit 50

Figure 3:
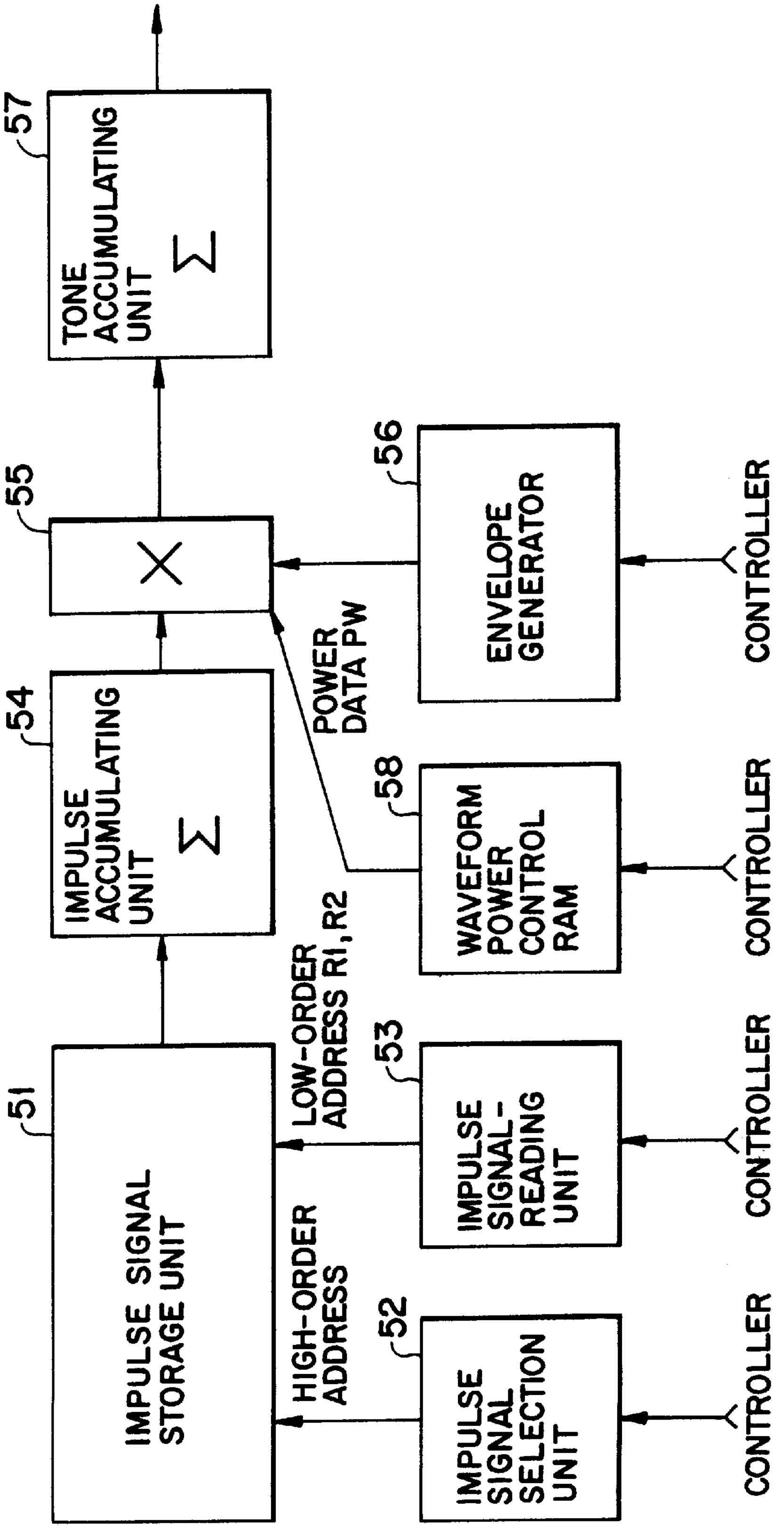
FIG. 3 illustrates an impulse signal generating unit 50.
Figure 4:
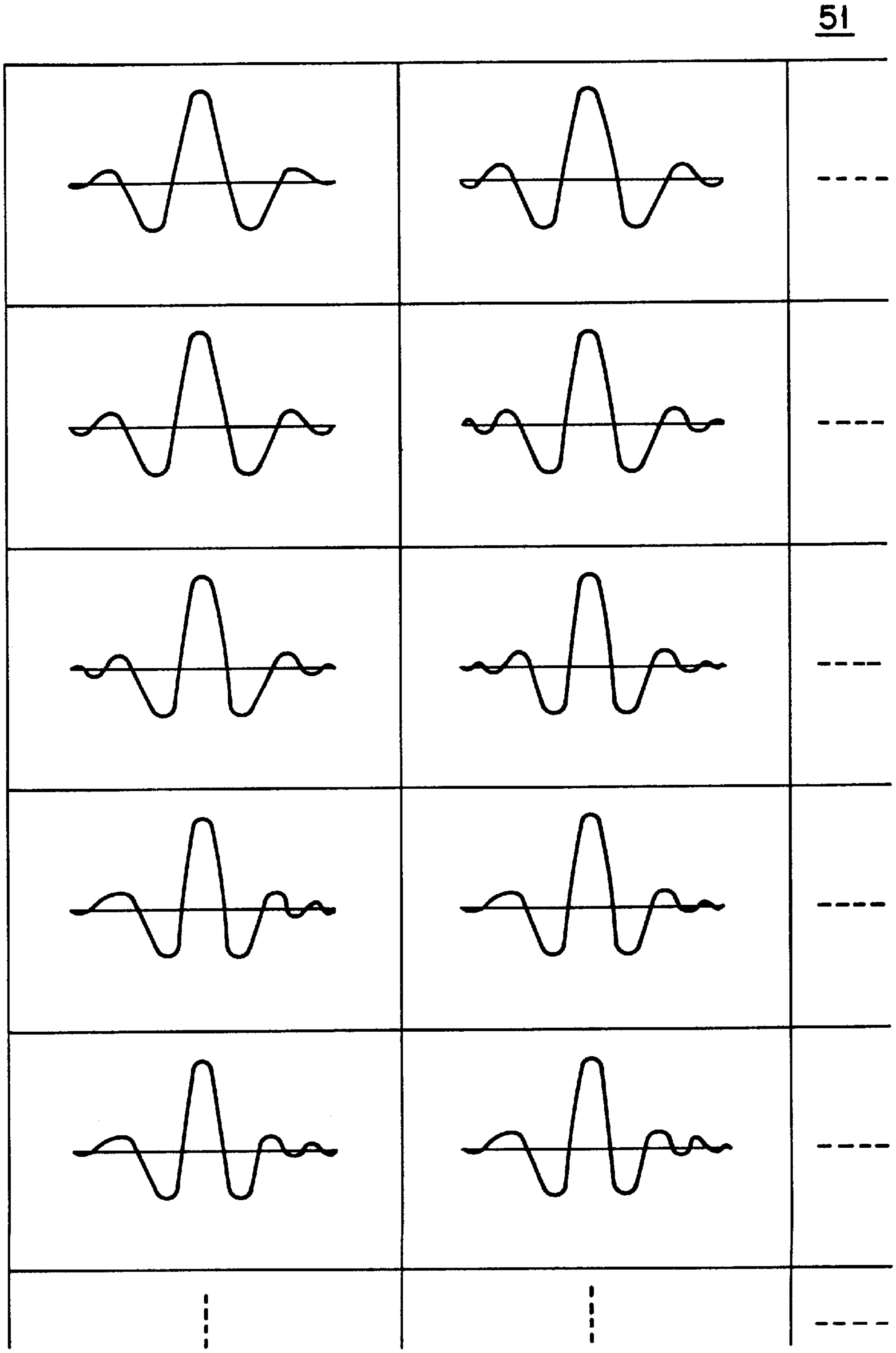
FIG. 4 illustrates various impulse response signals ISj(t) stored in an impulse signal storage unit 51.

FIG. 3 illustrates the impulse signal-generating unit 50. The impulse signal storage unit 51 stores a variety kinds of impulse response signals ISj(t) as shown in FIG. 4. The impulse response signals ISj(t) have dissimilar waveforms which, when synthesized into a tone signal, produce different timbres. These impulse response signals ISj(t) are corresponded to the musical factor data, and are stored in a multiplexed manner for each of timbre, touch, pitch (tone pitch range) or sounding time, field of play, envelope phase, number-of-sounds data and degree-of-resonance data.

For example, the impulse response signals ISj(t) are stored differently for each of the timbres. Among them, the impulse response signals ISj(t) of one kind of timbre are differently stored for each of the touches. Among them, the impulse response signals ISj(t) of one kind of touch are differently stored for each of the sounding times, are differently stored for each of the pitches, are differently stored for each of the fields of play, and are differently stored for each of the envelope phases.

The musical factor data are converted through the controller 20 into high-order read address data for specifying a variety of impulse response signals ISj(t). The read address data are sorted in the impulse signal selection unit 52 and are fed to the impulse signal storage unit 51 thereby to select the impulse response signals ISj(t). When the musical factor data change for each of the tones or during the sounding, the high-order address data are changed over, and the impulse response signals ISj(t) that are read out are changed over, too.

When the musical factor data are related to the pitch, the waveform of the impulse response signal changes depending upon a change in the pitch, and the timbre of a tone signal that is synthesized changes, too, depending upon the pitch. When the musical factor data are related to the data other than the pitch, the waveform of the impulse response signal changes depending upon a change in the timbre, touch, sounding time and field of play and, besides, the timbre of the synthesized tone signal changes depending upon a change in the timbre, touch, sounding time and field of play.

The impulse signal selection unit 52 has memory areas corresponding to the number of time-division channels, and the high-order address data corresponding to musical factors of the tones assigned to the channels are stored in the respective memory areas, are read out by the channel number data j from the timing-generating unit, and are fed to the impulse signal storage unit 51.

The impulse response signals ISj(t) of the impulse signal storage unit 51 are read out by low-order read address data R1 and R2 from the impulse signal-reading unit 53. The low-order read address data R1 and R2 are increased at a speed corresponding to the musical factor data other than the pitch data. Therefore, the rate of reading the impulse response signals ISj(t) is not determined by the pitch data. The impulse response signals ISj(t) are repetitively read out. The recurring period changes depending upon the pitch data, and the recurring period and the rate of reading are determined independently of each other.

The impulse response signals ISj(t) read out from the impulse signal storage unit 51 are accumulated and synthesized for each of the channels through an impulse accumulating unit 54. The envelope signals from the envelope generator 56 are multiplied and synthesized for each of the channels through a multiplier 55, the tone signals of all channels are accumulated and synthesized through a tone accumulating unit 57, and a sound is output from an acoustic output unit 60.

The musical factor data (envelope data), i.e., envelope speed data ES, envelope level data EL and envelope phase data EF are fed from the controller 20 to an envelope generator 56, and are stored for each of the channels. The speeds and levels of phases of envelopes of the channels are set based upon the musical factor data (envelope data), and the shapes of the envelopes are determined. The envelope signals are generated in a time-divided manner for each of the channels and are sent to the multiplier 55.

The power data PW of the above-mentioned channels are stored in the corresponding channel areas of a waveform power control RAM 58 by the controller 20. The power data PW are sent to a multiplier 55 where it is used for multiplying a tone signal (impulse response signal ISj(t)) from the impulse accumulating unit 54 or for multiplying an envelope data from an envelope generator 56. The waveform power control RAM 58 has memory area corresponding to the time-divisional channels, and the power data PW are time-divisionally switched and are read out. The switching is effected based on the channel count data from a timing generating unit 30.

Therefore, even though the repeating period T of the impulse response signals ISj(t) changes depending upon the pitch and the power of waveform i.e. the volume of sound changes depending upon the pitch, the change is adjusted and canceled. Besides, even though the power of waveform i.e. the volume of sound changes depending upon the pitch since the impulse response signals ISj(t) have dissimilar waveform from each other, the change is adjusted and canceled.

Figure 5:
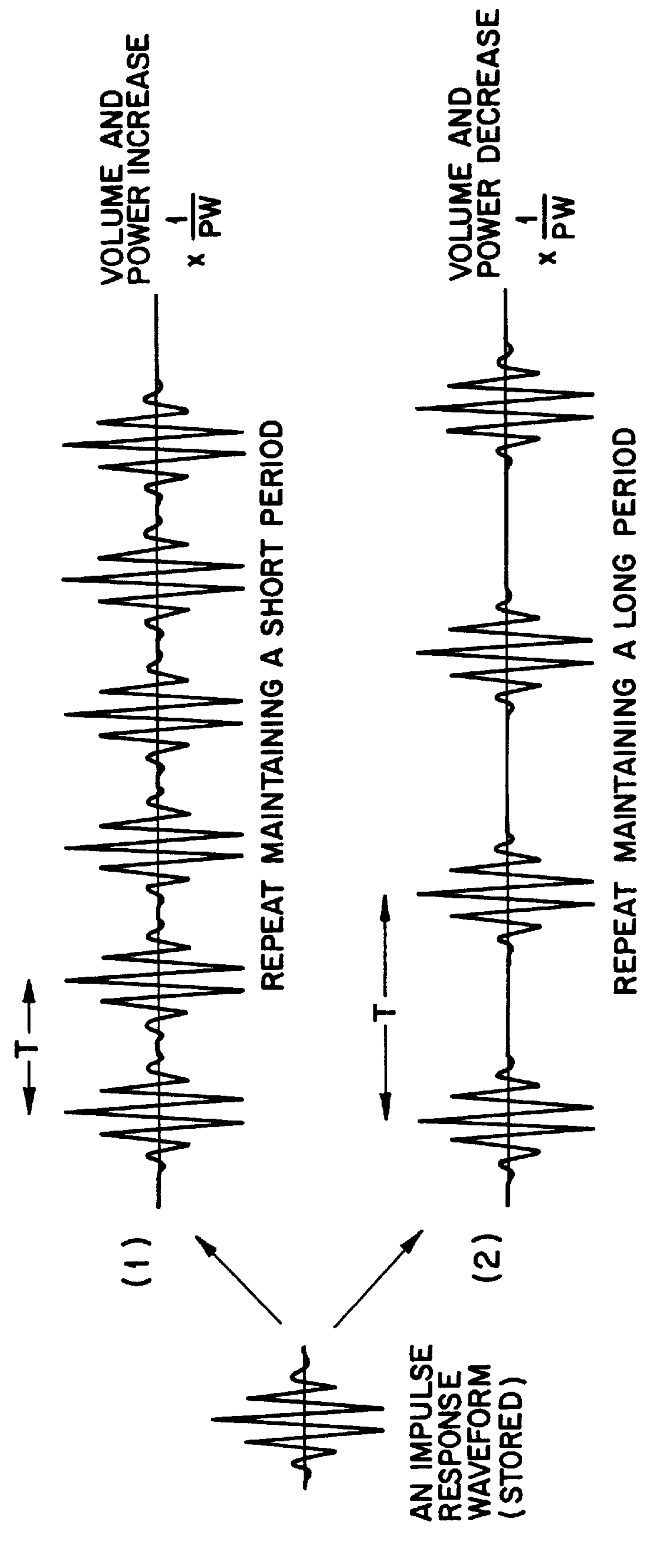
FIG. 5 shows a difference in the waveform power (volume) due to a change in the repeating period T of impulse response signals ISj(t)

FIG. 5 illustrates a relationship between the waveform power and the pitch or repeating period T of the impulse response signals ISj(t). When the impulse response signals ISj(t) are read out maintaining a short period as shown in FIG. 5(1), the waveform energy increases and the volume of sound increases per a unit time. When the impulse response signals ISj(t) are read out maintaining a long period as shown in FIG. 5(2), on the other hand, the waveform energy decreases and the volume of sound decreases per a unit time.

Similarly, though not diagramed, when the impulse response signals ISj(t) are slowly read out, the waveform energy increases and the volume of sound increases per the unit time. When the impulse response signals ISj(t) are quickly read out, on the other hand, the waveform energy decreases and the volume of sound decreases per the unit time.

Being multiplied by the power data PW, on the other hand, the level of the input response signal ISj(t) that is output is controlled to suppress an excess of change in the volume of sound (power) caused by a change in the repeating period T or in the pitch, or caused by a change in the reading rate or in the timbre.

The power data PW may be used for multiplying the envelope level data EL stored in the assignment memory 42 and may be sent to the envelope generator 56. Furthermore, the touch data TC stored in the assignment memory 42 may be used for multiplying the power data PW by operating an inverse number of the period coefficient f and the spectrum coefficient r.

6. Impulse Signal-Reading Unit 53.

Figure 6:
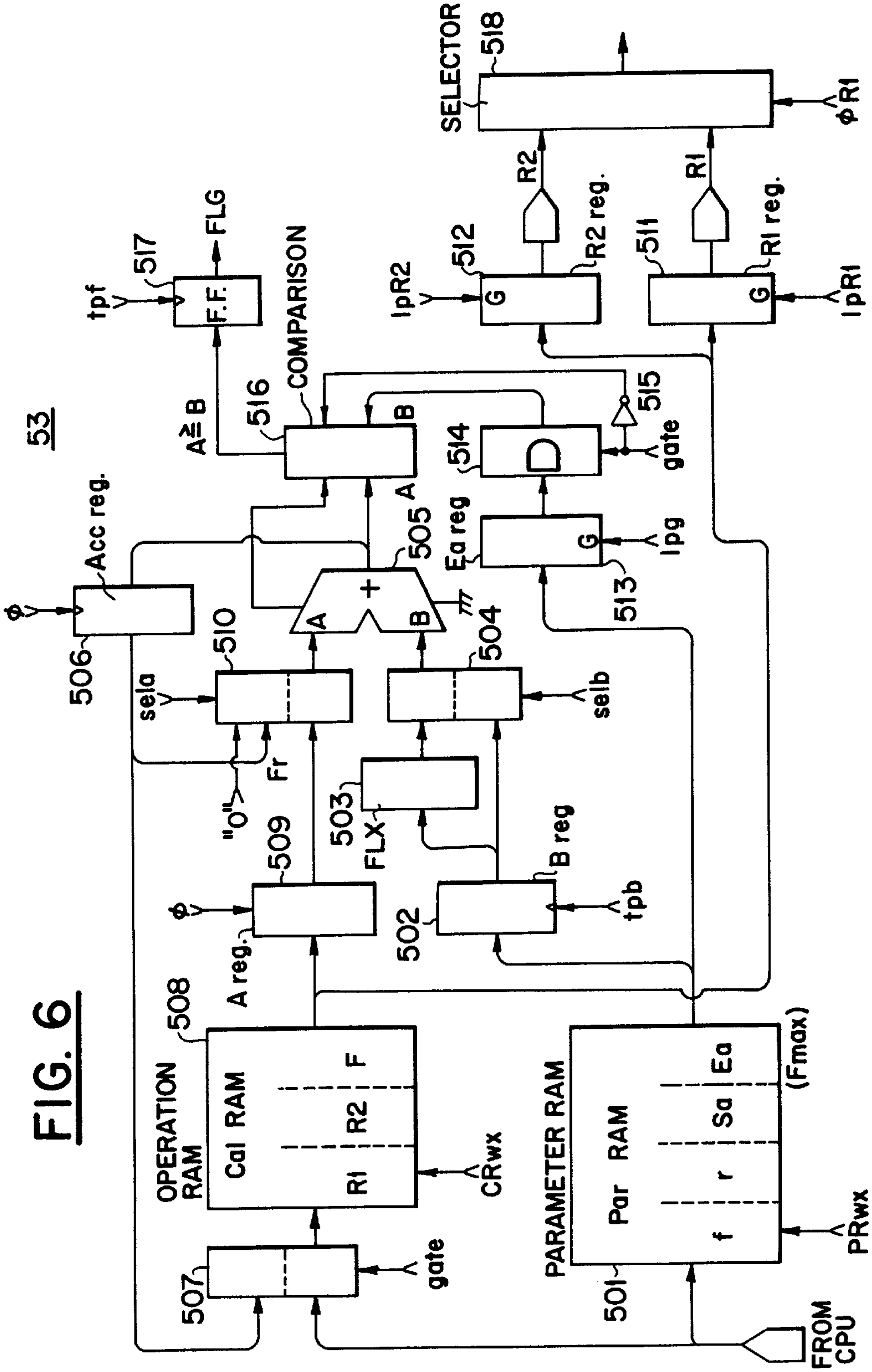
FIG. 6 illustrates an impulse signal reading unit 53 in the impulse signal-generating unit 50.

FIG. 6 illustrates the impulse signal-reading unit 53 in the impulse signal-generating unit 50. A frequency coefficient f, a spectrum coefficient r, a waveform head address Sa and a waveform end address Ea from the controller (CPU) 20 are stored in a parameter RAM 501 for each of the time-division channels. Depending upon the cases, a period end value Fmax is stored in the parameter RAM 501 for each of the time-division channels. In the parameter RAM 501 are formed memory areas of a number corresponding to the number of the time-division channels, and the coefficients f, r and addresses Sa, Ea corresponding to the tones assigned to the channels are stored in the corresponding memory areas. When the data f, r, Sa and Ea are sent at all times in a time-divided manner from the assignment memory 42, the parameter RAM 501 may have only one memory area.

The period coefficient f and the period end value Fmax determine the length of recurring period of the impulse response signals ISj(t), and determine the pitch of the tone that is formed. As the period coefficient f is repetitively accumulated and reaches the period end value Fmax, the impulse response signals ISj(t) are repetitively read out. The accumulated value of the period coefficient f serves as a period count value F. The period coefficient f and the period end value Fmax are determined by the pitch data (key number data), and are converted from the key number data. The length of the recurring period determines the pitch of the tone signal that is generated.

Either the period coefficient f or the period end value Fmax may be secured. In the embodiment of FIG. 3, the period end value Fmax is set to a maximum value. ("1111 - - - 11" or "111 - - - 1100 - - - 0") that can be taken by a period count value F. However, the period end value Fmax is not stored.

The spectrum coefficient r determines the rate of reading (generating) the impulse response signals ISj(t), determines the frequency characteristics (spectrum envelope, frequency spectrum component or formant shape) of the impulse response signals ISj(t), and determines the timbre of the formed tone. The spectrum coefficient r is repetitively accumulated from the waveform head address Sa to the waveform end address Ea, and are fed to the impulse signal storage unit 51 as low-order read address data R1 and R2. As the low-order read address data R1 and R2 reach the waveform end address Ea, the impulse response signal ISj(t) is not read out until the period count value F reaches the period end value Fmax.

The spectrum coefficient r is determined by the musical factor data that have no relation to the pitch, and are converted, for example, from the timbre data (tone number data), touch data, sounding time data (tone time data), field-of-play data (part number data), number-of-sounds data or degree-of-resonance data.

The spectrum coefficient r or the period coefficient f from the parameter RAM 501 is sent through b register 502, through or without through an FLX 503 and through a selector 504, to an adder 505 where it is added to a the low-order read address data R1 and R2 up to that moment or to a period count value F, which is, then, sent, through an accumulation register 506 and a selector 507, to an operation RAM 508 and is stored therein. In the operation RAM 508 are formed memory areas of a number corresponding to the number of the time-division channels, and the data R1, R2 and F corresponding to the tones assigned to the channels are stored in the corresponding memory areas. The FLX 503 converts the data based on a floating point into the data based on a fixed decimal point.

Figure 9:
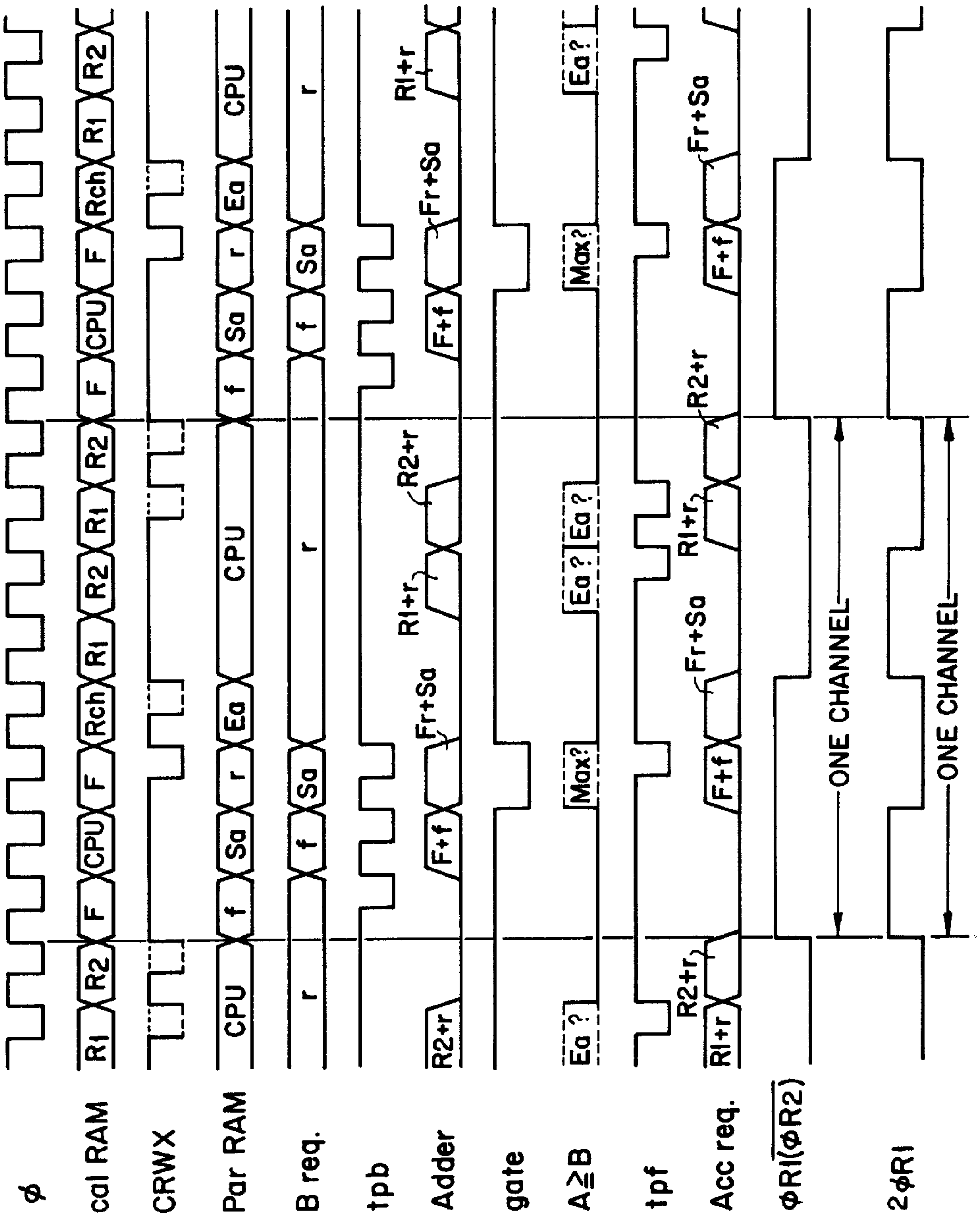
FIG. 9 is a time chart illustrating the operations at each of the portions of the impulse signal reading unit 53.

The data R1, R2 and F are sent to the adder 505 through an operation RAM 508, an A-register 509 and a selector 510. Furthermore, the data R1 and R2 are alternatingly selected by a selector 518 passing through an R1 register 511 and an R2 register 512, and are sent to the impulse signal storage unit 51. Among the period count values F from the cumulative register 506, the low-order decimal data Fr or data "0" is fed to the adder 505 through the selector 510. The selector 518 is switched by a clock signal ϕ R1. A period of the clock signal ϕ R1 is equal to a divisional time of one channel as shown in FIG. 9.

The initial value of the low-order read address data R1 is "0", the initial value of the low-order read address data R2 is a waveform end address Ea, and the initial value of a period count value F is "0". These initial values are stored in the operation RAM 508 from the controller 20 through the selector 507.

The waveform end address value Ea (period end value Fmax) is fed from the parameter RAM 501 to a comparator 516 through an Ea-register 513 and a group of AND gates 514. To the comparator 516 are further fed low-order read address data R1, R2 or period count value F from the adder 505. When the low-order read address data R1 and R2 reach a waveform end address value Ea or when the period count value F reaches the maximum value "111 - - - 11" or a value "111 - - - 1100 - - - 0" (period end value Fmax) approximate to the maximum value, a detection signal is set to a flip-flop 517 and is sent to the controller (CPU) 20.

A carry-out signal Cout from the adder 505 is fed as a group of high-order bits of the comparator 516. A gate signal from the group of AND gates 514 is inverted through an inverter 515, and is fed as a group of high-order bits of the comparator 516 so that the bit number is conformed.

The waveform head address Sa and the waveform end address Ea, too, are determined by the musical factor data, and are converted from, for example, pitch data (key number data), timbre data (tone number data), touch data, sounding time data (tone time data), field-of-play data (part number data), number-of-sounds data and/or degree-of-resonance data, and are stored in the corresponding channel memory areas in the parameter RAM 501. The waveform head address Sa and the waveform end address Ea select one of a variety of impulse response signals ISj(t). In this case, the impulse signal selection unit 52 can be omitted.

7. Overall Processing.

FIG. 7 is a flow chart of the overall processing executed by the controller (CPU) 20. The overall processing is started by the turn-on of the power source of the tone-forming apparatus, and is repetitively executed until the power source is turned off.

First, a variety of initialization processings are executed for the program/data storage unit 40 (step 01), and a sounding start processing is execute based on the manual play or the automatic play by the sounding instruction device or the automatic play device in the play data-generating unit 10 (step 02).

In the sounding start processing, a tone related to a key-on event is assigned to an empty channel that is searched. The content of the tone is determined depending upon the play data (tone-generating data) from the play data-generating unit 10, musical factor data in the tone control data, and musical factor data that have been stored already in the program/data storage unit 40.

Then, a sounding end (attenuation) processing is executed based on the manual play or the automatic play using the sounding instruction device or the automatic play device in the play data-generating unit 10 (step 03). In the sounding end (attenuation) processing, a channel to which a tone of a key-off event is assigned is searched, and the tone is attenuated to end the sounding. In this case, the envelope phase of a tone related to the key-off event is released, and the envelope level gradually approaches "0".

Besides, upon operating a variety of switches of the play data-generating unit 10, the musical factor data corresponding to the switches are fetched and are stored in the program/data storage unit 40, whereby the musical factor data are changed (step 04). Thereafter, other processings are executed (step 05), and the processing is repeated from the step 02 up to the step 05.

8. Processing for Generating Impulse Response Signals ISj(t).

Figure 8:
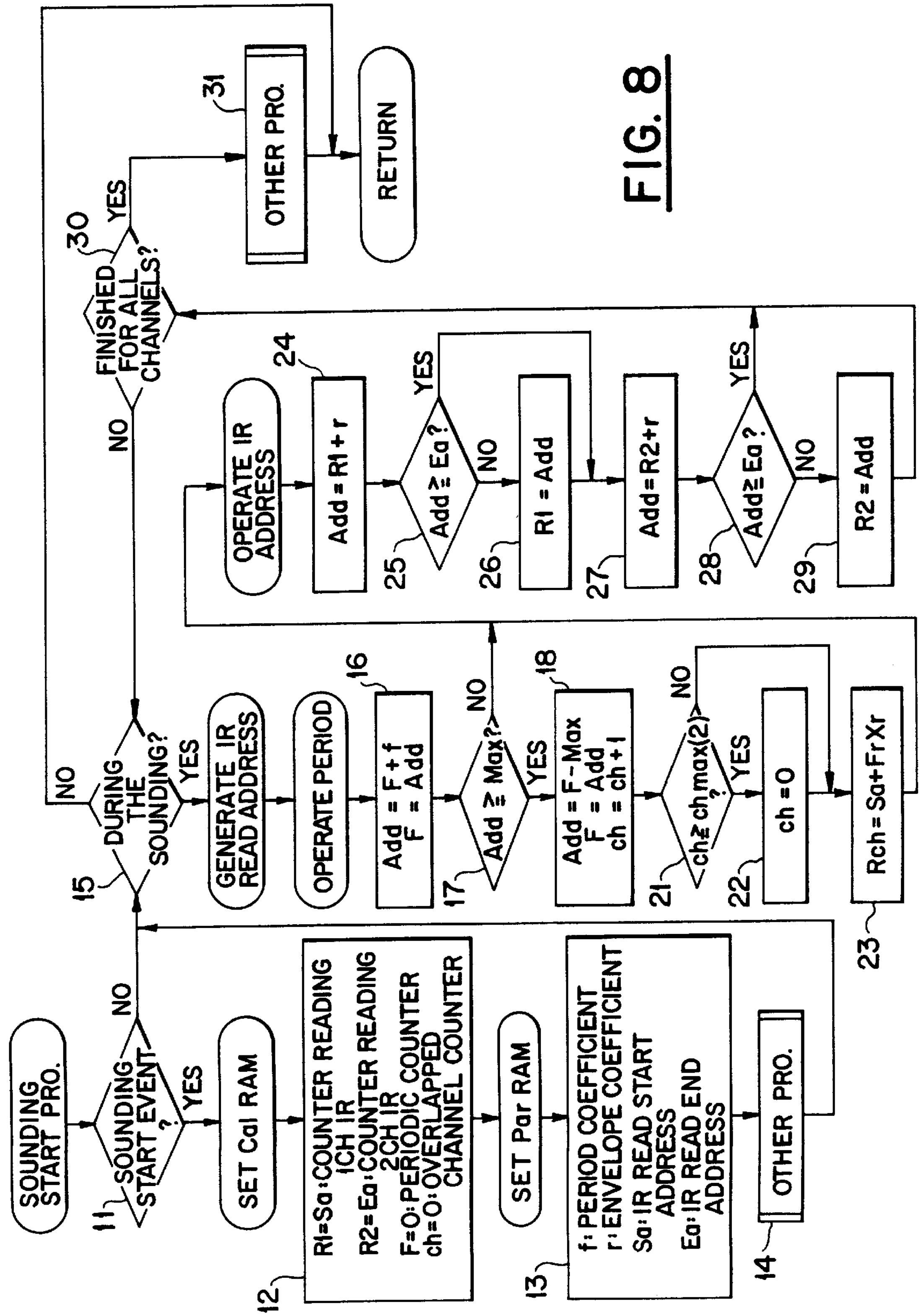
FIG. 8 is a flow chart of a sounding start processing at a step 02.

FIG. 8 is a flow chart of the sounding start processing executed at the step 02 by the controller (CPU) 20. In this processing, impulse response signals ISj(t) are generated. The flow chart of FIG. 8 is executed for all time-division channels.

When a key-on event (sounding start event) based on the manual play or the automatic play is sent to the controller 20 from the sounding instruction device or the automatic play device in the play data-generating unit 10 (step 11), an empty channel is searched, and onto the area of the assignment memory of the searched empty channel are written on/off data of "1", period coefficient f depending upon the pitch, envelope coefficient r depending upon the timbre, touch data TC, part number data PN, tone time data TM of "0", power data PW depending upon the pitch, envelope speed ES, envelope level EL, envelope phase EF of "1", and other flags and data Sa, Ea, Fmax, n, Δ Lad and WS. The period coefficient f and envelope coefficient r will be described later.

Furthermore, the low-order read address data R1 of "0", low-order read address data R2 set to the waveform end address Ea and period count value F of "0" are stored in a corresponding channel memory area of the operation RAM 508, and a corresponding channel area of the overlapped channel counter (program/data storage unit 40) is reset to "0" (step 12).

Next, the period coefficient f and the period end value Fmax are converted from the key number data (pitch data) KN and are stored in a corresponding channel memory area in the parameter RAM 501. The spectrum coefficient r is converted from the tone number data (timbre data), touch data, tone time data (sounding time data) or part number data (field-of-play data) and is stored in a corresponding channel memory area in the parameter RAM 501 (step 13), and other processings are executed (step 14).

The waveform head address Sa and the waveform end address Ea are converted from the key number data (pitch data), tone number (timbre data), touch data, tone time data (sounding time data) or part number data (field-of-play data), and are stored in a corresponding channel memory area in the parameter RAM 501 (step 13). The waveform head address Sa and the waveform end address Ea select one of the above-mentioned variety of impulse response signals ISj(t). In this case, the impulse signal selection unit 52 may be omitted.

When there is a tone at the start of key-on (start of sounding) or during the key-on (during the sounding) (step 15), the period coefficient f is added (accumulated) to the period count value F (step 16). When the added value (accumulated value) is larger than the period end value Fmax ("1111 - - - 11" or "111 - - - 1100 - - - 0") (step 17), the period end value Fmax is subtracted from the period count value F, and the end number of the period count value F is corrected (step 18).

The overlapped channels are changed over (steps 18, 21 and 22), a decimal data Fr of low order in the period count value F is added to the waveform head address Sa of the channels that are changed over (step 23), and the initial value of the low-order read address data R1 or R2 is corrected.

In the overlapped channels, the two impulse response signals ISj(t) are alternatingly read out in a time-dividing manner, are output as a tone, and a plurality of tones are output in a polyphonic manner through a separate time-division channels as described earlier. Depending upon the value (ch=0, 1) of the overlapped channels, read of the two impulse response signals ISj(t) is distinguished.

When the time for reading an impulse response signal ISj(t) is longer than the recurring period of the impulse response signal ISj(t), the preceding impulse response signal ISj(t) is overlapped on the next impulse response signal ISj(t). Therefore, when the above two impulse response signals ISj(t) are separately read out by the division of the channel, the two impulse response signals ISj(t) are read out in parallel and are overlapped one upon the other. The number of the channels may not be smaller than two as a matter of course.

Then, the spectrum coefficient r is added to the low-order read address data R1 until the waveform end address Ea is reached (steps 24, 25 and 26), and the spectrum coefficient r is added to the low-order read address data R2 until the waveform end address Ea is reached (steps 27, 28 and 29). Due to the two low-order read address data R1 and R2, the two impulse response signals ISj(t) are read out in parallel from the impulse response signal ISj(t) storage unit 51 and are overlapped one upon the other in the impulse accumulating unit 54. The above-mentioned processings of from the step 15 to the step 29 are repeated for all time-division channels (step 30), and other processings are executed (step 31).

9. Time Chart for the Impulse Signal-Reading Unit 53.

FIG. 9 is a time chart illustrating the operations of the units of the impulse signal-reading unit 53. As described above, the data are written/read out, into and from, the parameter RAM 501 and the operation RAM 508, the selectors 504, 507 and 510 are changed over, the data restored in the registers 502, 506, 509, 511, 512 and 513, the data are stored in the flip-flop 517, and the group of AND gates 514 is enabled/disenabled (opened/closed) and change of the enable/disenable is controlled. As the change-over control signals, there are used various timing control signals from the timing-generating unit.

The period end value Fmax that is stored in the parameter RAM 501, is written/read out. In a waveform of which the high level and low level are indicated by a dotted line in the waveform of the time chart, the high level/low level is assumed when there exists/does not exist the write data or when the comparator 516 is detected/not detected.

10. Reading State.

FIG. 10 illustrates a state of reading the impulse response signals ISj(t) from the impulse signal storage unit 51. Upon the sounding start (key-on), the first impulse response signal ISj(t) is read out by the low-order read address data R1 (step 24). An increment of the low-order read address data R1 is started at a rate of the spectrum coefficient r.

At the same time, an increment of the period count value F is started at a rate of the period coefficient f (steps 15 and 16). As the period count value F reaches the period end value Fmax (step 17), a reading of the second impulse response signal ISj(t) is started by the low-order read address data R2 despite that the first impulse response signal ISj(t) is still being read out (step 27). An increment of the low-order read address data R2, toc, starts at a rate of the spectrum coefficient r.

After the passage of the second period T from the start of sounding (step 17), a reading of a third impulse response signal ISj(t) is started by the low-order read address data R1 despite that the second impulse response signal ISj(t) is still being read out (step 24).

After the passage of the third period T from the start of sounding (step 17), a reading of a fourth impulse response signal ISj(t) is started by the low-order read address data R2 despite that the third impulse response signal ISj(t) is still being read out (step 27).

Thus, the two impulse response signals ISj(t) are alternatingly lead out due to the two low-order read address data R1 and R2. Therefore, despite that the impulse response signals ISj(t) are longer than the recurring period T, the preceding impulse response signal ISj(t) is continuously generated at the end of each period T, and the next impulse response signal ISj(t) is generated being overlapped thereupon. These impulse response signals ISj(t) are synthesized and output as a tone signal.

The number of the impulse response signals ISj(t) that are time-divisionally read out as a tone signal may exceed "2". In response to this, the number of the low-order read address data increases like R1, R2, R3, R4, - - - and the number of the steps 24 to 26 and 27 to 29 increases, too.

The number of the impulse response signal ISj(t) that is time-divisionally read as a tone signal may be "1". In this case, the length of the impulse response signal ISj(t) becomes shorter than the recurring period T. It is therefore determined whether the impulse response signal ISj(t) is shorter than the recurring period T or not. When it is shorter, the processings of the steps 27 to 29 are omitted, and only one system is needed for time-divisionally reading the impulse response signals ISj(t). The length of the impulse response signal ISj(t) is found by dividing a difference between the waveform end address Ea and the waveform head address Sa by the spectrum coefficient r. Similarly, the recurring period T is found by dividing the period end value Fmax by the frequency coefficient f.

11. Processing the tone time data TM.

Figure 11:
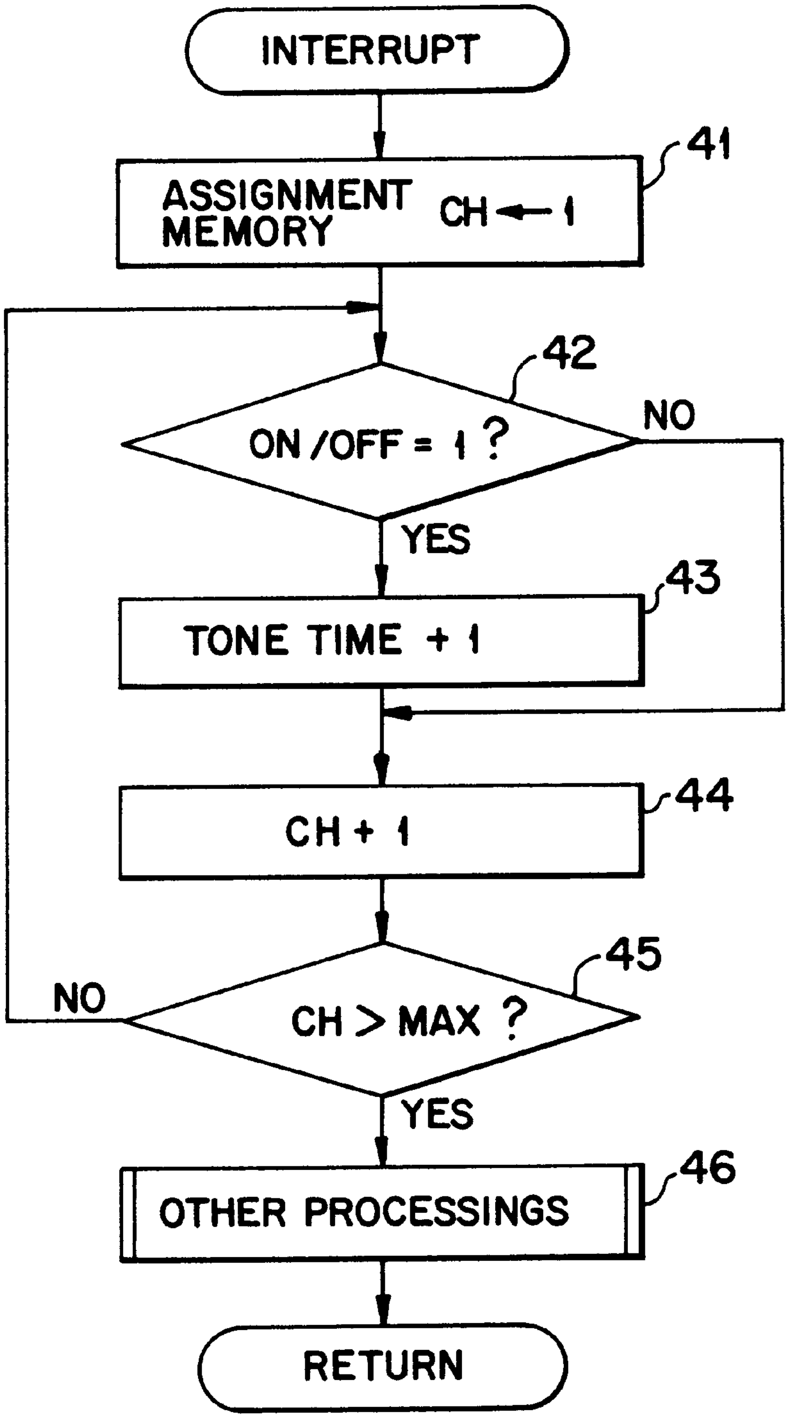
FIG. 11 is a flow chart of an interrupt processing.

FIG. 11 is a flow chart of an interrupt processing executed by the controller 20 every after a predetermined period. In this processing, the tone time data TM increases.

In this processing, among the channel data (steps 41, 44, 45) in the assignment memory 42, the on/off data is "1", tone time data TM of data while the tone is being sounded is increased by "+1" (steps 42, 43), and other periodic processings are executed (step 46). Thus, the elapsed times of sounding of the tones of the channels are counted, stored and are utilized as described above.

12. Alternatingly inverting circuit 66.

FIG. 14 illustrates a second embodiment of the impulse signal generating unit 50. In this embodiment, an alternatingly inverting circuit 66 shown in FIG. 14 is inserted between the impulse signal storage unit 51 and the impulse accumulating unit 54. In this embodiment, two channels are assigned to one tone at the step 12 or 13. A period coefficient f of a first channel is set depending upon a specified pitch, and a period coefficient of a second channel is not set depending upon the specified pitch but is set to be n times (nf) or two times (2f) of the period coefficient f of the specified pitch.

The two channels are assigned at the same timing, and the impulse response signals ISj(t) of the two channels are generated at the same timing and have the same phase. The power data PW is rendered to be (n−1)/n or (½) times from the setpoint value, or the envelope level data EL is rendered to be (n−1)/n times or (½) times from the setpoint value. In other respects, this embodiment is the same as the above-mentioned embodiment.

Figure 16:
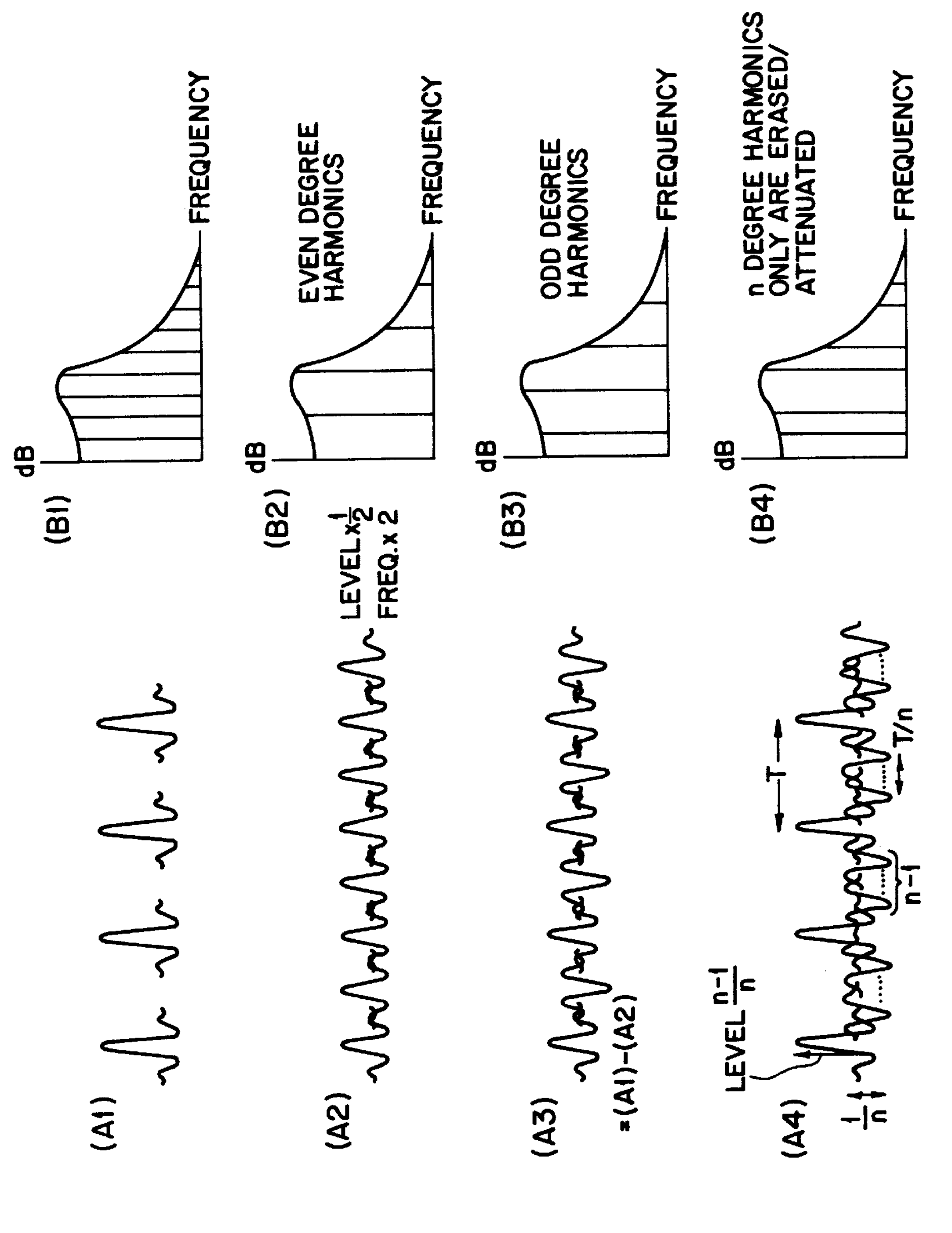
FIG. 16 illustrate waveforms of when every other impulse response signals are inverted with respect to polarities and frequency characteristics thereof.

FIG. 16(A1) shows first impulse response signals ISj(t) read by the first channel. When the first frequency characteristics (spectrum envelope, frequency spectrum component or formant shape) are as shown in FIG. 16(B1), the second impulse response signals ISj(t) of a frequency of n times (two times) read by the second channel become as shown in FIG. 16(A2), and the second frequency characteristics (spectrum envelope, frequency spectrum component or formant shape) become as shown in FIG. 16(B2). Here, n=2. The interval among the frequency components of the second frequency characteristics of a frequency of n=2 times of FIG. 16 (B2) becomes n=2 times of the interval among the frequency components of the first frequency characteristics of FIG. 16(B1), and the second frequency characteristics (FIG. 16(B2)) correspond to even degree harmonics only of the first frequency characteristics (FIG. 16(B1)).

Here, when 1/n or ½ of the second impulse response signal ISj(t) (FIG. 16(A2)) is subtracted from the waveform of the first impulse response signal ISj(t) and the difference is synthesized, then, even degree harmonics only are subtracted, whereby synthesized impulse response signals ISj(t) (FIG. 16(A3)) are generated, and the synthesized frequency characteristics (FIG. 16(B3)) possess odd degree harmonics only. In the waveform of FIG. 16(A3), the impulse response signals ISj(t) of a number of (n−1) (1) (every other signals) are inverted with respect to their polarities among the impulse response signals ISj(t) of a number of 2(2), and are output so that the tone assumes a specified pitch.

It is also possible to accomplish a decimation degree n=3, 4, 5, 6, 7, - - - , by which, as shown in FIG. 16(A4), the signals of a number of (n−1) among the signals of a number n are inverted with respect to their polarities, and are output. The level of the impulse response signal ISj(t) that is not inverted is multiplied by (n−1)/n times, and the level of the impulse response signal ISj(t) that is inverted is multiplied by 1/n times.

The frequency characteristics of the tone signals are such that the n-th, 2n-th, 3n-th, 4n-th, 5n-th, 6n-th, 7n-th, - - - frequency components are erased/attenuated, and the generated tone lacks particular harmonic components only. When, for example, n=2, second harmonic, fourth harmonic, sixth harmonic, eighth harmonic, - - - only are erased/attenuated, and the tone is adapted to that of a closed-pipe instrument. Furthermore, when, for example, n=3, third harmonic, sixth harmonic, ninth harmonic, twelfth harmonic, - - - only are erased/attenuated. Moreover, when, for example, n=7, seventh harmonic, fourteenth harmonic, twenty-first harmonic, twenty-eighth harmonic, - - - only are erased/attenuated. This tone is adapted to that of the piano.

Between the two impulse response signals ISj(t) consecutively read out from the impulse signal storage unit 51, the one signal is sent to the pulse accumulating unit 54, multiplier 55 and tone accumulating unit 57 through selector 63, selector 59 and OR gate group 61, and the other signal passes through selector 63, selector 59, is inverted with respect to polarity through an inverter group 65, multiplied by 2/(n−1) times or ½ times through a multiplier 62, and is sent to the impulse accumulating unit 54, multiplier 55 and tone accumulating unit 57 where it is accumulated (added) and synthesized (synthesis of differences).

The selector 59 is switched by a low-order bit of the channel count data CHNo, the first impulse response signal ISj(t) of the first channel is directly output, the second impulse response signal ISj(t) of the second channel is inverted with respect to polarity and is output being multiplied by 1/(n−1) times or ½ times, so that a tone signal shown in FIG. 16(B3) is generated and output. The frequency characteristics (spectrum envelope, frequency spectrum component or formant shape) of the tone signal are such that integral degree harmonics only of n are erased/attenuated. When the decimation degree is n=2, the tone signal is constituted by odd degree harmonics only. Channel count data CHNo are sent from the timing generating unit 30.

The data of 1/(n−1) and (½) are operated by the controller 20, stored in the register 82, and are fed to the multiplier 62. The decimation degree data n for determining the value 1/(n−1) are stored in the assignment memory 42 for each of the channels, and the degree of harmonics to be decimated from the frequency characteristics is selected and is changed over. The decimation degrtee data n constitute the timbre data (tone number data TN), and are determined by timbre data from the play data generating unit 10.

To the selector 63 is sent a decimation flag as a select signal. Ordinary impulse response signals ISj(t) that do not control the odd degree harmonics are sent to the OR gate group 61 through the selector 63 and are accumulated (added) and synthesized as shown in FIG. 10. The decimation flag is stored in the assignment memory 42 for each of the channels to selectively generate a tone from which particular harmonics are erased/attenuated or a tone of odd degree harmonics, or a tone from which particular harmonics are not erased/attenuated or a tone of even degree harmonics. The decimation flag constitutes a portion of the timbre data (tone number data TN) and is determined by timbre data from the play data generating unit 10.

The decimation flags of the channels are written by the controller 20 onto the decimation RAM 64, and are alternatingly and time-divisionally fed to the selector 63. The channel number data CHNo are fed as access address data to the decimation RAM 64.

When the impulse response signals ISj(t) used for generating the tone of odd degree harmonics are ordinarily read out as shown in FIG. 10, there is generated a tone from which particular harmonics are not erased/attenuated or a tone including even degree harmonics. From an impulse response signal ISj(t), therefore, there can be selectively generated a tone from which particular harmonics have not been erased/attenuated or a tone including even degree harmonics, or a tone from which particular harmonics have been erased/attenuated or a tone without including even degree harmonics.

13. Alternatingly inverting circuit 66.

FIG. 15 illustrates a third embodiment of the impulse signal generating unit 50. In this embodiment, an alternatingly inverting circuit 66 shown in FIG. 15 is inserted between the impulse signal storage unit 51 and the impulse accumulating unit 54. In this embodiment, the period coefficient f stored in the assigned channel memories in the assignment memory 42 is not set depending upon a specified pitch but is set to be n times (nf) or 2f (two times) of the period coefficient f of the specified pitch. The power data PW is further multiplied by (n−1)/n times or (½) times from the setpoint value, or the envelope level data EL is multiplied by (n−1)/n times or (½) times from the setpoint value. In other respects, the circuit is the same as that of the above-mentioned embodiment.

Since the period coefficient is set to be "nf (2f)" of n times (two times), the impulse response signals ISj(t) read per a unit time become n times (two times). Referring to FIG. 16(A3), among the signals of a number of n (2), the signals of a number (n−1) (1) are (every other signals, alternatingly) inverted with respect to their polarities and are output to produce a tone of a specified pitch. In this case, the level of the impulse response signals ISj(t) must be multiplied by (n−1)/n times or ½ times. As described above, therefore, the power data PW is further multiplied by (n−1)/n times or ½ times from the setpoint value, or the envelope level data EL is further multiplied by (n−1)/n times or ½ times from the setpoint value.

One of the impulse response signals ISj(t) alternatingly read out from the impulse signal storage unit 51 by the two low-order address data R1 and R2, is sent to the impulse accumulating unit 54 through selector 63, selector 59 and OR gate group 61, and the other one is inverted with respect to polarity by an inverter group 65 passing through selector 63 and selector 59, and is sent to the impulse accumulating unit 54 and is accumulated (added) and synthesized.

The selector 59 is switched by 1/n frequency-divided data from a programmable 1/n frequency-division counter 81. One impulse response signal ISj(t) is directly output out of impulse response signals ISj(t) of the number of n read out by the low-order read address data R1 and R2, and the other impulse response signals ISj(t) of the number of (n−1) are inverted with respect to their polarities and are output thereby to generate a tone signal shown in FIG. 16(A3). The frequency characteristics (spectrum envelope, frequency spectrum component or formant shape) of the tone signal are such that integral degree harmonics of n only are erased/attenuated as shown in FIG. 16(B3). When n=2, the tone signal is constituted by odd degree harmonics only. The selector 63, decimation RAM 64 and decimation flag are the same as those of the above-mentioned second embodiment.

The decimation degree data "n" is set to the programmable 1/n frequency-division counter 81 by the controller 20 and is increased by a clock signal 2φR1 which is divided with respect to its frequency into 1/n. When the clock signals 2φR1 are input in a number of n, the 1/n frequency-division data assumes the high level. Then as the clock signal 2ϕR1 is input, the low level is assumed. Thereafter, as the clock signals 2ϕR1 are input in the number of n, the 1/n frequency-division data assumes the high level again.

The frequency of the clock signals 2ϕR1 is twice as high as that of the clock signals ϕR1. The programmable 1/n frequency-division counter 81, detects the generation of an impulse response signal ISj(t) among those signals of the number of n which are not inverted, and detects the generation of impulse response signals ISj(t) of a number of (n−1) which are inverted. The programmable 1/n frequency-division counter 81 is reset by a reset trigger signal after every elapse of all channel times or by a reset trigger signal after every elapse of a channel time.

Figure 17:
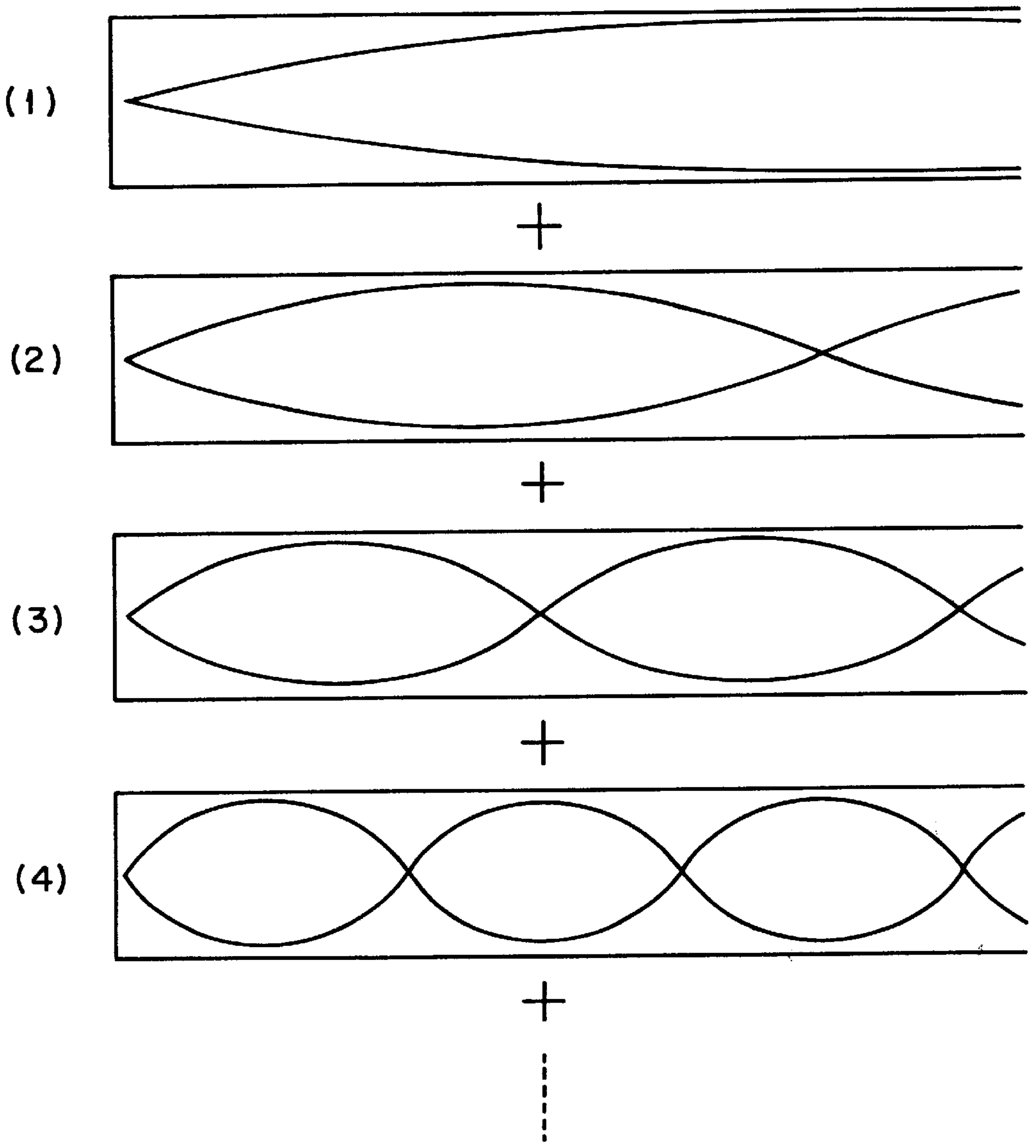
FIG. 17 illustrates the principle of resonance of a wind instrument.

The tone of odd degree harmonics from which integral degree harmonics of n only are erased/attenuated is best suited as a tone signal of a wind instrument as shown in FIG. 17. The tube is closed at its one end and is opened at the other end. Therefore, odd degree harmonica easily resonate compared to even degree harmonics, and most of the frequency components of the frequency characteristics are odd number times (1 time, 3 times, 5 times, 7 times, - - - ) with respect to the fundamental wave.

14. Variations in the odd degree harmonic constitution.

FIG. 16 shows variations in the odd degree harmonic constitution from which integral degree harmonics of n only are erased/attenuated. As the level of the first impulse response signal ISj(t) (FIG. 16A1) becomes great relative to the level of the second impulse response signal ISj(t) (FIG. 16A2) of (n−1)/n (½), the waveform of the tone becomes the synthesis of differences as shown in FIG. 18(A1), and the frequency characteristics include, to some extent, even degree harmonics which are integral degree harmonics of n as shown in FIG. 18(B1).

Figure 18:
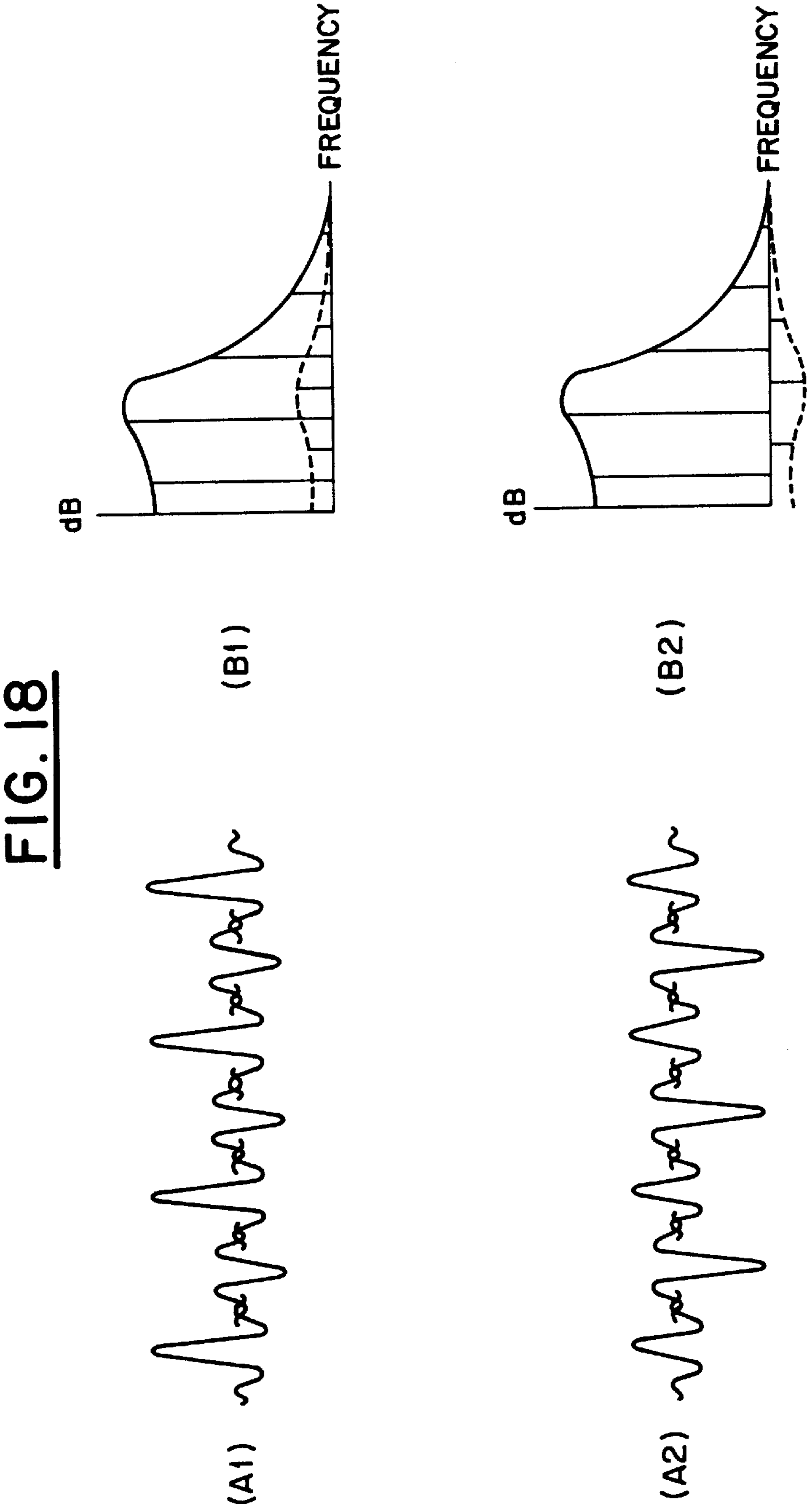
FIG. 18 illustrates waveforms of when every other impulse response signals are inverted with respect to polarities and are changed with respect to levels, and frequency characteristics thereof.

As the level of the first impulse response signal ISj(t) (FIG. 16A1) becomes small relative to the level of the second impulse response signal ISj(t) of 1/n (½), furthermore, the waveform of the tone becomes the synthesis of differences as shown in FIG. 18(A2), and the frequency characteristics become such that even degree harmonics which are integral degree harmonics of n assume negative values as shown in FIG. 18(B1). The tone waveform in which part of the frequency components assumes a negative value, does not exist in the natural world. However, the waveform of this tone can be generated.

In this case, a multiplier or a shifter is provided at the output terminal of the selector 59, so that the level of one side becomes great or small relative to the other side. Owing to the multiplier or the shifter, the level of the above-mentioned impulse response signal ISj(t) is multiplied by (n−1)/2 (½) times or the envelope level data is multiplied by (n−1)/n (½) times.

15. Group of spectrum period tables 43.

FIG. 19 illustrates a group of spectrum period tables 43 in the program/data storage unit 40. From the group of spectrum period tables 43 are read out the corresponding spectrum coefficient r and the period coefficient f based upon the pitch data (key number data KN or frequency number data FN). As described earlier, the spectrum coefficient r determines the reading rate S of the impulse response signals ISj(t) from the inverter signal storage unit 51, and the period coefficient f determines the repeating period T of the impulse response signals ISj(t).

The period coefficient f varies in direct proportion to the pitch data. The value of pitch data varies depending upon the frequencies of pitches. The period coefficient f varies in strict proportion, or varies slightly out of direct proportion due to S-curve tuning.

The spectrum coefficient r varies in direct proportion or not in direct proportion to the pitch data, and varies in the same manner as, or differently from, the period coefficient f. The characteristics r1 do not change relative to the pitch data but remain constant. The characteristics r2 vary in direct proportion to the pitch data. The characteristics r3 vary in direct proportion to the pitch data but more mildly than a change in the period coefficient f. The characteristics vary in reverse (inverse) proportion to the pitch data. The characteristics r5 vary stepwisely relative to the pitch data, and have a portion that varies suddenly and a portion that changes mildly. The characteristics r6 vary cumulatively relative to the pitch data. The characteristics t7 vary exponentially relative to the pitch data.

Tables are constituted by the characteristics of the period coefficient f and by the characteristics r1 to r7 of the spectrum coefficient relative to the pitch data. These tables constitute a group of spectrum period tables 43. A table of characteristics r1 of predetermined values may be omitted, and the pitch data may be operated to find the spectrum coefficient r.

The period coefficient f read out from the table is written into a corresponding channel memory area in the assignment memory 42 at the step 13. Furthermore, the spectrum coefficient r that is read out is averaged with other spectrum coefficients r found from the timbre data (tone number data TN), and is operated and synthesized, and is written into a corresponding channel memory area in the assignment memory 42 at the step 13.

16. rf Section tables 44.

Figure 20:
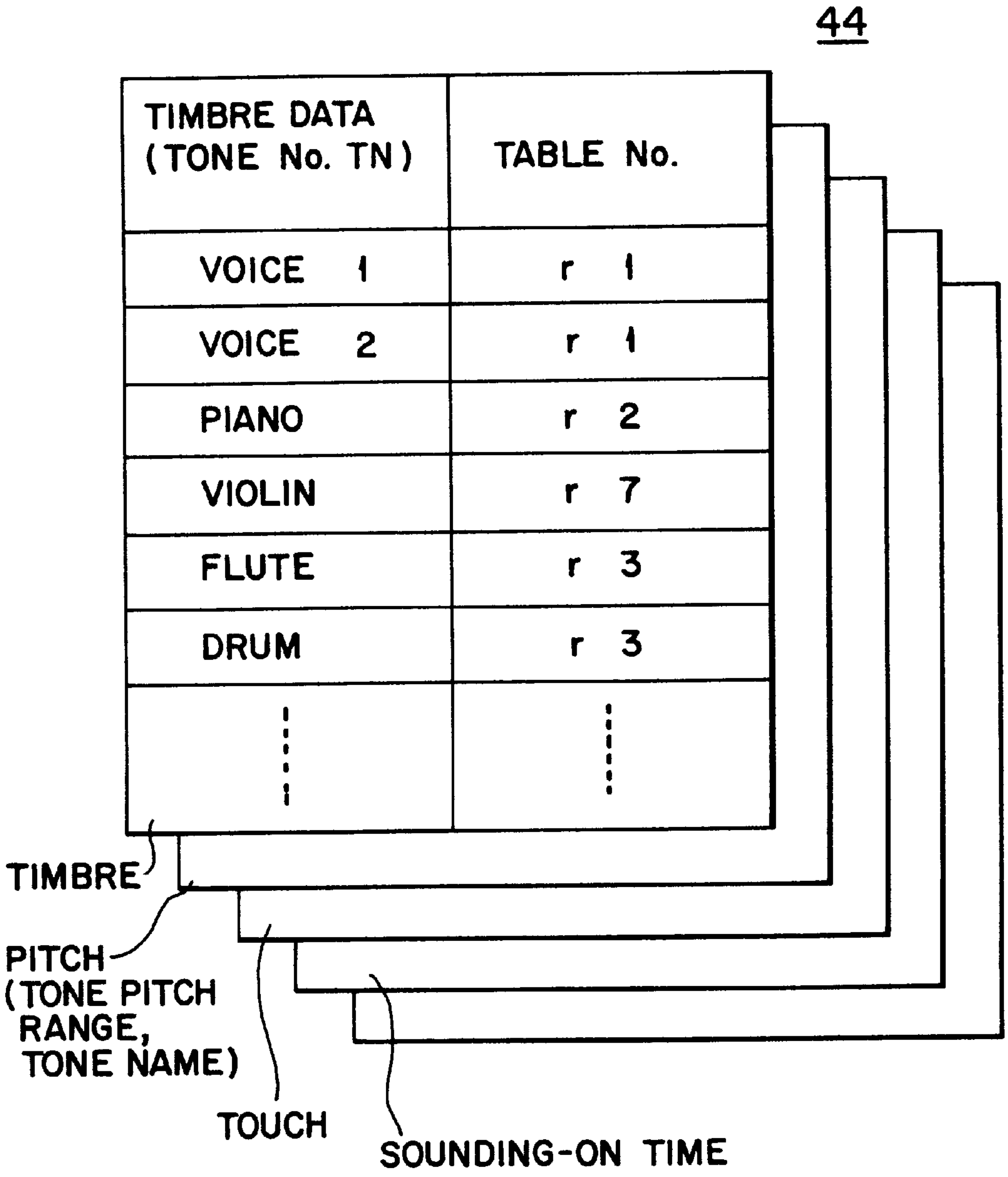
FIG. 20 illustrates an rf selection table 44 in the program/data storage unit 40.

FIG. 20 illustrates rf selection tables 44 in the program/data storage unit 40. A table of the above-mentioned characteristics r1 to 47 corresponding to the musical factor data is selected from the rf selection tables 44. The musical factor data are pitch data, tone pitch range (octave) data, tone name data, timbre data (timbre-determining factor), touch data (rate/strength of sounding start instruction operation), sounding start time data, sound number data, resonance degree data, effect data, rhythm data, sound image (stereo) data, quantize data, modulation data, tempo data, volume data or envelope data. These data are generated from the play data generating unit 10 to select a corresponding table.

In particular, the timbre data (tone number data TN) are divided into two groups. For the timbre data of a sound having no relation to the pitch, the table of the above-mentioned predetermined characteristics r1 is selected to generate a tone signal of a fixed formant which does not move irrespective of a change in the pitch. The timbre data of the sound having no relation to the pitch are, for example, those of voice, sound of an instrument close to voice, sound produced by a contained part of an instrument, sound of a percussion without nature related to a change in the pitch or sound of a percussion closes to voice. The container part of the instrument may be, for example, the sound board or the bridge of the piano (keyed instrument), the body or the bridge of a stringed instrument, the pipe or the reed of a wind instrument, the body, membrane, bell or stick of a percussion, etc.

For the timbre data of a sound related to the pitch, a table of changing characteristics other than the above-mentioned characteristics r1 is selected to generate a tone signal of a moving formant which moves depending upon a change in the pitch. The timbre data of the sound related to the pitch are those of, for example, sound of a struck string of a keyed instrument, sound of a rubbed string of a stringed instrument, resonance length (pipe length) of a wind (reed) instrument, sound of a percussion of the form of a pipe or a mouth of which the sound or pitch changes.

17. Fixed formant and moving formant.

FIG. 21 illustrates examples of a fixed formant, and FIG. 22 illustrates examples of a moving formant. IN the fixed formant of FIG. 21, the spectrum coefficient r remains constant, the reading rate S of the impulse response signals ISj(t) remains unchanged, the frequency coefficient f changes depending upon the pitch, and the repeating period T of the impulse response signals ISj(t) changes.

Then, the shape of formant of frequency characteristics (spectrum envelope, frequency spectrum component) of the generated tone signal does not change and forms a fixed formant, and the distance among the frequency components changes to comply with the pitch. Such a control operation is executed by the above-mentioned human voice, howling of an animal, sound of an instrument close to voice or howling, sound of a container part of an instrument, or sound of a percussion close to voice or howling of which the pitch does not change.

In the moving formant of FIG. 22, the spectrum coefficient r changes, the reading rate S of the impulse response signals ISj(t) changes, the period coefficient f changes depending upon the pitch, and the repeating period T of the impulse response signals ISj(t) changes.

Then, the frequency characteristics (spectrum envelop, frequency spectrum component) of the generated tone signal shift on the frequency axis, the shape of the formant changes to form a moving formant, and the distance among the frequency components changes to comply with the pitch. Such a control operation is executed by the sound of the above-mentioned keyed instrument, stringed instrument, wind (reed) instrument or a percussion of which the pitch changes.

18. Group of end cut-off tables 45.

Figure 23:
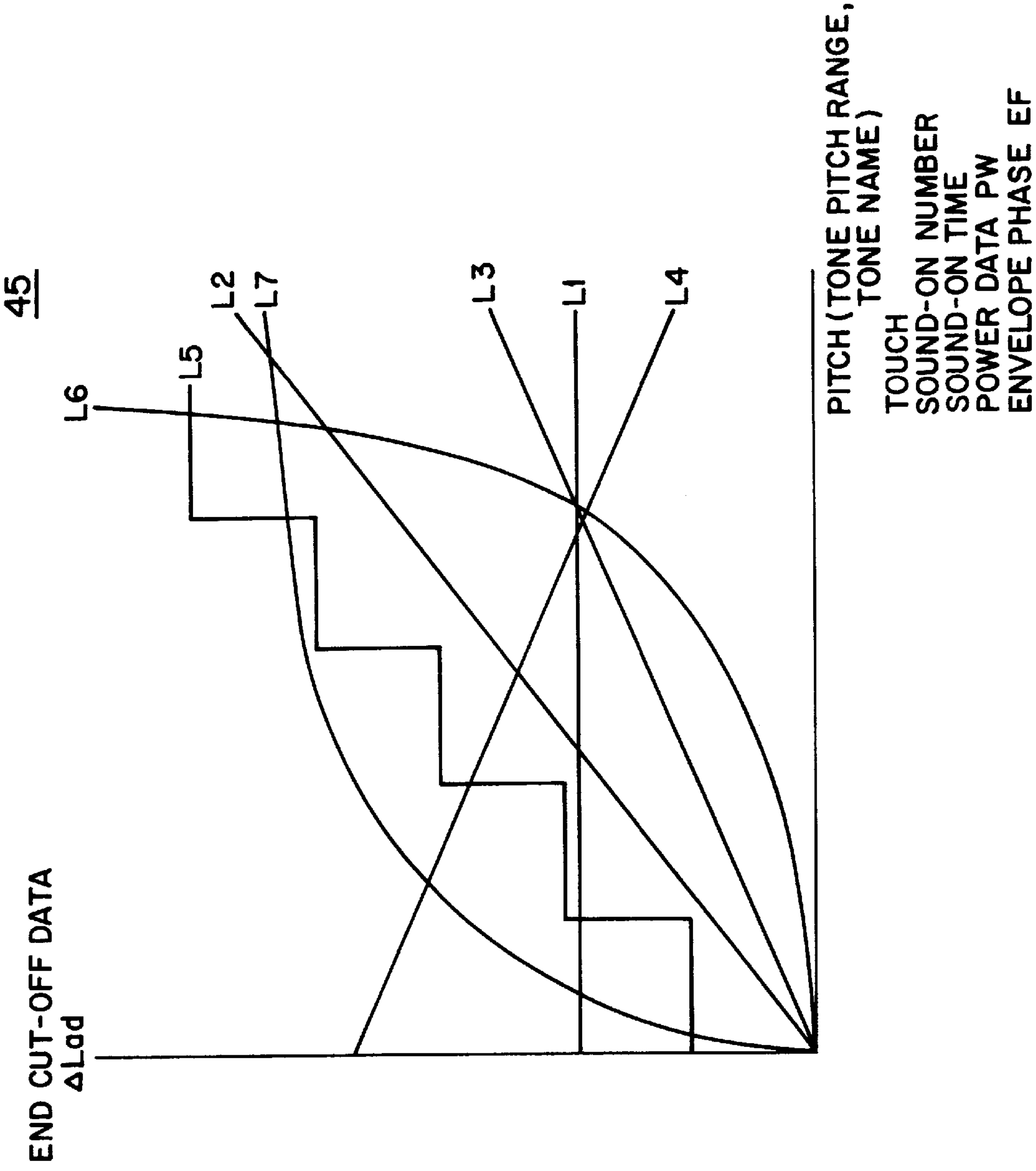
FIG. 23 illustrates a group of end cut-off tables 45 in the program/data storage unit 40.

FIG. 23 illustrates a group of end cut-off tables 45 in the program/data storage unit 40. From the group of end cut-off tables 45 are read out the corresponding end cut-off data Δ Lad based on the musical factor data, such as pitch data (key number data KN or frequency number data FN, tone pitch range data, tone name data), timbre data, touch data, sounding start number data, resonance degree data, sounding start time data or power data PW. The end cut-off data Δ Lad represent the cut-off amount at both ends of the impulse response signal ISj(t) as described above.

The end cut-off data Δ Lad vary in direct proportion to, or do not vary in direct proportion to, the musical factor data. The characteristics L1 do not change relative to the musical factor data but remain constant. The characteristics L2 change in direct proportion to the musical factor data. The characteristics L3 change in direct proportion to the musical factor data but mildly compared to the change in the characteristics L2. The characteristics L4 change in reverse (inverse) proportion to the musical factor data. The characteristics L5 change stepwisely relative to the musical factor data and have a portion that changes quickly and a portion that changes mildly. The characteristics L6 cumulatively change relative to the musical factor data. The characteristics L7 exponentially change relative to the musical factor data.

The stepwise characteristics L5 are used when the musical factor data have the envelope phase EF. For example, the end cut-off data Δ lad include first attack, second attack, decay, sustain and release, successively, from the lower side.

Figure 24:
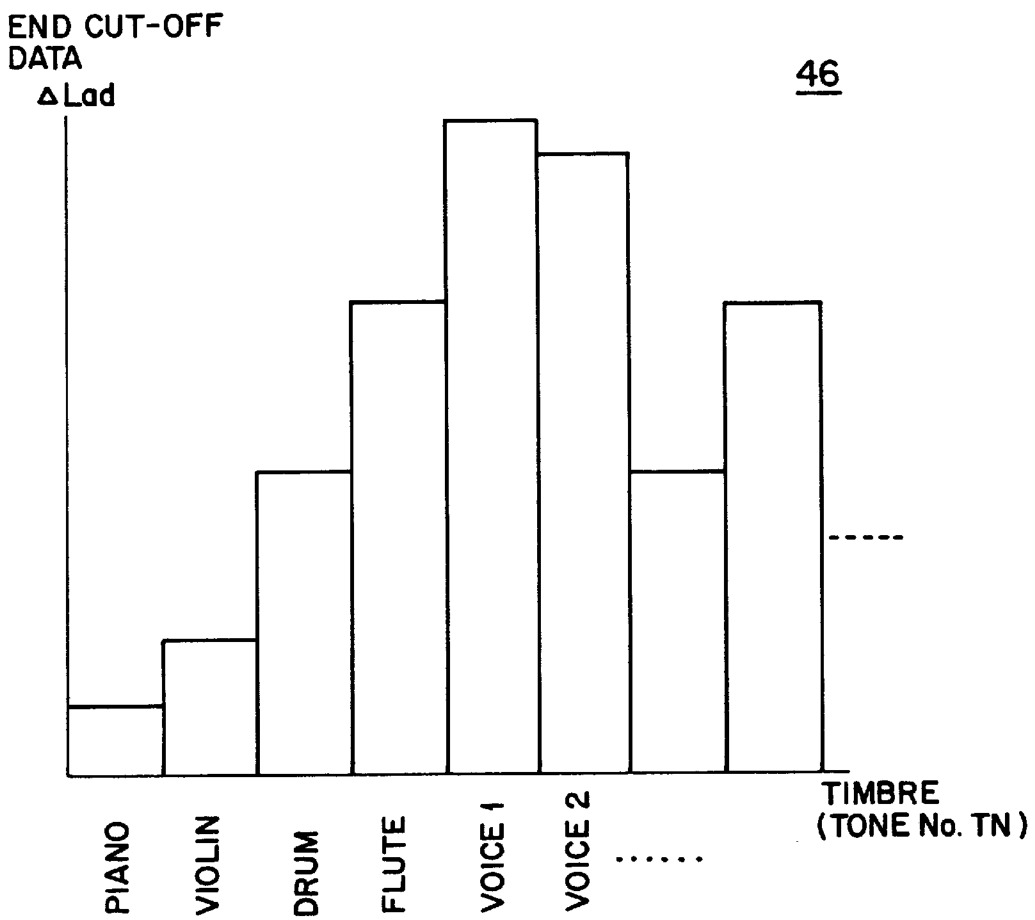
FIG. 24 illustrates a group of end cut-off tables 46 in the program/data storage unit 40.

FIG. 24 illustrates another end cut-off table 46 in the program/data storage unit 40. From the end cut-off table 46 are read out the corresponding end cut-off data Δ Lad based upon the timbre data. In the end cut-off table 46, the value of end cut-off data Δ Lad increases in order of piano, violin, drum, flute, other instruments, voice 1, voice 2, - - - .

Thus, the end cut-off data Δ Lad becomes small for a sound of an instrument which changes vigorously. Even in the same tone, the end cut-off data Δ Lad becomes small for a vigorously changing attack portion or as the sounding start time becomes short. When a plurality of tones of different timbres are simultaneously generated, the end cut-off data Δ Lad becomes small for a major sound that is heard well by ears. Therefore, the end cut-off data Δ Lad of the end cut-off table 46 are determined based upon the degree of importance.

The characteristics L1 to L7 of the end cut-off data Δ Lad corresponding to these musical factors are stored in their respective tables which constitute the above-mentioned group of end cut-off tables 45. The table of the predetermined characteristics L1 may be omitted, and the values of musical factor data may be operated to find the end cut-off data Δ Lad.

The group of end cut-off tables 45 and the end cut-off data Δ Lad of the end cut-off table 46 are found by the above-mentioned group of operation formulas and are stored. Therefore, the musical factor data for reading the end cut-off data Δ Lad can be substituted by the period coefficient f and the spectrum coefficient r or by the address length Lad=(Ea−Sa).

The end cut-off data Δ Lad found by the above-mentioned operation formula and the group of end cut-off tables 45 or the end cut-off data Δ Lad read from the end cut-off table 46 may be averaged (synthesized) or operated (synthesized) or either one of them may be selected. The end cut-off data Δ Lad thus read out from the table are written into the corresponding channel memory area in the assignment memory 42.

19. End cut-off circuit 67.

FIG. 25 illustrates a fourth embodiment of the impulse signal generating unit 50. In this embodiment, an end cut-off circuit 67 shown in FIG. 25 is inserted between the impulse signal storage unit 51 and the selector 63.

The waveform head address data Sa and the waveform end address data Ea of each of the channels are written into a parameter RAM 501 of the impulse signal reading unit 53. In this case, the following correction is executed, and the flow chart of the sounding start processing of FIG. 8 is executed.

$$Sa \leftarrow Sa + \Delta\ Lad$$

$$Ea \leftarrow Ea - \Delta\ Lad$$

Thus, the length of end cut-off data Δ Lad is cut off from both ends of the impulse response signal ISj(t) read out from the impulse signal storage unit 51. The above-mentioned low-order read address data R1 and R2 are increased from the corrected waveform head address data Sa up to the waveform end address data Ea.

The low-order read address data R1 or R2 is time-divisionally output from the impulse signal reading unit 53. From the read address data R1 (R2) is subtracted the above-mentioned correction value (Sa+Δ Lad) through an adder 68. The read address data R1(R2) is then fed to a window function memory 71 through a selector 69, and a window function WF is read out therefrom. The window function value WF is sent to a multiplier 72 through a selector 76 and is multiplied onto the impulse response signal ISj(t) to make smooth the cut-off front ends of the impulse response signals ISj(t).

The correction value (SA+Δ Lad) is subtracted from the read address data R1(R2) through the adder 68 and, hence, the reading starts with the head address of the window function memory 71. As the address data R1(R2)−(Sa+Δ Lad) from the adder 68 exceeds the window width data Wad, a detection signal is sent from the comparator 77 to the selector 76, and the data "1" is sent to the multiplier 72.

The read address data R1(R2) is further sent to the comparator 73. A value obtained by further subtracting the window width data Wad from the correction value (Ea−Δ Lad), is sent to the comparator 73 from the adder 74. As the read address data R1(R2) exceeds the value (Ea−Δ Lad−Wad), a detection signal is sent from the comparator 73 to the selector 69.

Then, an address data R1(R2)−(Sa+Δ Lad) from the adder 68 is inverted through a group of inverters 70, and is sent to the window function memory 71. Accordingly, the window function value WF is read out in a reverse direction from the reading end of the impulse response signal ISj(t) in front of the window width data Wad, and the cut-off rear ends of the impulse response signals ISj(t) become smooth. Thus, the front and read cut-off ends of the impulse response signals ISj(t) are smoothly coupled together.

Plural kinds of window function values WF are stored in the window function memory 71, and any one of them is selected by the window selection data WS. The kinds of the window functions are shown in FIGS. 26(B1), 26(B2), 26(B3) and 26(B4). The window function value WF varies from 0 time to 1 time, or from ½ times to 1 time; i.e., the window function value WF is a weighing data that varies from a decreased number of times to an equal number of time.

Window selection data WS, waveform head address data Sa, waveform end address data Ea, end cut-off data Δ Lad and window width data Wad in the channel areas of the assignment memory 42 are written and copied onto the channel areas of the terminal RAM 75 by the controller.

The waveform head address data Sa and the end cut-off data Δ Lad are inverted with respect to their polarities through the groups of inverters 78 and 79, and are sent to the adder 68. The end cut-off data Δ Lad and the window width data Wad are inverted with respect to their polarities through the groups of inverters 79 and 80, and are sent to the adder 74. The waveform end address data Ea are directly sent to the adder 74. The window width data Wad are directly sent to the comparator 77. The window selection data WS are directly sent to the window function memory 71. The channel number data CHNo from the timing generator 30 are fed as read/write address data to the terminal RAM 75.

20. End cut-off state.

FIG. 26 illustrates an end cut-off state of an impulse response signal ISj(t). Reading is not executed by the end cut-off data Δ Lad at both ends of the impulse response signal ISj(t) (A1) stored in the impulse signal storage unit 51. Then, an impulse response signal ISj(t) shown in FIG. 26(A2) is read out in practice.

Both ends of the thus read impulse response signal ISj(t) are discontinuous. Window function values WF shown in FIGS. 26(B1), 26(B2), 26(B3) and 26(B4) are selected, and are operated and synthesized for both ends. Thus, the ends of the impulse response signals ISj(t) become smooth.

The window function value WF of FIG. 26(B1) changes from "0" to "1", the window function value WF of FIG. 26(B2) changes from "½" to "1", the window function value WF of FIG. 26(B3) linearly changes from "0" to "1", and the window function value WF of FIG. 26(B4) changes from "0" to "1" at one time.

When the front end of the cut-off impulse response signal ISj(t) rises from "0" toward a maximal value or a minimal value, the window function value WF of FIG. 26(B1) is selected. When the front end of the cut-off impulse response signal ISj(t) breaks from a maximum value or a minimal value toward "0", the window function value WF of FIG. 26(B2) is selected. The "rise" and "break" are reversed at the rear end.

The "rise" and "break" are detected in a manner as described below. When a level value of an address (Sa +Δ Lad) or (Ea−Δ Lad) at an end of the impulse response signal ISj(t) is smaller than a level value of a neighboring address (Sa+Δ Lad+1) or (Ea−Δ Lad−1), it is the "rise". When this is large, then it is the "break". The detection is executed by the controller 20, and the window selection data WS is determined.

Therefore, when the end of the impulse response signal ISj(t) "rises" as shown in FIG. 26(C1), the end is corrected to "0" as shown in FIG. 26(D1), and there exists no discontinuity. When the end of the impulse response signal ISj(t) "breaks" as shown in FIG. 26(C2), the inclination of the end is corrected to be nearly "0" as shown in FIG. 26(D2) and the end is smoothly connected to the end of the neighboring signal.

The window function value WF has a long portion of value "1" at the center thereof. When the portion of value "1" becomes short, the frequency characteristics (spectrum envelope, frequency spectrum component or formant form) of a generated tone signal undergo a change. It is therefore better that the portion of value "1" is long.

The window function value WF of FIG. 26(B4) is not weighed and is of a rectangular shape. The cut-off end of the impulse response signal ISj(t) is not weighed and corrected. Therefore, noise may generate. However, no noise generates if the end has a level "0" or has a maximal value or a minimal value of inclination "0". In this case, the end cut-off circuit 67 of FIG. 25 is omitted. The window functions are not limited to those of FIGS. 26(B1), 26(B2), 26(B3) and 26(B4). For instance, the window function may change from "2" to "1" or from "1.5" to "1", or may exceed "1", or may be a trigonometric window function, a trapezoidal window function, a humming window function or a hanning window function.

Figure 27:
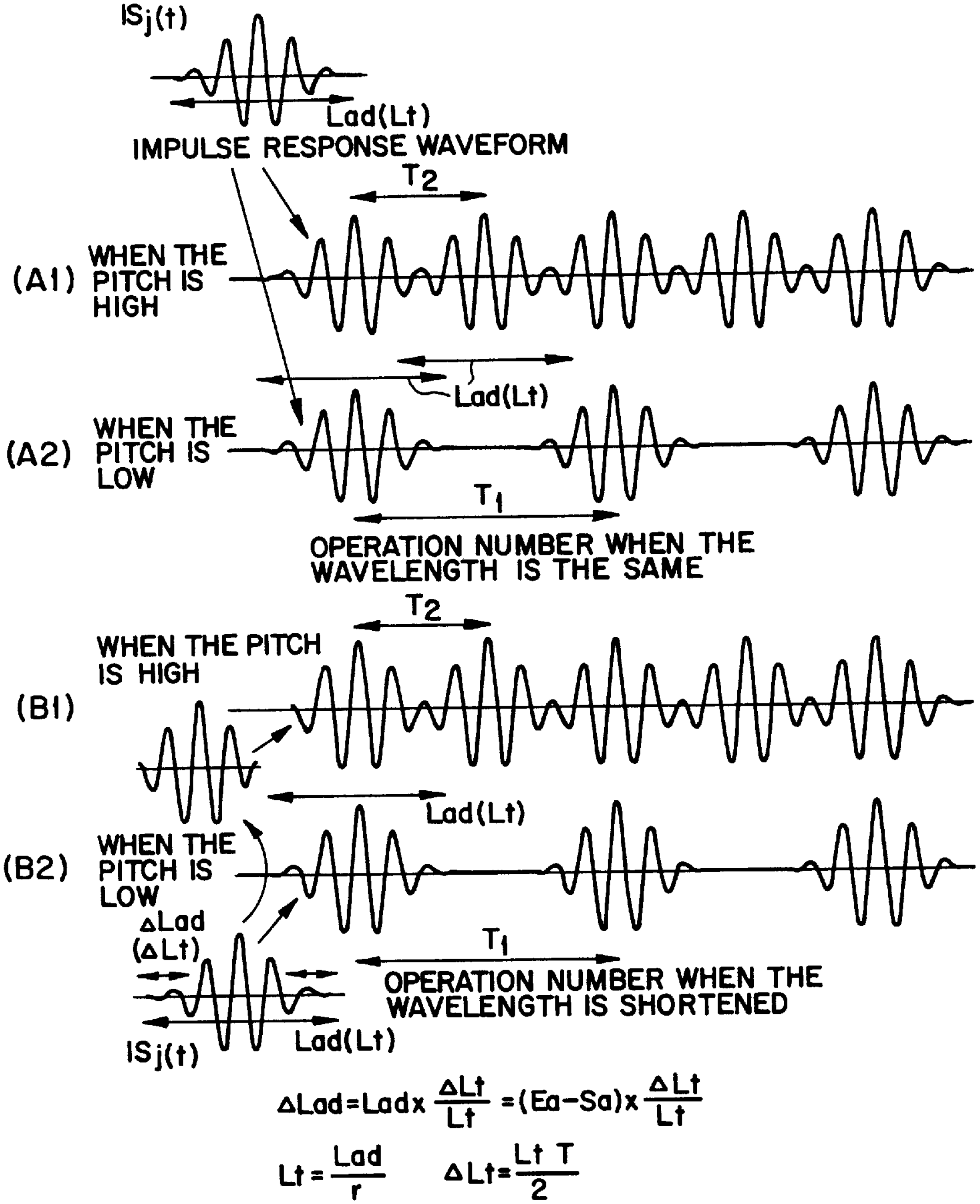
FIG. 27 illustrates a state where the impulse response signals ISj(t) are connected together.

FIG. 27 illustrates the connection of impulse response signals ISj(t). When the impulse response signals ISj(t) are repetitively read out without their both ends being cut off, the ends of the impulse response signals ISj(t) are not superposed as shown in FIG. 27(A) provided the pitch is low and the repeating period T is long. When the pitch is high and the repeating period T is shown, however, the ends of the impulse response signals ISj(t) are superposed, and the operation amount and the processing amount increase for the superposed portions.

Similarly, when the impulse response signals ISj(t) are repetitively read out without their both ends being cut off, the ends of the impulse response signals ISj(t) are not superposed as shown in FIG. 27(B2) provided the pitch is low and the repeating period T is long. When the impulse response signals ISj(t) are repetitively read out with their both ends being cut off, the ends of the impulse response signals ISj(t) are not superposed despite that the pitch is high and the repeating period T is short, and the operation amount and the processing amount descrease for the superposed portions.

Thus, as the length of the impulse response signals ISj(t) is shortened, the frequency characteristics (spectrum envelope, frequency spectrum component or formant shape) of the generated tone signal become smooth. Accordingly, the timbre of the tone changes smoothly.

21. Impulse synthesizing circuit 83

Figure 28:
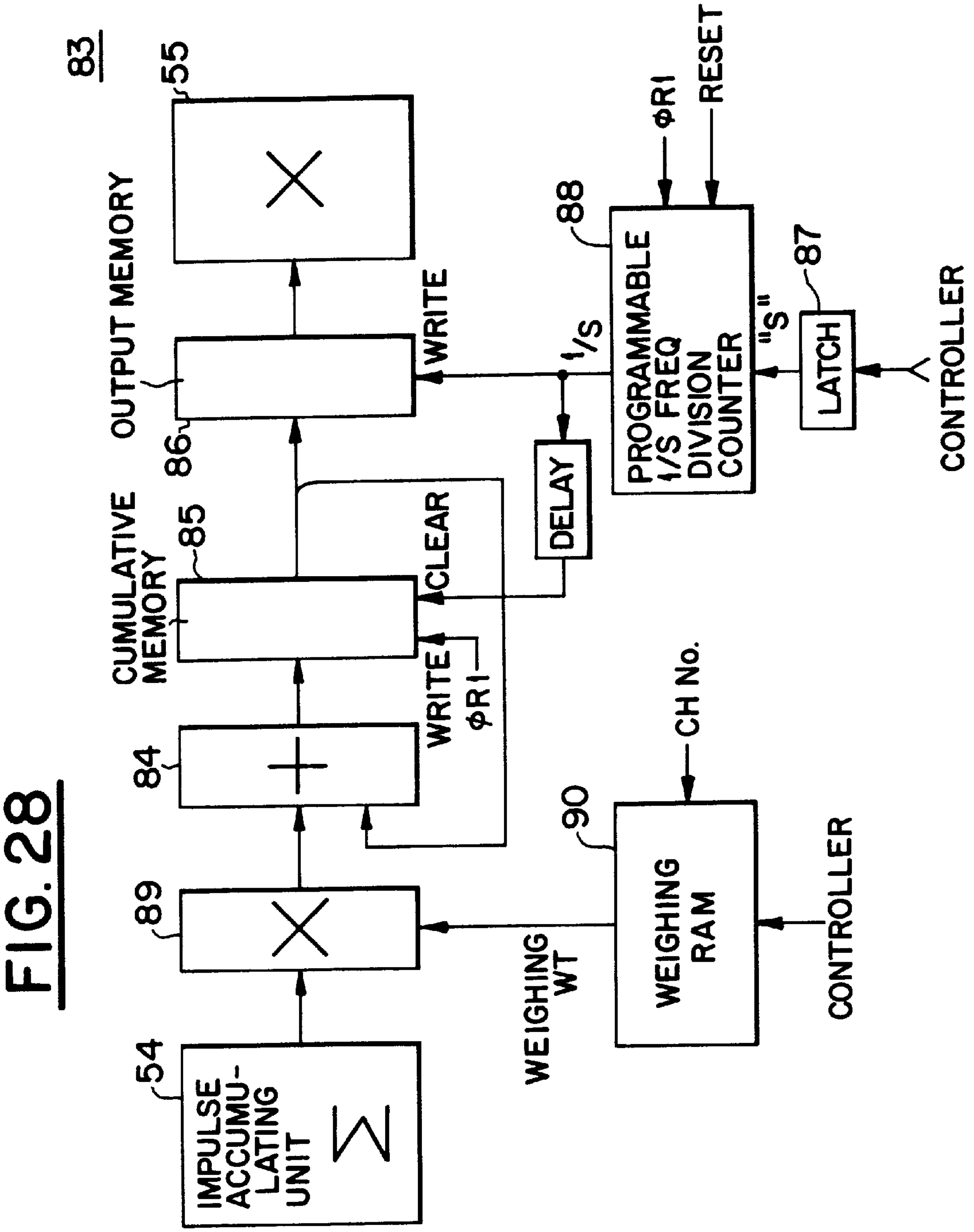
FIG. 28 illustrates an impulse synthesizing circuit 83.

FIG. 28 illustrates the impulse synthesizing circuit 83. The impulse synthesizing circuit 83 is provided between the impulse accumulating unit 54 and the multiplier 55. The impulse response signals ISj(t) of the channels sent from the impulse accumulating unit 54 are multiplied by weighing data WT for each of the channels through a multiplier 89, accumulated as the accumulated impulse response signals AISj(t) from the cumulative memory 85 through an adder 84, and are written into the cumulative memory 85. Thus, the impulse response signals ISj(t) are successively accumulated. The clock signal φR1 is fed as a write signal to the cumulative memory 85, and the impulse response signals ISj(t) are accumulated for each of the channel timings.

The accumulated impulse response signals AISj(t) are written into an output memory 86, sent to the multiplier 55, and are multiplied by the envelope data EN and the power data PW. The impulse response signals ISj(t) are not accumulated every time after all of the channels but are accumulated for each of the impulse response signals ISj(t) that are synthesized.

The weighing data WT of each channel is written by the controller 20 into a weighing RAM 90. The channel number data CHNo are fed as access address data to the weighing RAM 90. The weighing data WT of the channels are sent to the multiplier 89.

The synthesized channel number data s are written into a latch 87 by the controller 20. The synthesized channel number data s represent the number of the impulse response signals ISj(t) synthesized as a tone, i.e., represent the channel number assigned to a tone. The value of the synthesized channel number data s is determined depending on the musical factor data.

The synthesized channel number data s are sent to a programmable 1/s frequency division counter 88 where the frequency of the clock signals φR1 is divided into 1/s. The 1/s frequency division data are sent as a write signal to the output memory 86, and are slightly delayed and are sent as a clear signal to the cumulative memory 85, so that the impulse response signals ISj(t) are accumulated by an amount of s channels each time and are output. The programmable ½ frequency division counter 88 is reset by a reset trigger signal after every lapse of the whole channel time.

At the step 12 or 13 of FIG. 8, the tone data are assigned to the channels of a number of s at the same timing and, hence, the impulse response signals ISj(t) of the number of s are synthesized as a tone. Therefore, the impulse response signals ISj(t) of the number of s are generated at the same timing and have the same phase. Since the period coefficients f are the same as described above, the impulse response signals ISj(t) have the same phase.

The impulse response signals ISj(t) are multiplied by the weighing data WT through the multiplier 89 and, hence, the impulse response signals ISj(t) synthesized as a tone are changed for their synthesizing ratio (mixing ratio) depending upon the weighing data WT. Upon changing the weighing data WT, the frequency characteristics of the synthesized tone signal change despite the combination for synthesizing the impulse response signals ISj(t) is the same.

22. State of synthesis of a plurality of impulse response signals

Figure 29:
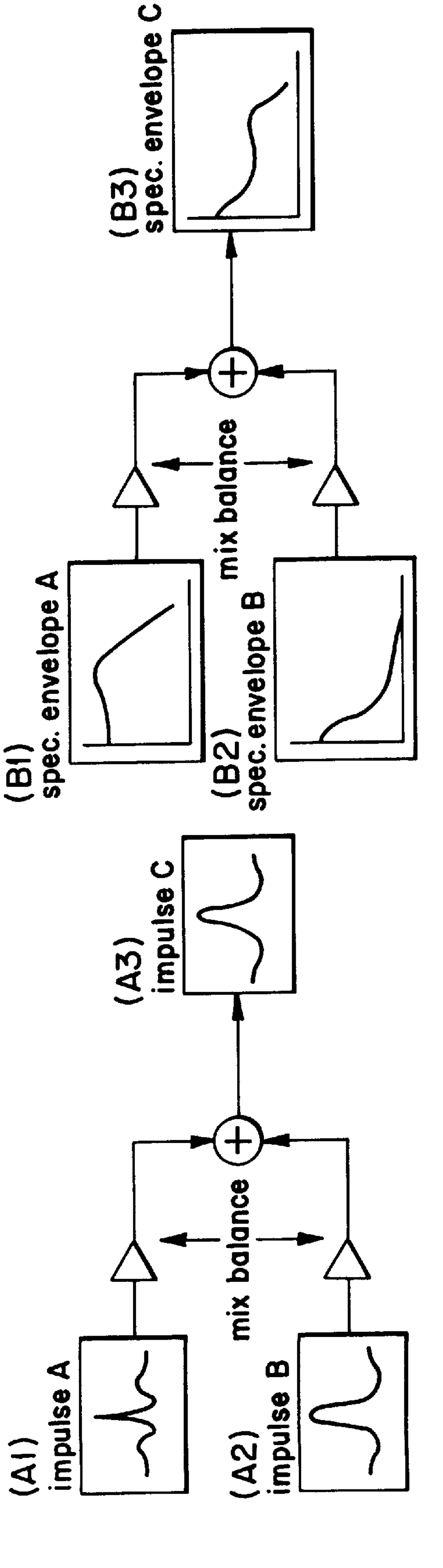
FIG. 29 illustrates a state where a plurality of impulse response signals ISj(t) are synthesized.

FIG. 29 illustrates a state where a plurality of impulse response signals ISj(t) are synthesized. The frequency characteristics (spectrum envelope, frequency spectrum component or formant shape) of an impulse response signal ISj(t) shown in FIG. 29(A1) contain much harmonic components as shown in FIG. 29(B1), and the frequency characteristics (spectrum envelope, frequency spectrum component or formant shape) of an impulse response signal ISj(t) shown in FIG. 29(A2) contain less harmonic components as shown in FIG. 29(B2).

When these two impulse response signals ISj(t) (A1) and ISj(t) (A2) are accumulated (added) and synthesized, the resulting accumulated impulse response signal AISj(t) becomes as shown in FIG. 29(A3) having a synthesized waveform which is intermediate between those of the two signals. Namely, there is generated an impulse response signal ISj(t) of a waveform which is quite different, and its frequency characteristics (spectrum envelope, frequency spectrum component or formant shape) are averaged for their harmonic components and assume an intermediate state as shown in FIG. 29(B3).

Due to such a synthesis, there are generated synthetic impulse response signals ISj(T) having frequency characteristics averaged from the frequency characteristics of the impulse response signals ISj(t) of before being synthesized. The conventional ordinary addition or synthesis of tone waveforms, is a cumulative synthesis. The addition or synthesis of the impulse response signals is an intermediate and average synthesis.

The average weighing or average state is changed by the weighing data WT. The shape of the synthesized impulse response signal ISj(t) is different from the shape of the impulse response signal ISj(t) of before being synthesized. Besides, the frequency characteristics (spectrum envelope, frequency spectrum component or formant shape) of the synthesized impulse response signals ISj(t) are different from the frequency characteristics (spectrum envelope, frequency spectrum component or formant shape) of the impulse response signals ISj(t) of before being synthesized.

Through the above-mentioned synthesis, impulse response signals ISj(t) having intermediate frequency characteristics are synthesized by simply storing representative impulse response signals ISj(t). For example, a representative impulse response signal ISj(t) is stored for a plurality of tone names, for a tone pitch range, for a group of timbres (keyboard system, struck string system, rubbed string system, woodwind system, brass system, percussion system, voice system, etc.), for a group of touches, for a group of sounding start times, for sounding start numbers, for a group of resonance degrees, for a field of plays (melody, chord, base, accompaniment and rhythm) and for envelope (sustain type and decay type). A plurality of representative impulse response signals ISj(t) are weighed and synthesized to generate impulse response signals ISj(t) in other musical factors.

When, for example, the impulse response signal ISj(t) of a low tone pitch range and the impulse response signal ISj(t) of a high tone pitch range are weighed and synthesized, there is generated an impulse response signal ISj(t) of an intermediate tone pitch range. Here, if the weighing of synthesis is changed, there is generated an impulse response signal ISj(t) of a more fine tone pitch range.

Moreover, if, for example, the impulse response signal ISj(t) of the brass wind system and the impulse response signal ISj(t) of the woodwind system are weighed and synthesized together, there is generated an intermediate impulse response signal ISj(t). Here, when the weighing of synthesis is changed, there is generated an impulse response signal ISj(t) of a more fine tone pitch (wind) range.

Due to such a synthesis, there are synthesized impulse response signals ISj(t) having any frequency characteristics despite a small number of impulse response signals ISj(t)

stored. For example, there are formed frequency characteristics having a protruded portion or a recessed portion, frequency characteristics having a plurality of protruded portions of recessed portions, or frequency characteristics having a plurality of steps in a particular frequency region only.

Furthermore, when the same impulse response signals ISj(t) are synthesized by changing the period coefficient f, there are formed frequency characteristics having a plurality of gnarls or steps. For example, when the frequency characteristics of FIG. 29(B2) are synthesized by successively changing the period coefficient f, there are formed frequency characteristics having protuberances and recesses like continuous mountains.

The weighing data WT may be found from the sounding start time data (tone time data TM) or may be converted from the data (TM). In this case, the time data TM obtained at the steps 41 to 45 are operated and converted, and are written into the weighing RAM 90 for each of the channels.

Moreover, the weighing data WT may be operated (multiplied) and synthesized by the power data PW, envelope level data EL or touch data TC, and may be stored in the assignment memory 42.

Furthermore, the impulse synthesizing circuit 83 may be omitted, and the function of the impulse synthesizing circuit 83 may be executed by the tone accumulating unit 57. The impulse response signal generating unit 50 may be provided in a number of s, the impulse response signals ISj(t) of the number of s from the impulse signal generating unit 50 may be multiplied and synthesized by the weighing data WT through multipliers of the number of s, and may further be added and synthesized through the adders.

In this case, the weighing data WT of the number of s are output in parallel from the RAM to the adders of the number of s, the weighing data WT of the assignment memory 42 are copied by the controller 20 into the RAM by the number of s each time, and the high-order data of the channel number data CHNo are fed as access address to the RAM.

23. Groups of first spectrum correction tables 91 and second spectrum correction tables 92

Figure 30:
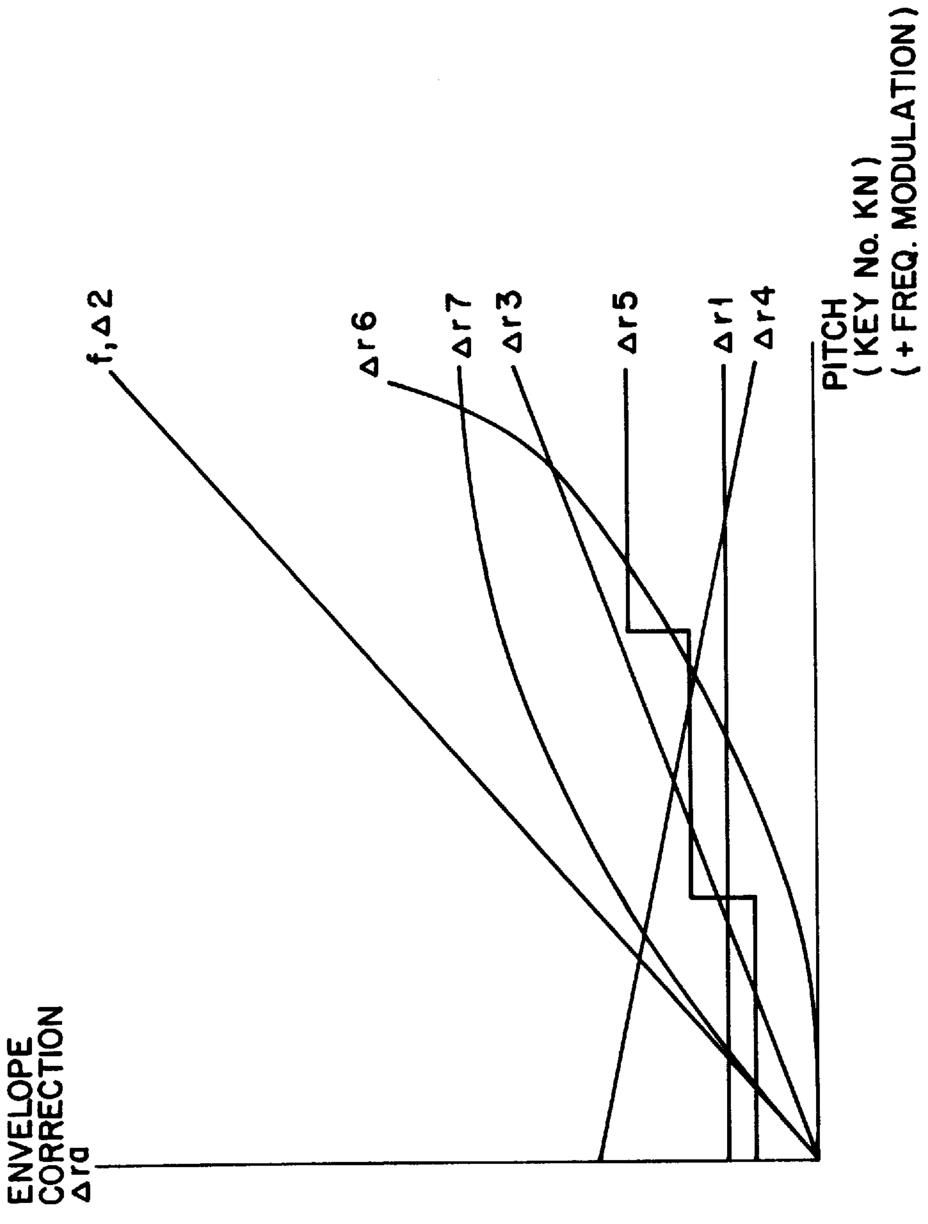
FIG. 30 illustrates a group of first spectrum correction tables 91 in the program/data storage unit 40.

FIG. 30 illustrates a group of first spectrum correction tables 91 in the program/data storage unit 40. From the group of the first spectrum correction tables 91 are read out the corresponding first spectrum correction data Δra based upon the pitch data (key number data KN or frequency number data FN).

Figure 31:
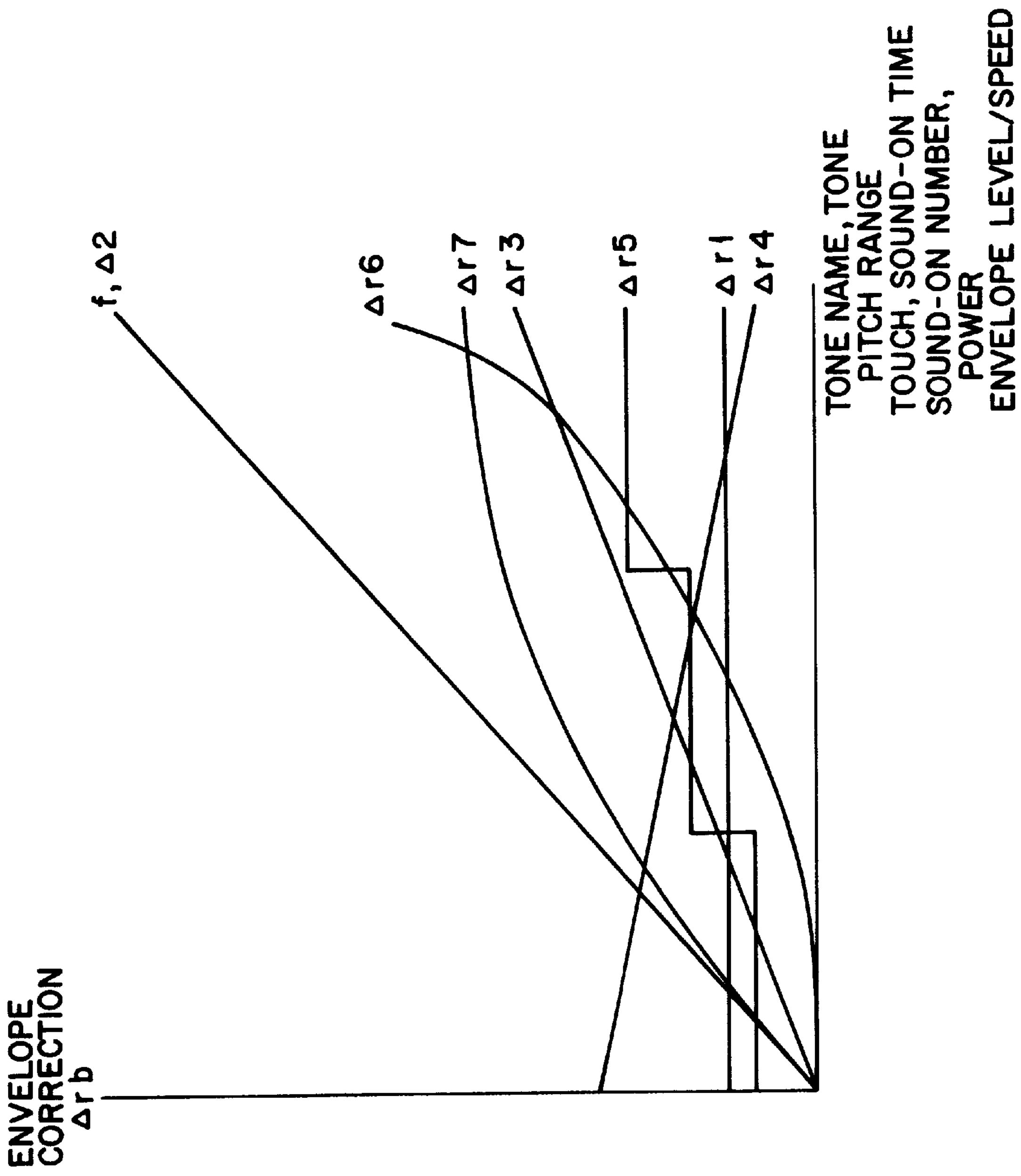
FIG. 31 illustrates a group of second spectrum correction tables 92 in the program/data storage unit 40.

FIG. 31 illustrates a group of second spectrum correction tables 92 in the program/data storage unit 40. From the group of the second spectrum correction tables 92 are read out the corresponding second spectrum correction data Δrb based upon the musical factor data other than the above-mentioned pitch data, and upon the tone name data or tone pitch range data.

FIGS. 30 and 31 shows the characteristics of period coefficients for comparing the spectrum correction data Δra and Δrb. The period coefficient f varies in direct proportion to the musical factor data (pitch data). The pitch data represent values corresponding to frequencies of pitches. The direct proportion is a strict direct proportion or is slightly deviated from the direct proportion due to S-curve tuning.

The first and second spectrum correction data Δra and Δrb vary in direct proportion or not in direct proportion to the musical factor data (pitch data), and vary in the same way as, or differently from, the change in the period frequency f. The characteristics Δr1 do not change relative to the musical factor data (pitch data) but remain constant. The characteristics Δr2 vary in direct proportion to the musical factor data (pitch data). The characteristics Δr3 vary in direct proportion to the musical factor data (pitch data) but vary more mildly than the change in the period coefficient f. The characteristics Δr4 vary in reverse proportion to the musical factor data (pitch data). The characteristics Δr5 have a portion that changes stepwisely and steeply relative to the musical factor data (pitch data) and a portion that mildly changes. The characteristic Δr6 vary cumulatively relative to the musical factor data (pitch data). The characteristics Δr7 vary exponentially relative to the musical factor data (pitch data).

The first and second spectrum correction data Δra and Δrb have characteristics that change more mildly than when they change in direct proportion to the musical factors (pitch). Characteristics Δr1 to Δr7 of the first and second spectrum correction data Δra and Δrb corresponding to the musical factor data (pitch data) are stored in each of the tables which constitute the groups of the spectrum correction tables 91 and 92. The tables of these characteristics Δr1 to Δr7 are selected depending upon the musical factor data (timbre, field of play, envelope phase, effect, pitch, touch, sounding start time, etc.) like in FIG. 20. The table of the predetermined characteristics Δr1 may be omitted, and the musical factor data (pitch data) may be operated to find the first spectrum correction data Δra and the second spectrum correction data Δrb.

24. Operation of the first and second spectrum correction data Δra and Δrb

The first and second spectrum correction data Δra and Δrb are added to, or subtracted from, the spectrum coefficient r as described below. As described above, the spectrum coefficient r determines the rate S for reading the impulse response signals ISj(t) from the impulse signal storage unit 51, and the period coefficient f determines the repeating period T of the impulse response signals ISj(t).

$$r \leftarrow r + \Delta ra + \Delta rb$$

The characteristics of the first and second spectrum correction data Δra and Δrb change more mildly than when they change in direct proportion to the musical factors (pitch). Therefore, when the operated spectrum coefficient r remains constant or changes mildly relative to the change in the musical factors (pitch), the characteristics of the operated spectrum coefficient r change more mildly than the change thereof relative to the musical factor (pitch).

The first and second spectrum correction data Δra and Δrb may be multiplied or divided by the spectrum coefficient r, or may be subjected to any other operation so as to be operated and synthesized with the spectrum coefficient r. In the case of the multiplication, the spectrum correction data Δra and Δrb assume values of from "0" to "1" depending upon a change in the pitch, have a decreased spectrum coefficient r and are increased depending upon a change in the pitch, or assume values of from "1" to "2" depending upon a change in the pitch, have an increased spectrum coefficient r and are increased depending upon a change in the pitch.

The initial spectrum coefficient r that is operated is found from the rf selection tables 44 shown in FIG. 20 and from the group of spectrum period tables 43 shown in FIG. 19 as described above. The operation is executed at the step 13, and the spectrum coefficient r found through the operation is written into a corresponding channel area of the assignment memory 42 at the step 13.

Figure 32:
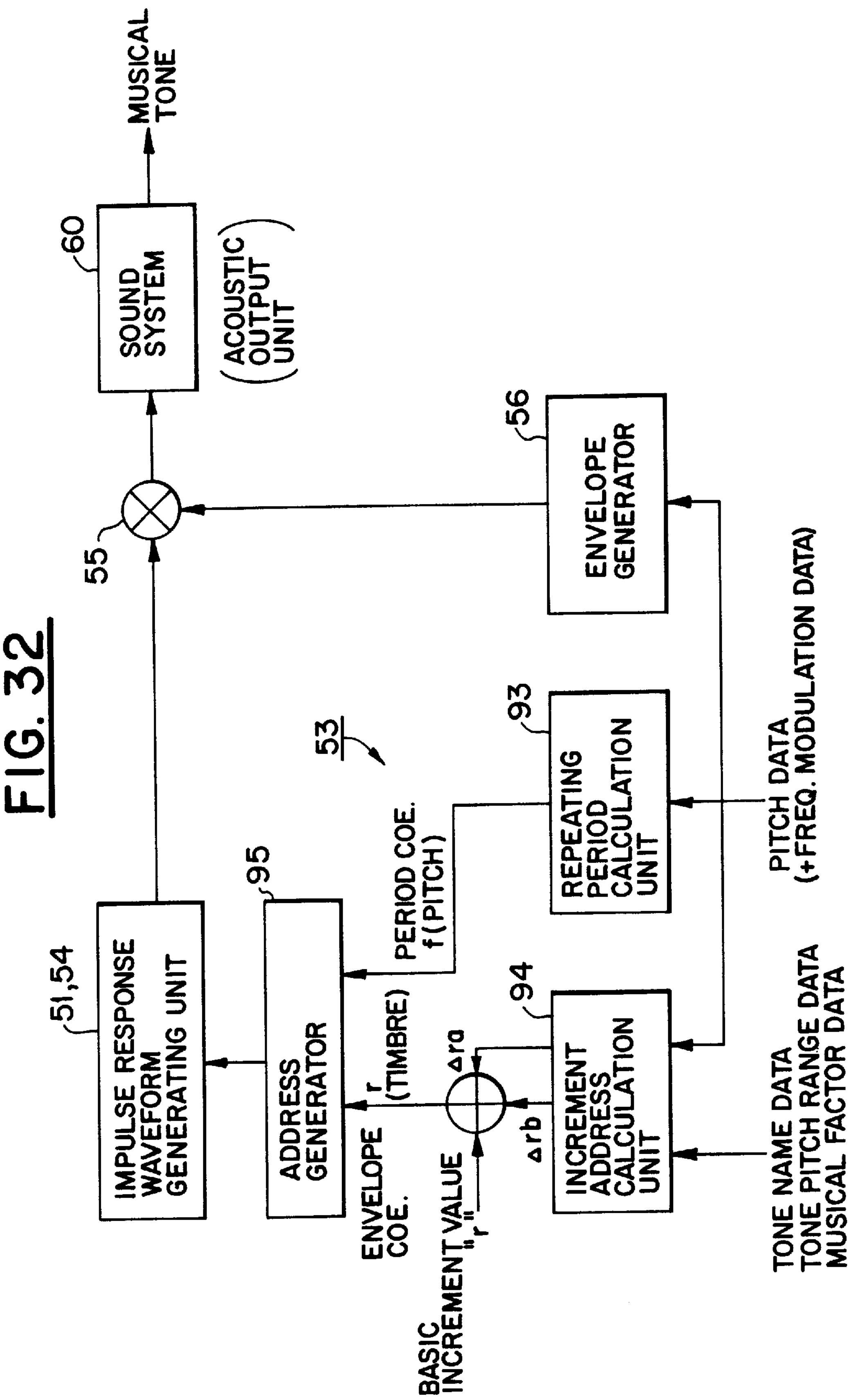
FIG. 32 generally illustrates a block circuit for executing the operation of a spectrum coefficient r, a first spectrum correction data Δra and a second spectrum correction data Δrb.

FIG. 32 is a schematic block circuit diagram for executing the above-mentioned operations. A period coefficient f is generated from a repeating period calculation unit 93 depending upon the pitch data, and is sent to an impulse response waveform generating unit 51(54) through an address generator 95. The first spectrum correction data Δra are generated from an increment address calculation unit 94 depending upon the pitch data, and the second spectrum correction data Δrb are generated from the increment address calculation unit 94 depending upon the musical formant data other than the pitch data. The first and second spectrum correction data Δra and Δrb are added to, and synthesized with, the spectrum coefficient r through an adder 96, and are sent to the impulse response waveform generating unit 51(54) through the address generating means 95.

When the spectrum coefficient r remains constant, the formant of the generated tone does not change but remains constant irrespective of a change in the pitch. On the other hand, when the first spectrum correction data Δra change depending upon the pitch (key number data KN or frequency number data FN) as described above, the formant of the generated tone moves not quite independently of the change in the pitch but slightly following the change in the pitch. Besides, the movement of the formant is different from the change in the pitch of the generated tone, and the timbre changes differently from the change in the pitch. In addition to this, when the spectrum coefficient r changes depending upon the pitch as shown in FIG. 19, the formant moves in a more complex manner depending upon the pitch.

When the spectrum coefficient r remains constant, the second spectrum correction data Δrb changes depending upon the musical factor data as described above, the formant of the generated tone moves quite independently of the change in the pitch and responds to the change in the musical factor. Besides, the motion of the formant is different from the change in the pitch of the generated tone, and the timbre changes differently from the change in the pitch. In addition to this, when the spectrum coefficient r changes depending upon the pitch as shown in FIG. 19, the formant also changes depending upon the pitch, and the motion of the formant becomes more complex.

For example, when the second spectrum correction data Δrb changes depending upon the touch data (touch data TC), sounding start data (tone time data TM), envelope data (envelope rate ES or envelope level EL), sounding number data, power data PW, timbre data (tone number data TN) or play field data (part number data PN), the motion of formant of the generated tone varies depending upon a change in the touch, sounding start time, envelope, sounding number, volume power, or field of play.

According, a change in the spectrum coefficient r and the motion of the formant due to a change in the pitch, a change in the spectrum coefficient r and the motion of formant due to the touch other than the pitch, and due to sounding start time, envelope, sounding number, volume power, timbre or field of play, are controlled independently and separately.

Furthermore, when the second spectrum correction data Δrb changes depending upon the tone name data (C, C#, D, D#, E, F, F#, G, G#, A, A# and B) or depending upon the tone pitch range data (first octave, second octave, third octave, . . . ), then, the formant of the generated tone moves depending upon a change in the tone name or in the tone pitch range.

In this case, the first spectrum correction data Δra may vary depending upon the tone pitch range data (first octave, second octave, third octave, . . . ) and the second spectrum correction data Δrb may vary depending upon the tone name data (C, C#, D, D#, E, F, F#, G, G#, A, A# and B). Moreover, the first spectrum correction data Δra may vary depending upon the tone name data (C, C#, D, D#, E, F, F#, G, G#, A, A# and B) and the second spectrum correction data Δrb may vary depending upon the tone pitch range data (first octave, second octave, third octave, . . . ).

Therefore, a change in the spectrum coefficient r and a motion of the formant due to a change in the tone pitch range, and a change in the spectrum coefficient r and a motion of the formant due to a change in the tone name, are controlled independently and separately.

As described above, the motion of the formant of the generated tone is not quite independent from a change in the pitch but slightly follows the changes in the pitch. The motion of the formant changes more mildly than when they change in direct proportion to the pitch. That is, despite the pitch changes into 2 times, 3 times, 4 times, . . . , the frequency of the formant does not change into 2 times, 3 times, 4 times, . . . , but changes into, for example, 1.2 times, 1.3 times, 1.4 times, . . . , 1.5 times, 1.75 times, 2 times, . . . .

Examples of the motion of the formant are represented by moving formants shown in FIG. 22. For details, reference should be made to FIGS. 22 and 21. The moving formant is not described here in detail. The operated spectrum coefficient r, and the first and second spectrum correction data Δra and Δrb may change more sharply than when they change in direct proportion to the pitch. In such a case, the formant moves and changes more vigorously than the pitch.

25. Change in the effect of pitch data (frequency modulation)

The pitch data (key number data KN or frequency number data FN) change in a tone time depending upon the effect data of frequency modulation. The effect data (frequency modulation data) will be vibrato, glide, glissando, growl, portamento, tremolo, trill, legato or slur. Depending upon these data, the period coefficient f, too, change in a tone time.

As disclosed in the specification and drawings of Japanese Patent Application No. 22883/1989 or 136650/1990, the effect data (modulation data MDATA) are generated from a modulation operation circuit 33, and are operated (added) and synthesized to the pitch data (key number data KN or frequency number data FN). The operated pitch data are written at any time as period coefficient f into the channel areas of the assignment memory 42.

The effect data (modulation data MDATA) may be operated (added) and synthesized to the period coefficients f successively read out from the assignment memory 42. In this case, the modulation operation circuit 33 shown in the specification and drawings of Japanese Patent Application No. 22883/1989 or 136650/1990 is provided in the overall circuitry of FIG. 1, and the period coefficients f that are modulated are written at any time into the parameter RAM 501 of FIG. 6. Moreover, the modulation operation circuit 33 is provided in the impulse signal reading unit 53 of FIG. 6, an arithmetic unit (adder) is provided on the output side of the parameter RAM 501 or on the output side of the operation RAM 508, and the effect data (modulation data MDATA) are operated (added) and synthesized to the period coefficient f or to the period count value F.

Thus, the period coefficient f (pitch data) changes depending upon the effect data (frequency modulation data), and the repeating period T of the impulse response signals ISj(t) changes, too. However, the first spectrum correction data Δra change more mildly than when they change in direct proportion to the pitch, or remain constant. Accordingly, spectrum coefficient r (timbre data) changes more mildly than when it changes in direct proportion to the pitch, or remains constant, and the formant moves mildly depending upon a change in the pitch or does not move.

Accordingly, the pitch of tone of the impulse response signals ISj(t) changes depending upon the effect of frequency modulation such as vibrato, glide, glissando, portamento, growl, tremolo, trill, regato or slur. However, the moving amount of the formant is smaller than the amount of change in the pitch, the formant mildly changes depending upon a change in the pitch, and the formant does not often move despite the pitch is changed. This could not be realized so far by the effect of the existing frequency modulation.

The characteristics of the groups of first and second spectrum correction tables 91 and 92 shown in FIG. 30 or 31 may be just realized by the spectrum period table 43 shown in FIG. 19, in order to directly read out the spectrum coefficient r that changes more mildly than when it changes in direct proportion to the pitch.

The present invention is in no way limited to the above-mentioned embodiment only but can be modified in a variety of ways without departing from the spirit and scope of the invention. For example, the period end value Fmax may not be set but may be fixed to a maximum value that can be assumed by the period count value F. In this case, the pitch of the tone signal is determined by the period coefficient f only.

The former half and the latter half of the impulse response signal ISj(t) have the same shape, but may have different shapes. Furthermore, the former half only of the impulse response signal ISj(t) may be stored, and may be read out in a reversely folded manner thereby to form a latter-half signal. The impulse response signal ISj(t) may be the one formed by sampling and storing the sound from an external source and subjecting it to the conversion such as the spectrum or the linear prediction, or may be the one artificially formed by the user.

The present invention can be put into practice in an electronic musical instrument or in a computer. The functions of the circuits shown in the drawings may be put into practice by using a software (flow chart), and the functions of the flow charts of the drawings may be put into practice by using a hardware (circuit).

In most of the impulse response signals ISj(t), the former-half waveform is symmetrical to the latter-half waveform. In this case, the impulse signal storage unit 51 stores either the former-half waveform or the latter-half waveform. After the half waveform is read out, the same half waveform is read out in a reverse order, thereby to form the whole impulse response signal ISj(t). This allows the employment of the impulse signal storage unit 51 having a decreased storage capacity.

Moreover, the impulse response signals ISj(t) may be sent from an external unit or may be generated by operation. In this case, instantaneous values of the waveform are calculated and output from the accumulated values of spectrum coefficients r based on the formula representing the impulse response signals ISj(t). The operation is repetitively executed after every repeating period T.

The volume power is controlled by the power data PW not only when the rate S of reading (generating) the impulse response signals ISj(t) and the repeating period T are independently controlled, but also when one is interlocked to the other or is dependent upon the other. In this case, the period coefficient f and the spectrum coefficient r are determined depending upon the same musical factor such as pitch, timbre, touch or sounding start time, or either one data is found and is operated to find the other data.

The whole impulse response signal ISj(t) may be read out without cutting off both ends of the impulse response signal ISj(t). In this case, the value "0" is stored by a predetermined amount of address in an end of the window function value WF and is read out. This also makes it possible to prevent the overlapping of the ends of the impulse response signals ISj(t).

We claim:

1. An apparatus for generating musical tones comprising:

means for repetitively generating impulse response signals of a predetermined length corresponding to frequency characteristics of tone signals that are to be generated;

means for changing a repeating period of the impulse response signals that are repetitively generated to provide changed impulse response signals; and means for varying magnitude of the generated impulse response signals based upon the repeating period of the changed impulse response signals or based upon a rate of generating the changed impulse response signals.

2. The apparatus for generating musical tones according to claim 1, wherein the magnitude of the impulse response signals varies depending also upon power of waveforms of the impulse response signals, upon a rate of a sounding start operation, or upon an intensity of the sounding start operation, the repeating period of the impulse response signals varies depending upon a pitch-determining factor, and the rate of generating the impulse response signals varies depending upon a timbre-determining factor independently of the repeating period.

3. The apparatus for generating musical tones according to claim 2, wherein the pitch-determining factor determines pitch or timbre of the tone signals, the impulse response signals are stored in a storage unit, a rate for reading the impulse response signals from the storage unit is determined depending upon the timbre-determining factor, and the repeating period for repetitively reading the impulse signals from the storage unit is determined depending upon the pitch-determining factor.

4. An apparatus for generating musical tones comprising:

means for repetitively generating impulse response signals of a predetermined length corresponding to frequency characteristics of tone signals that are to be generated; and means for changing the frequency characteristics of the tone signals by inverting polarities of some of the impulse response signals that are repetitively generated.

5. The apparatus for generating musical tones according to claim 4, wherein the impulse response signals have a same waveform and are repetitively generated n times, a repeating period of an impulse response signal is 1/n times a repeating period of another impulse response signal, a level of the impulse response signal is lower than a level of the another impulse response signal or the level of the impulse response signal is 1/n times the level of the another impulse response signal, and differences between these impulse response signals are synthesized and output, so that polarities of (n-1) of the n impulse response signals are inverted.

6. The apparatus for generating musical tones according to claim 4, wherein an impulse response signal is continuously generated at an end of a repeating period despite that the impulse response signal is longer than the repeating period, succeeding impulse response signals are generated in an overlapped manner from a plurality of generators, generation of n impulse response signal is detected, polarities of (n-1) repetitively generated impulse response signals of the n impulse response signals are inverted based upon detection results, and a level of the n impulse response signals that has not been inverted is set to be (n-1)/n and levels of the (n-1) inverted impulse response signals are set to be 1/n.

7. The apparatus for generating musical tones according to claim 4, wherein the impulse response signals are stored in a storage unit, a rate for reading the impulse response signals from the storage unit is determined depending upon a timbre-determining factor, and a repeating period for repetitively reading the impulse response signals from the storage unit is determined depending upon a pitch-determining factor.

8. An apparatus for generating musical tones comprising:

means for repetitively generating impulse response signals of a predetermined length corresponding to frequency characteristics of tone signals that are to be generated;

means for determining a repeating period of the impulse response signals that are repetitively generated;

means for determining a rate of generating the impulse response signals; and means for varying the repeating period of the impulse response signals and for selecting whether or not to change the rate of generating the impulse response signals based upon a pitch-determining factor.

9. The apparatus for generating musical tones according to claim 8, wherein selection of whether or not to change the rate of generating the impulse response signals does not occur when the tone signals of a fixed formant are selected but occurs when the tone signals of a moving formant are selected.

10. The apparatus for generating musical tones according to claim 8, wherein the rate of generating the impulse response signals is changed depending upon a timbre-determining factor, and the repeating period of the generated impulse response signals is changed depending upon the pitch-determining factor.

11. The apparatus for generating musical tones according to claim 8, wherein the pitch-determining factor determines pitch or timbre of the tone signals, the impulse response signals are stored in a storage unit, a rate for reading the impulse response signals from the storage unit is determined depending upon a timbre-determining factor, and a repeating period for reading the impulse response signals from the storage unit is determined depending upon the pitch-determining factor.

12. An apparatus for generating musical tones comprising:

means for repetitively generating impulse response signals of a predetermined length corresponding to frequency characteristics of tone signals that are to be generated;

means for determining a repeating period of the impulse response signals that are repetitively generated;

means for determining a rate of generating the impulse response signals;

means for suppressing generation of ends of the impulse response signals; and means for changing an amount of suppressing the generation of the ends of the impulse response signals based upon musical factors.

13. An apparatus for generating musical tones comprising:

means for repetitively generating impulse response signals of a predetermined length corresponding to frequency characteristics of tone signals that are to be generated;

means for determining a repeating period of the impulse response signals that are repetitively generated;

means for determining a rate of generating the impulse response signals;

means for suppressing generation of ends of the impulse response signals;

means for detecting an amount by which the ends of the repetitively generated impulse response signals are superposed one upon another; and means for determining an amount of suppressing the generation of the ends of the impulse response signals based upon the detected amount.

14. The apparatus for generating musical tones according to claim 13, wherein the amount by which the ends of the impulse response signals are superposed one upon another is in agreement with the amount of suppressing the generation of the ends of the impulse response signals, whereby the impulse response signals are connected at the ends, or the amount of suppressing the generation of the ends of the impulse response signals is larger than the amount by which the ends of the impulse response signals are superposed one upon another.

15. The apparatus for generating musical tones according to claim 12, wherein the impulse response signals are operated and synthesized using a window function, or are synthesized with weighing data which simply varies from a decreased number of times to an equal number of time, whereby the impulse response signals have no end and are smoothly connected to each other at cut-off ends, and the amount of suppressing the generation of the ends of the impulse response signals varies depending upon a pitch-determining factor.

16. The apparatus for generating musical tones according to claim 12, wherein the impulse response signals are alternatingly generated by a plurality of generators, the impulse response signals generated by said plurality of generators are superposed one upon another, an end of an impulse response signal generated by one generator is not superposed, the rate for generating the impulse response signals changes depending upon a timbre-determining factor, and the repeating period of the impulse response signals changes depending upon pitch-determining factor.

17. The apparatus for generating musical tones according to claim 12, wherein the impulse response signals are stored in a storage unit, a rate for reading the impulse response signals is determined depending upon a timber-determining factor, a repeating period for reading the impulse response signals from the storage unit is determined depending upon a pitch-determining factor, and the pitch-determining factor determines pitch or timbre of the tone signals.

18. A method of generating musical tones comprising the steps of:

a) repetitively generating impulse response signals of a predetermined length corresponding to frequency characteristics of tone signals that are to be generated;

b) determining a repeating period of the impulse response signals that are repetitively generated;

c) determining a rate of generating the impulse response signals; and synthesizing a plurality of impulse response signals of which the repeating period and the rate of generating have been determined, to thereby generate impulse response signals different from the impulse response signals before said step d).

19. The method of generating musical tones according to claim 18, wherein the synthesized impulse response signals have a same generation start timing and a same phase have different or same frequency characteristics, have different repeating periods or a same repeating period, and are generated at different rates or at a same rate.

20. The method of generating musical tones according to claim 18, wherein a combination of the synthesized impulse response signals is determined depending upon musical factors, the synthesized impulse response signals are weighed and synthesized, and the weighing is determined depending upon the musical factors.

21. The method of generating musical tones according to claim 18, wherein the rate of generating the impulse response signals changes depending upon a timber-determining factor, the repeating period of the generated impulse response signals changes depending upon a pitch-determining factor, the impulse response signals are stored in a memory, a rate of reading the impulse response signals from the memory is determined depending upon the timbre-determining factor, and a repeating period for repetitively reading the impulse response signals from the memory is determined depending upon the pitch-determining factor.

22. A method of generating musical tones comprising the steps of:

a) repetitively generating impulse response signals of a predetermined length corresponding to frequency characteristics of tone signals that are to be generated;

b) determining a repeating period of the impulse response signals that are repetitively generated;

c) determining a rate of generating the impulse response signals;

d) changing the repeating period of the impulse response signals based upon a pitch-determining factor; and e) changing the rate of generating the impulse response signals based upon characteristics different from the pitch-determining factor of said step d).

23. A method of generating musical tones comprising the steps of:

a) repetitively generating impulse response signals of a predetermined length corresponding to frequency characteristics of tone signals that are to be generated;

b) determining a repeating period of the impulse response signals that are repetitively generated;

c) determining a rate of generating the impulse response signals;

d) changing the repeating period of the impulse response signals based upon a change in pitch;

e) generating correction data that varies depending upon the change in pitch; and f) correcting the rate of generating the impulse response signals by using the correction data.

24. The method of generating musical tones according to claim 22, wherein the repeating period of the impulse response signals varies nearly in proportion to the pitch-determining factor and the rate of generating the impulse response signals does not vary in proportion to the pitch-determining factor.

25. The method of generating musical tones according to claim 23, wherein a second correction data is further generated, the second correction data changing based upon a change in musical factors other than the pitch, and the rate of generating the impulse response signals is corrected by using the second correction data.

26. The method of generating musical tones according to claim 22, wherein the rate of generating the impulse response signals does not change depending upon the pitch-determining factor but changes depending upon the timbre-determining factor, the repeating period of the generated impulse response signals changes depending upon the pitch-determining factor, the impulse response signals are stored in a storage, a rate for reading the impulse response signals from the storage is determined depending upon the timbre-determining factor, and a repeating period for repetitively reading the impulse response signals from the storage is determined depending upon the pitch-determining factor.

* * * * *